United States Patent
Stewart et al.

[19]

[11] Patent Number: 5,870,284
[45] Date of Patent: Feb. 9, 1999

[54] INTEGRATED POWER SUPPLY FRAME INCLUDING INTEGRATED CIRCUIT (IC) MOUNTING AND COOLING

[75] Inventors: Neal George Stewart; Man Keung Tse, both of Tsuen Wan, Hong Kong

[73] Assignee: Astec International Limited, Hong Kong, Hong Kong

[21] Appl. No.: 905,503

[22] Filed: Aug. 4, 1997

Related U.S. Application Data

[63] Continuation-in-part of Ser. No. 840,349, Apr. 28, 1997, which is a continuation-in-part of Ser. No. 819,529, Mar. 17, 1997.

[51] Int. Cl.$^6$ .............................. H05K 7/20; H05K 7/10
[52] U.S. Cl. .......................... 361/699; 361/610; 361/704; 361/695; 361/808; 361/756; 361/775; 361/831
[58] Field of Search .......................... 174/15.1; 361/685, 361/690, 694–695, 704, 707, 732, 747, 686–687, 610, 753–752, 725–727, 775, 807–809, 825, 829, 831, 699, 700; 307/150

[56] References Cited

U.S. PATENT DOCUMENTS

| | | | |
|---|---|---|---|
| 4,864,469 | 9/1989 | Boudon | 361/685 |
| 4,908,738 | 3/1990 | Kobari et al. | 361/829 |
| 4,926,291 | 5/1990 | Sarrat | 361/685 |
| 5,053,920 | 10/1991 | Staffiere et al. | 361/775 |
| 5,224,019 | 6/1993 | Wonj et al. | 361/685 |
| 5,224,020 | 6/1993 | Golleeje et al. | 361/685 |
| 5,224,024 | 6/1993 | Ta et al. | 361/831 |
| 5,311,397 | 5/1994 | Harshberger et al. | 361/683 |
| 5,349,132 | 9/1994 | Miller et al. | 174/35 |
| 5,396,401 | 3/1995 | Nemoz | 361/690 |
| 5,402,312 | 3/1995 | Kinjo et al. | 361/695 |
| 5,523,917 | 6/1996 | Searby | 361/695 |

OTHER PUBLICATIONS

*Noren Heat Pipes*—Product Description, Noren Products, Inc. (4 pgs.).

*Primary Examiner*—Gregory D. Thompson

[57] ABSTRACT

The present invention encompasses a mounting structure on which both a power supply and a integrated circuit (IC) chip module are mounted. In one embodiment, the present invention encompasses a mounting structure for mounting a power supply and an integrated circuit (IC) chip module on a printed circuit board (PCB), the mounting structure including: a frame for accepting the power supply, wherein the power supply is slidably mounted on and releasably locked onto the frame; elements for supporting the frame on the PCB; a holder for accepting the IC chip module, the holder being connected to the frame such that the length of connections for providing power from the power supply to the IC chip module is minimized, wherein the IC chip module is removably insertable into and releasably locked onto the holder such that the IC chip module is thermally coupled to the frame and may be directly coupled to the PCB; and a heatsink coupled to the frame for dissipating heat generated by the power supply and the IC chip module.

17 Claims, 41 Drawing Sheets

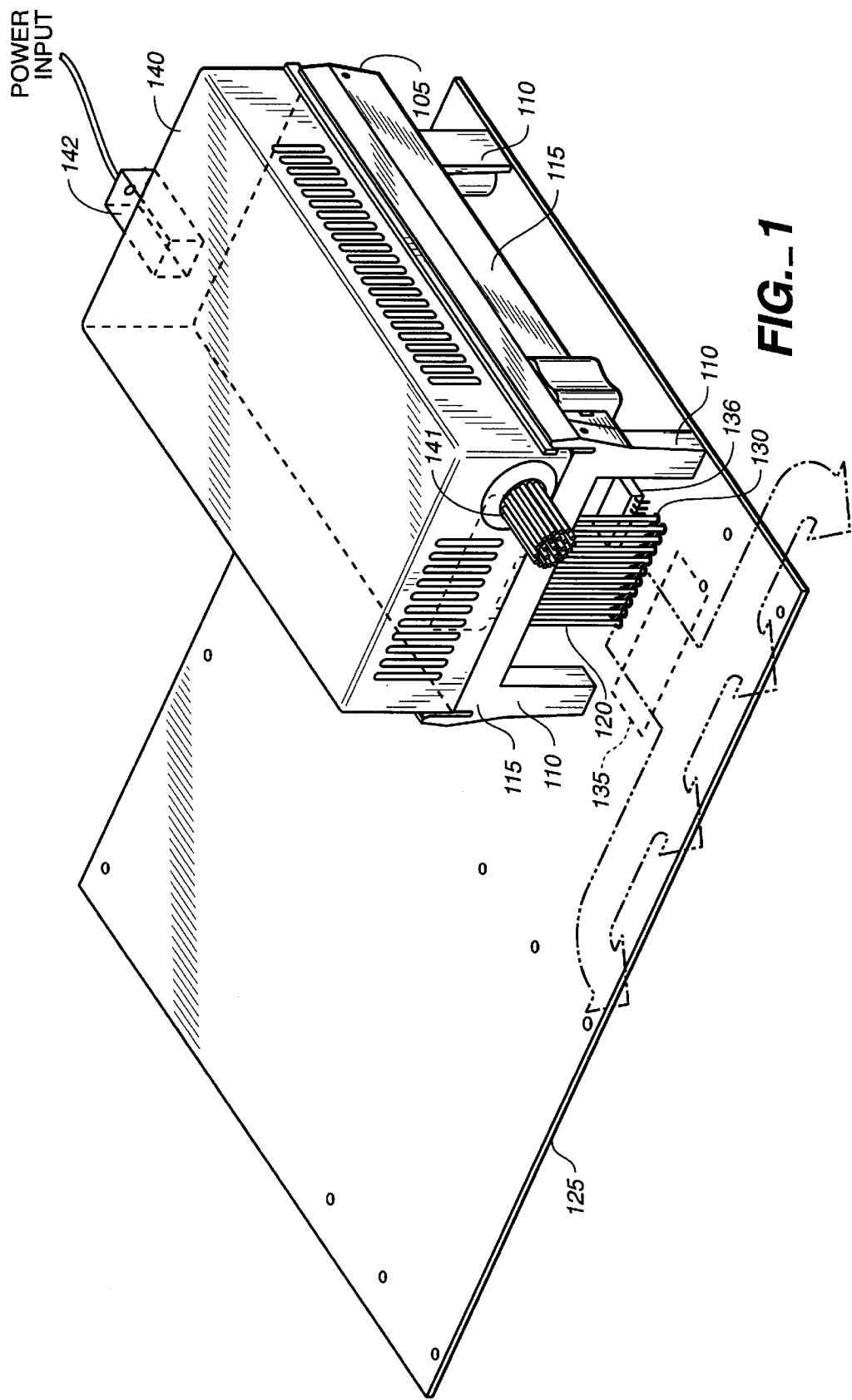
FIG._1

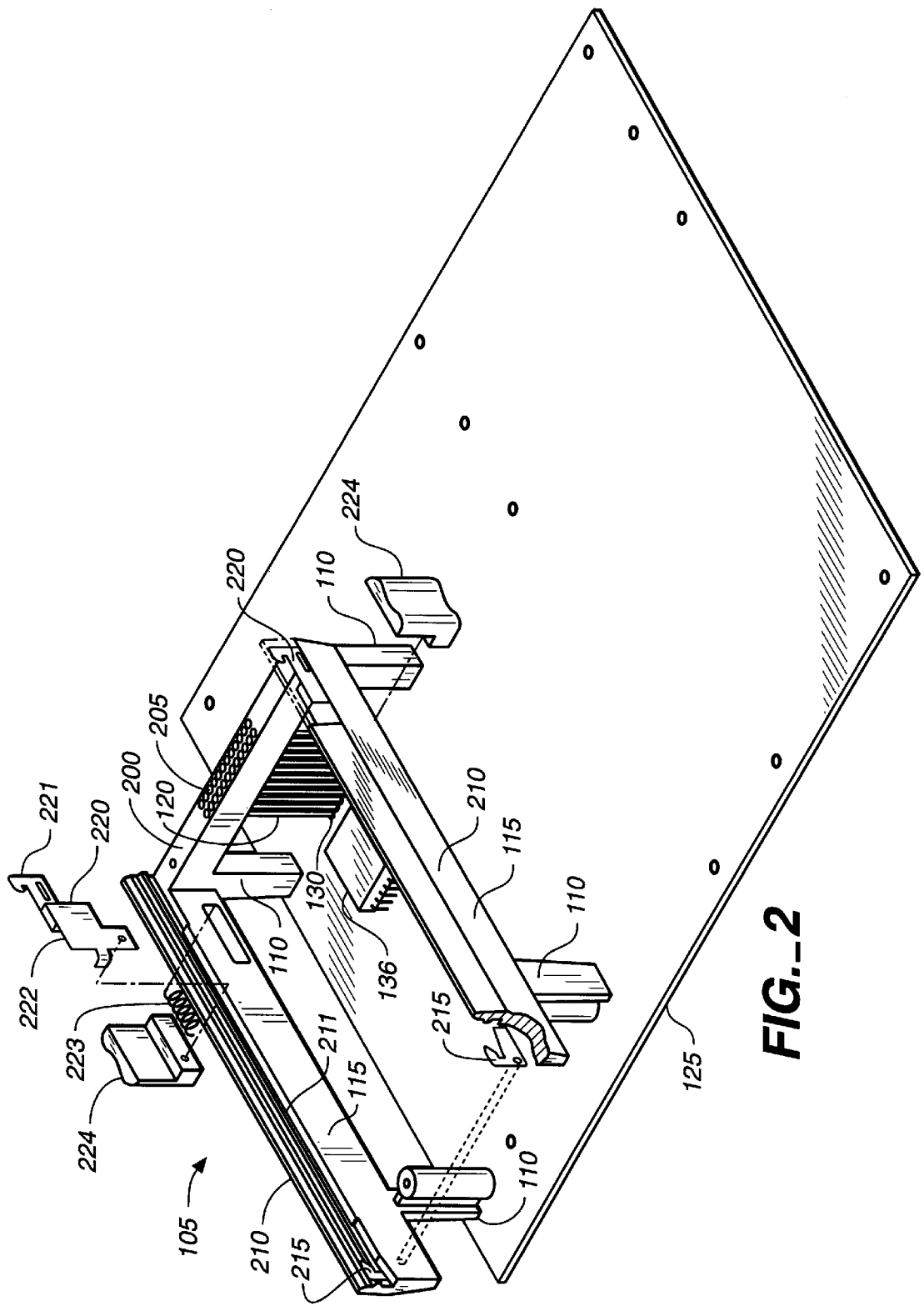
FIG._2

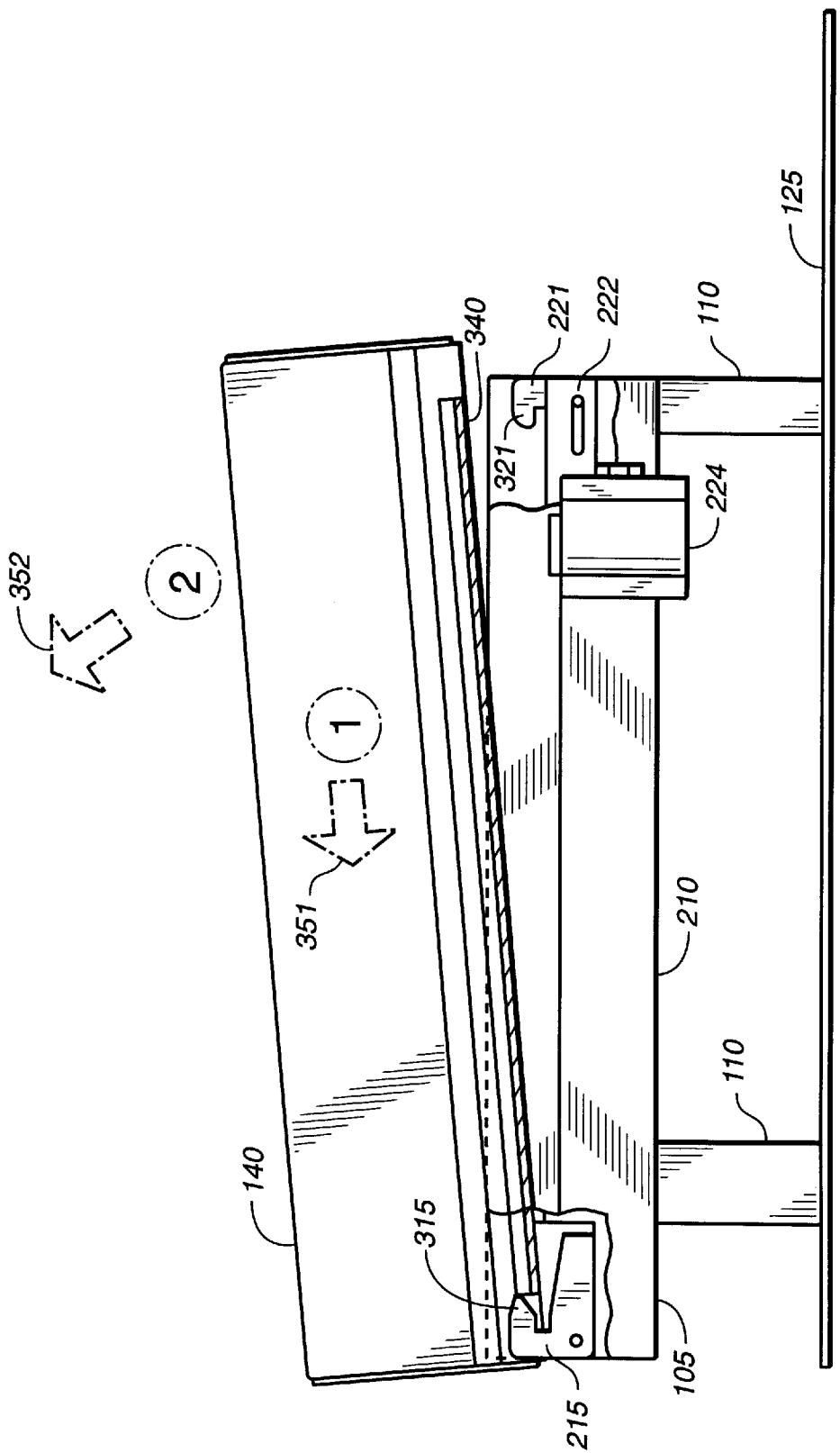
FIG._3

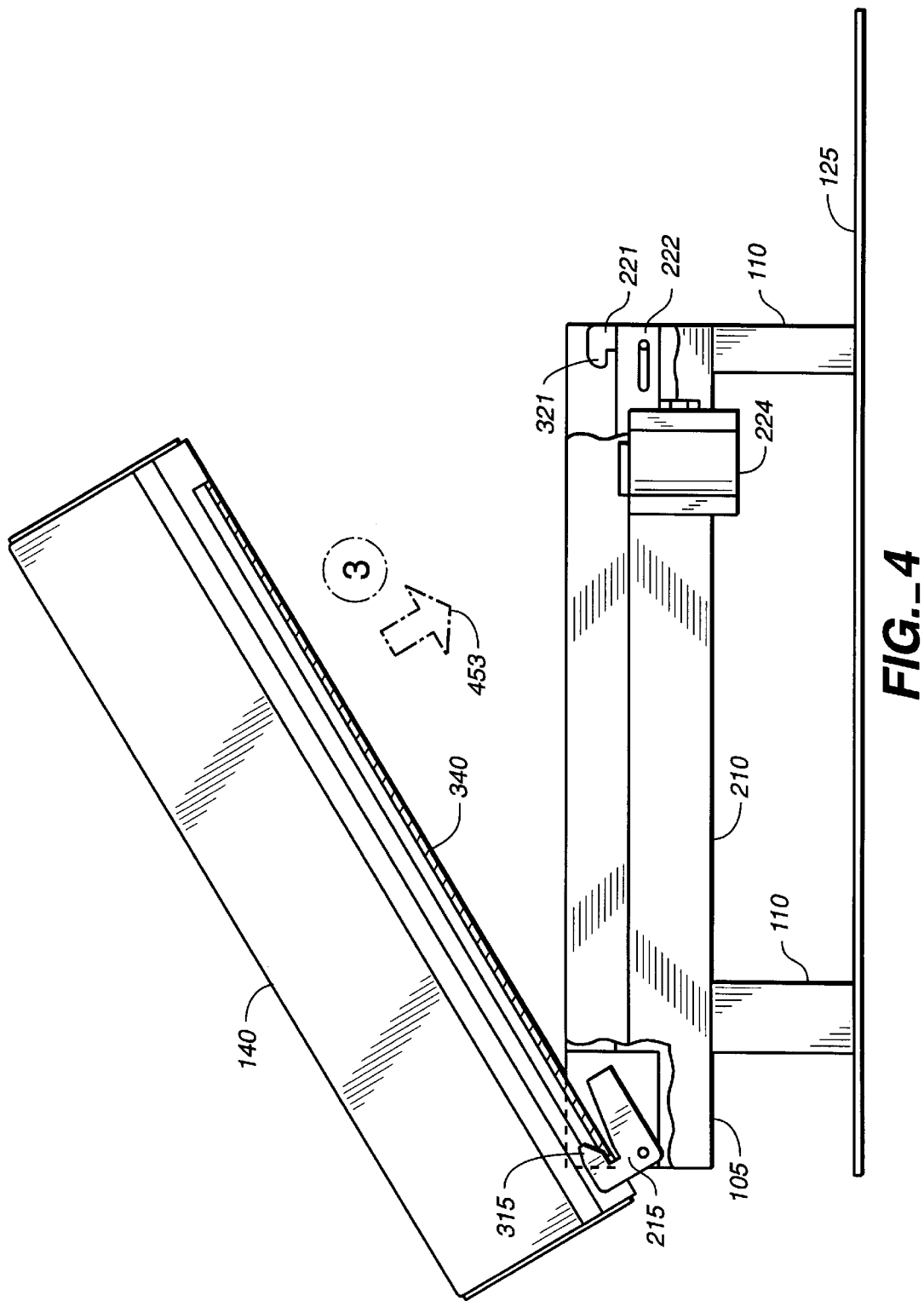

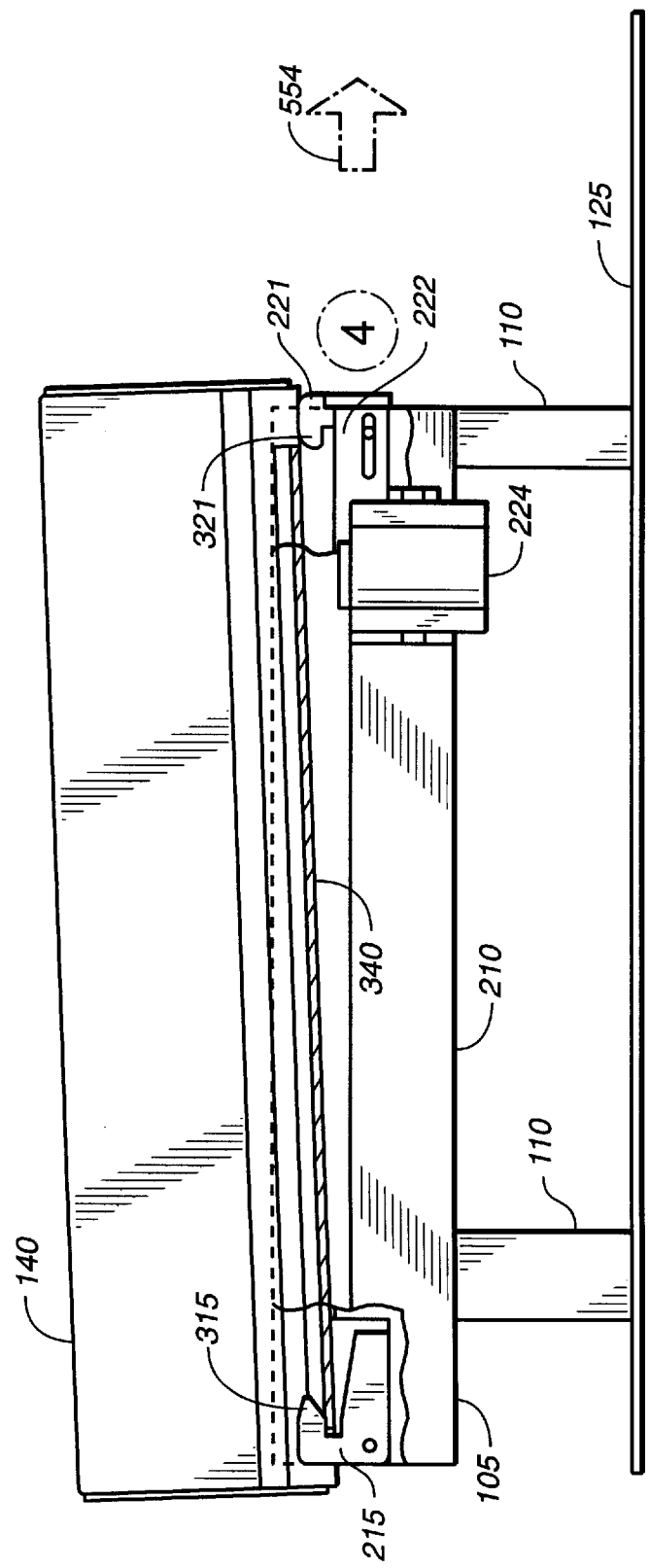

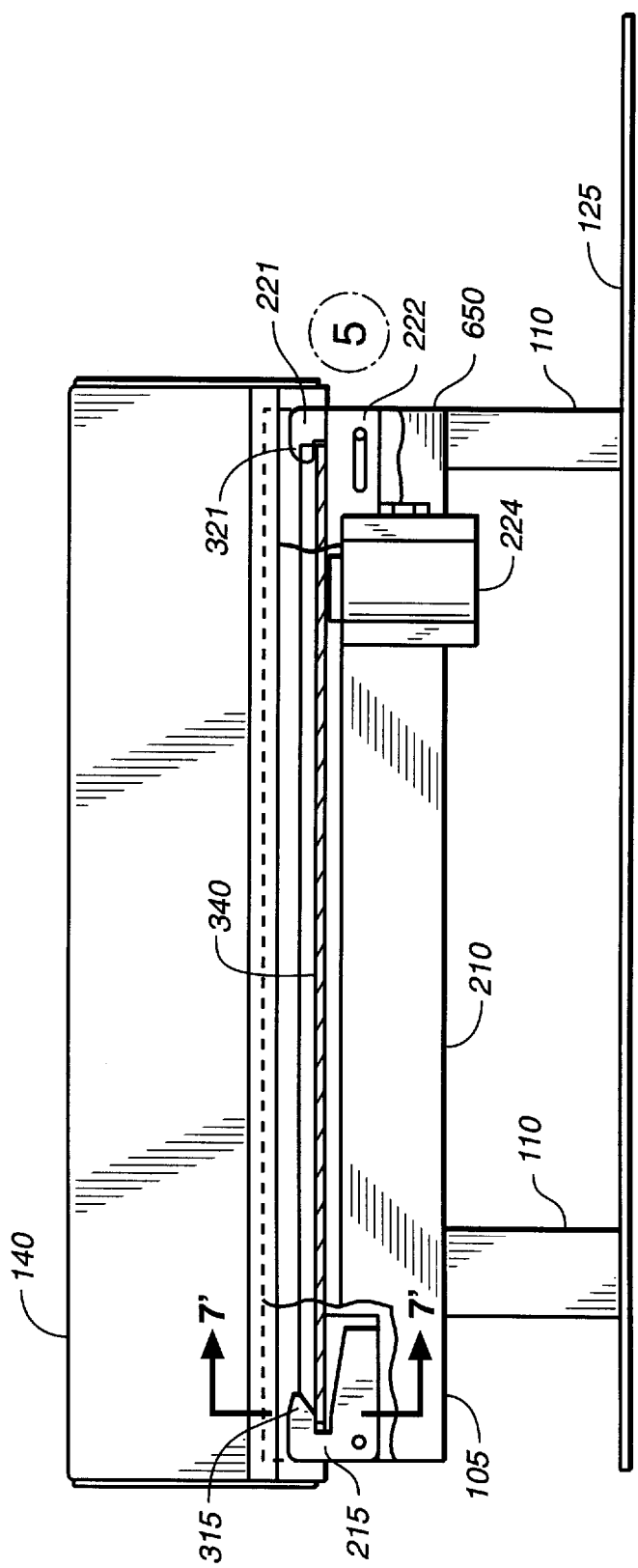
FIG._6

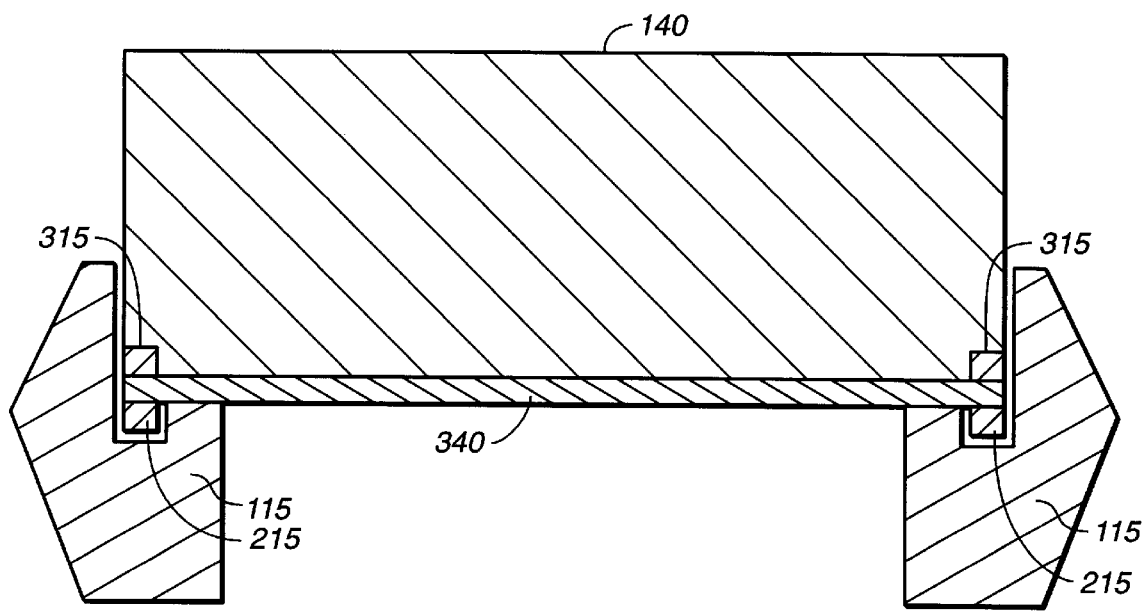
FIG._7

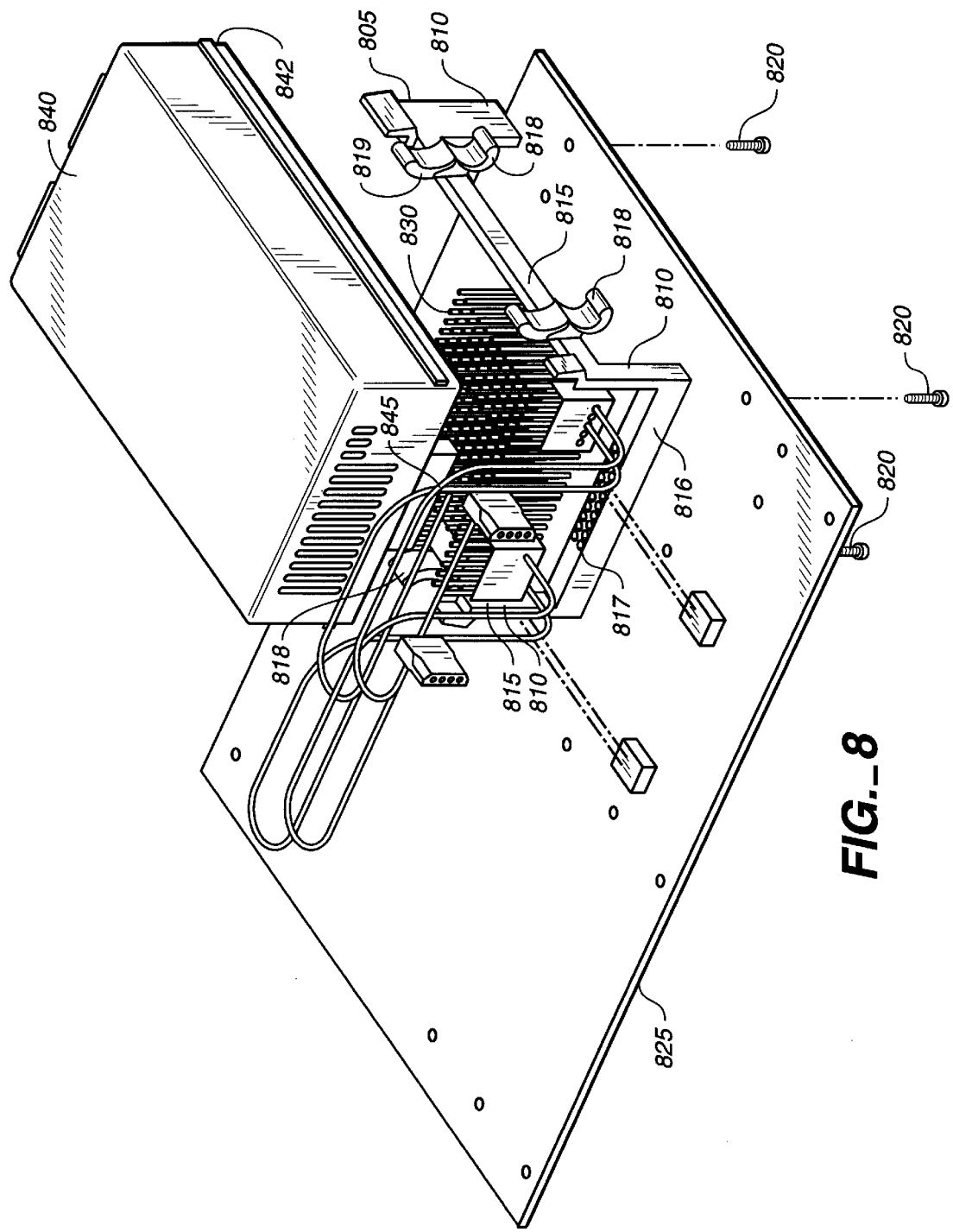
FIG._8

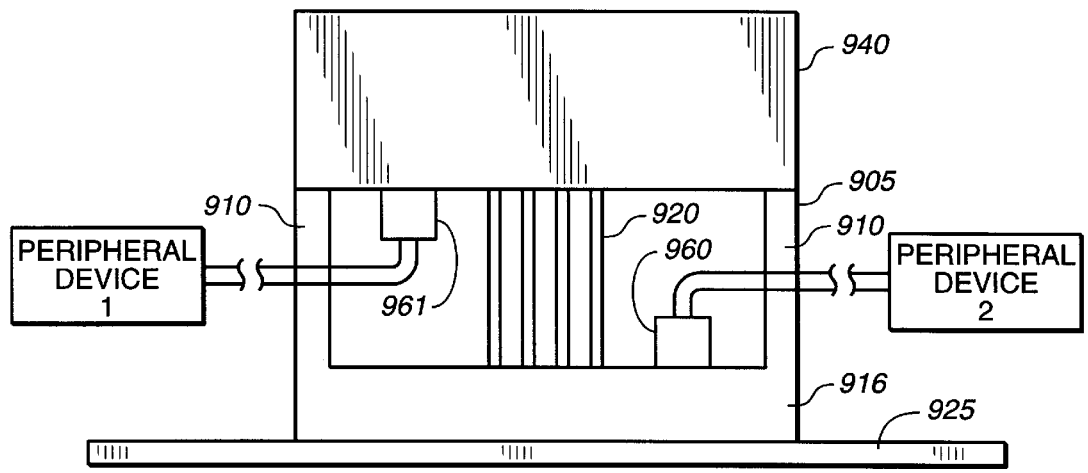
FIG._9
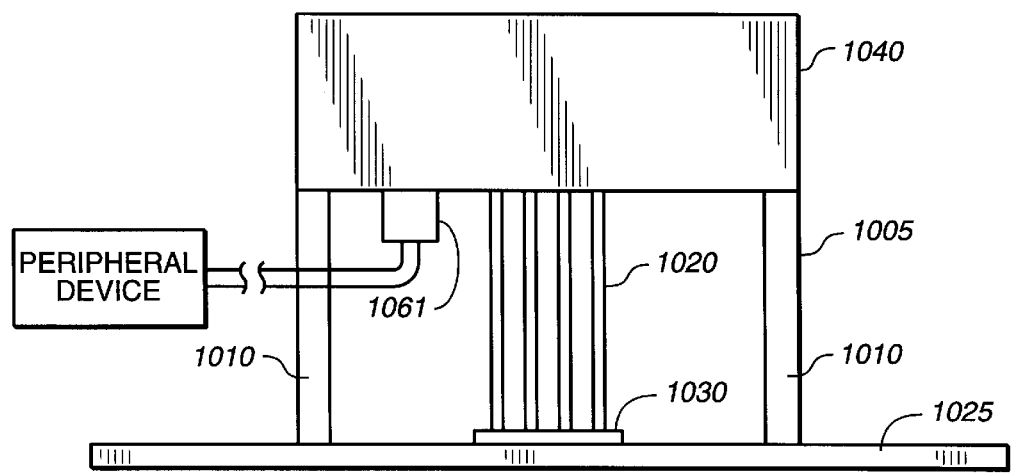
FIG._10

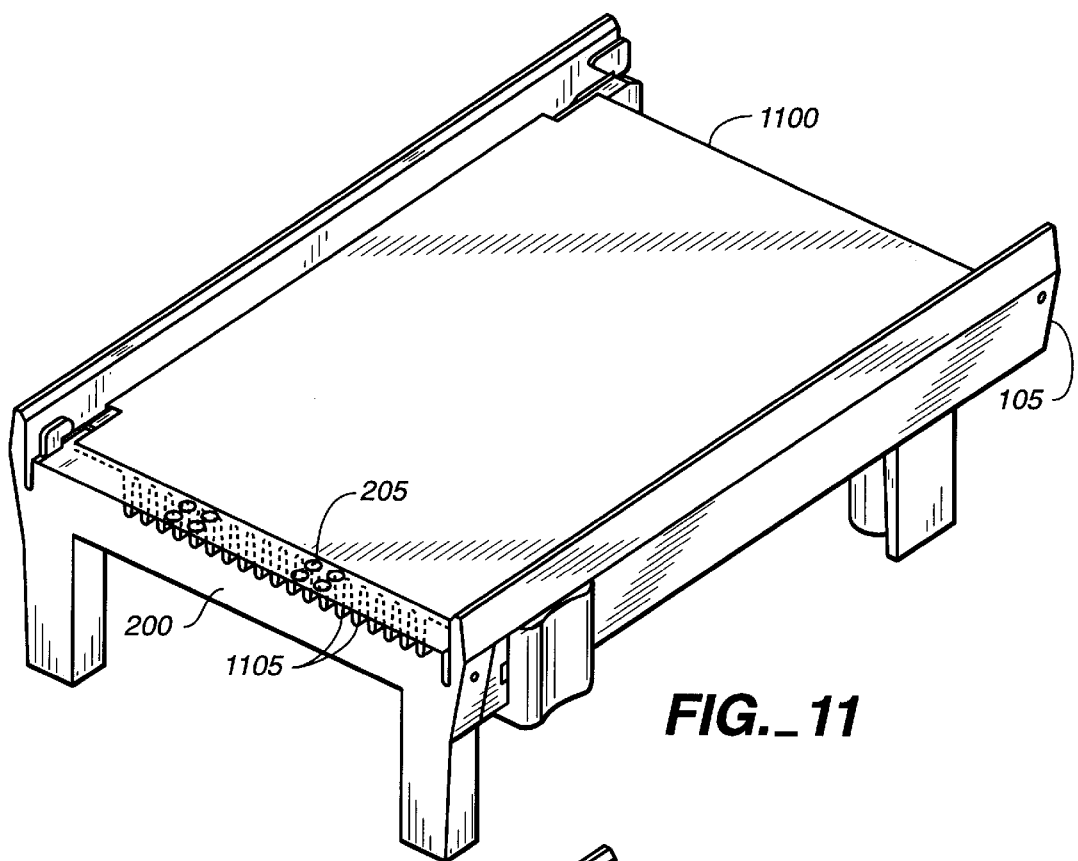
FIG._11
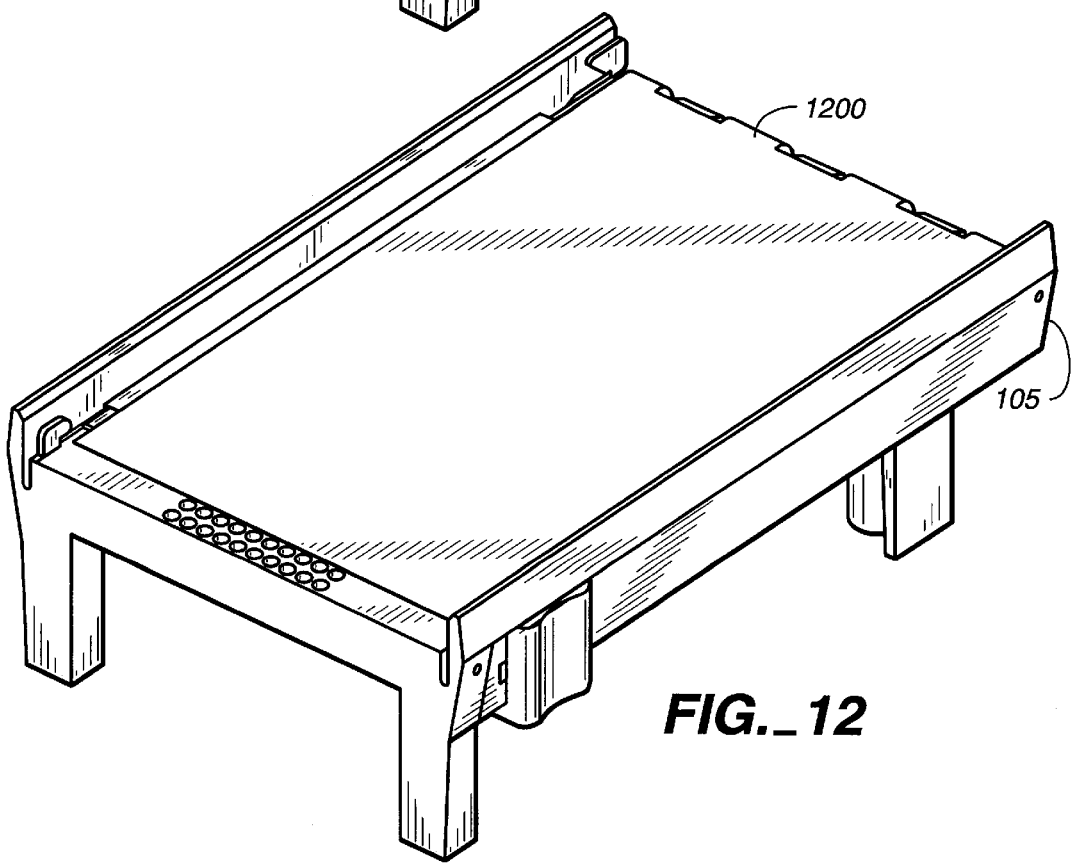
FIG._12

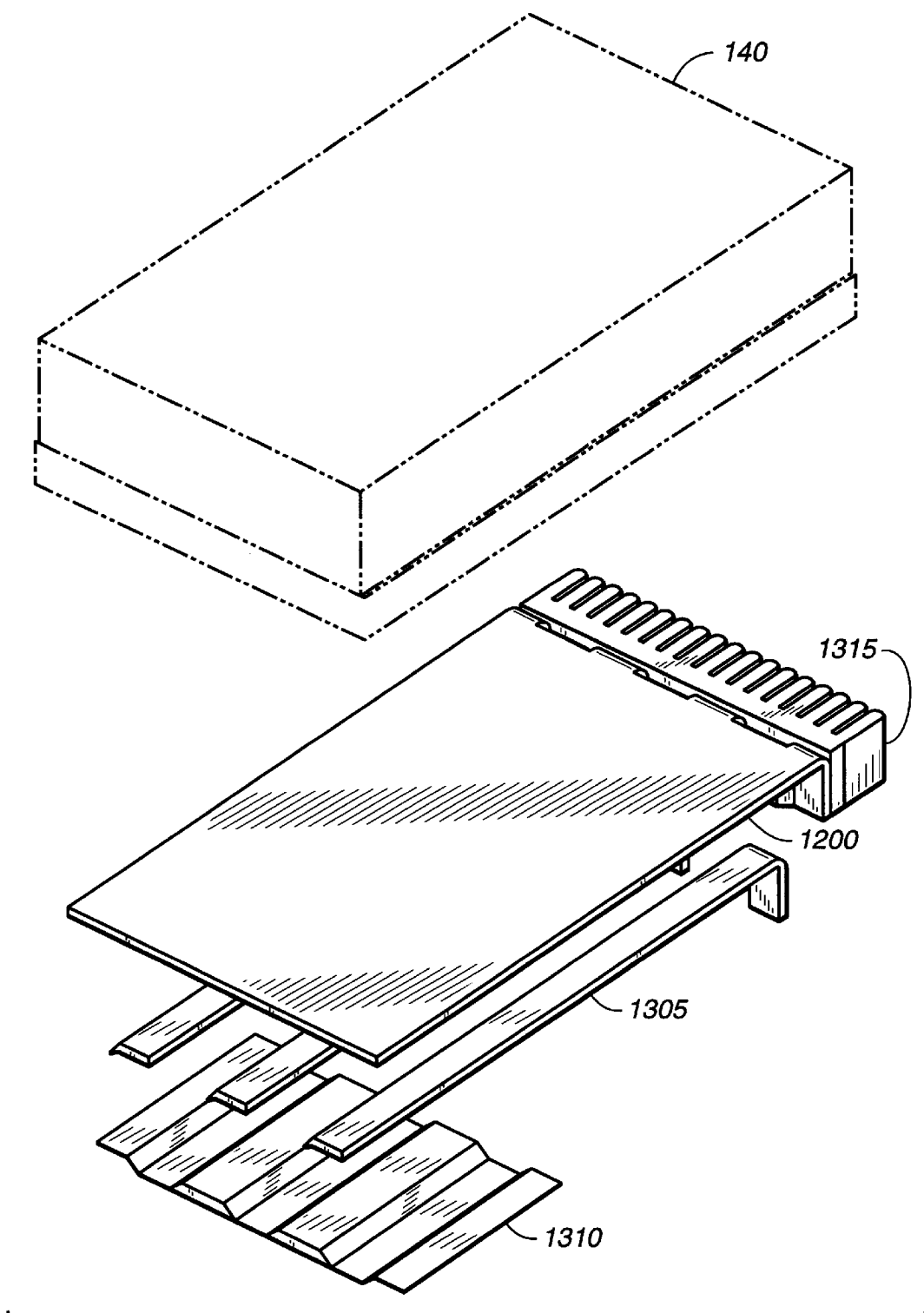
FIG._13

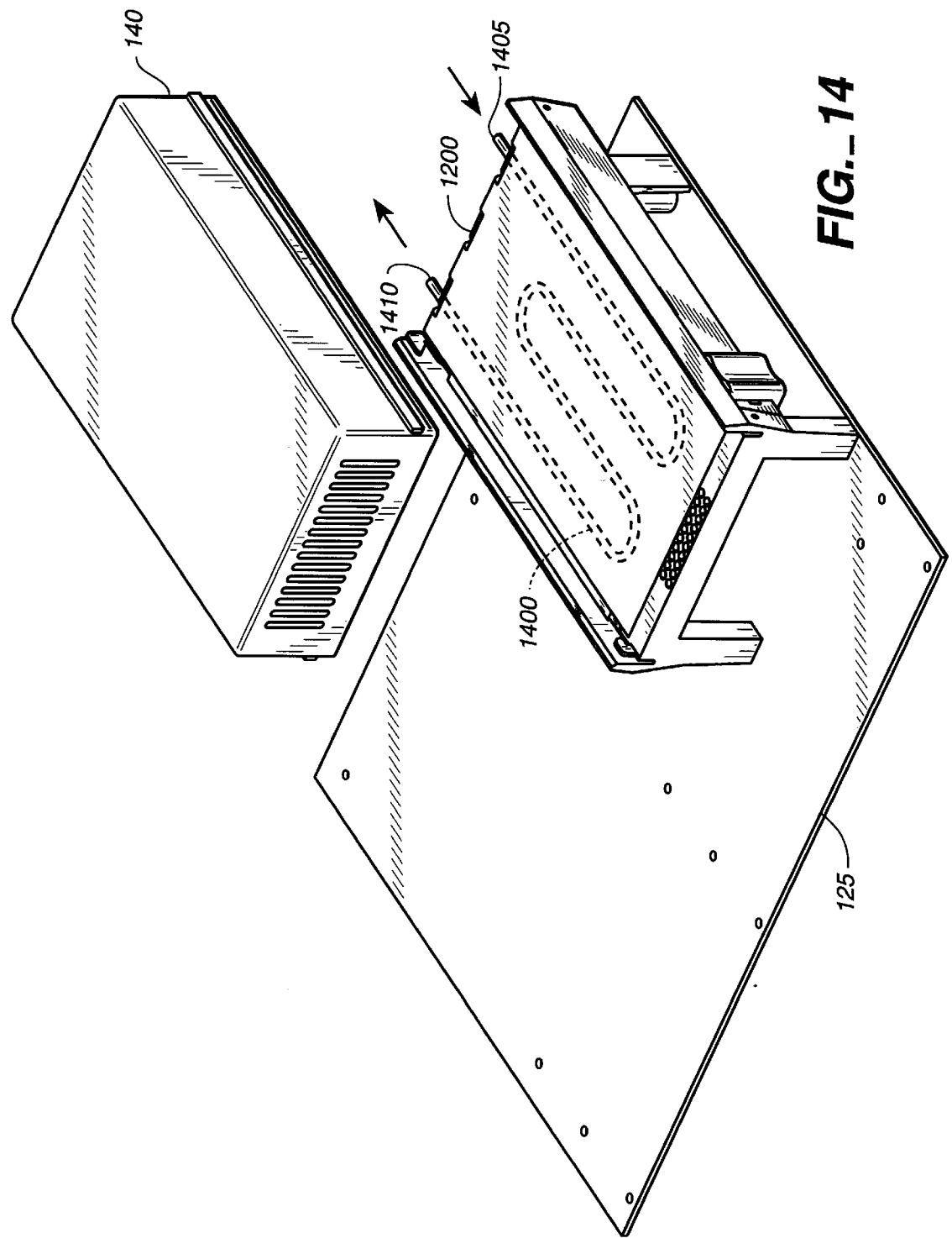
FIG._14

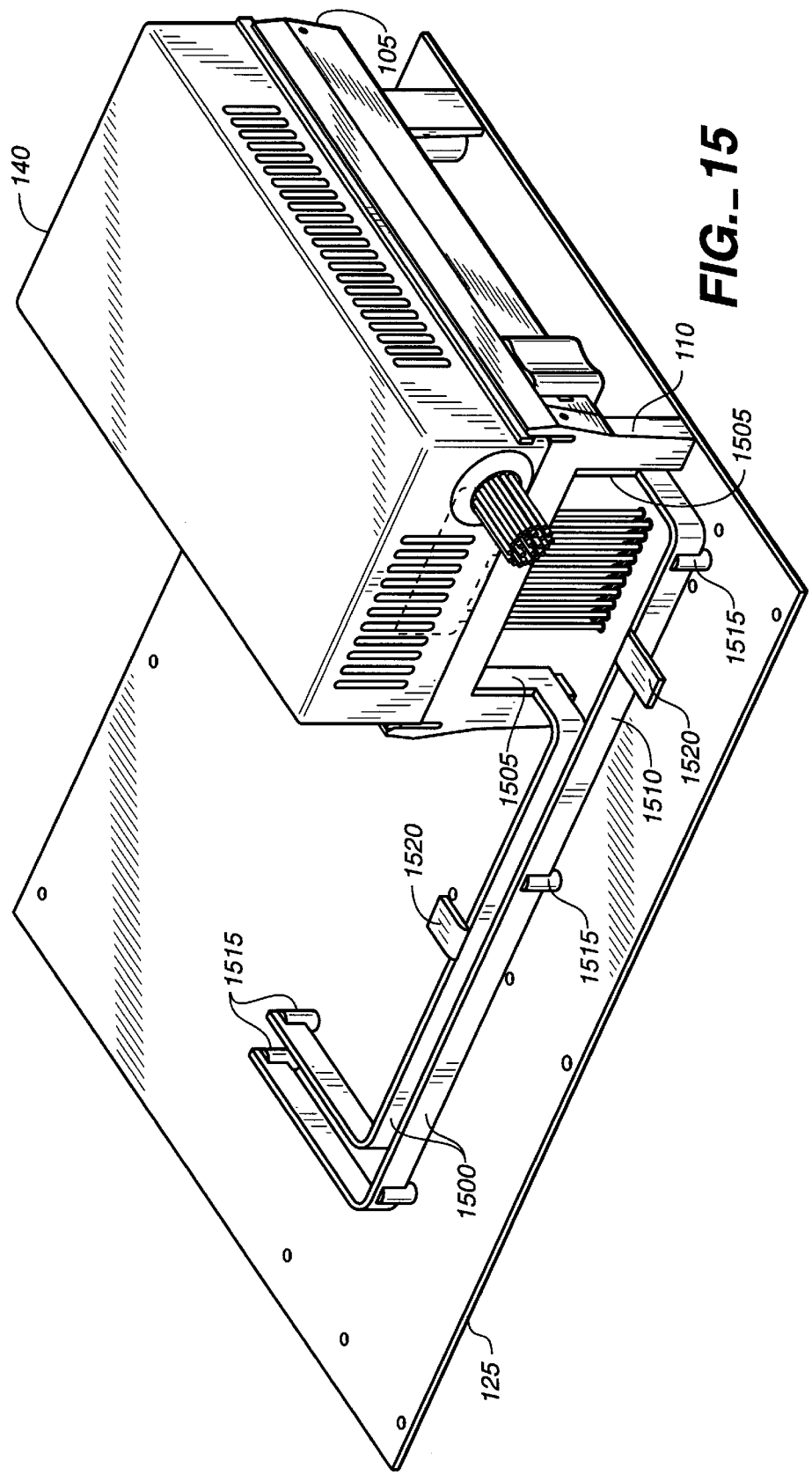

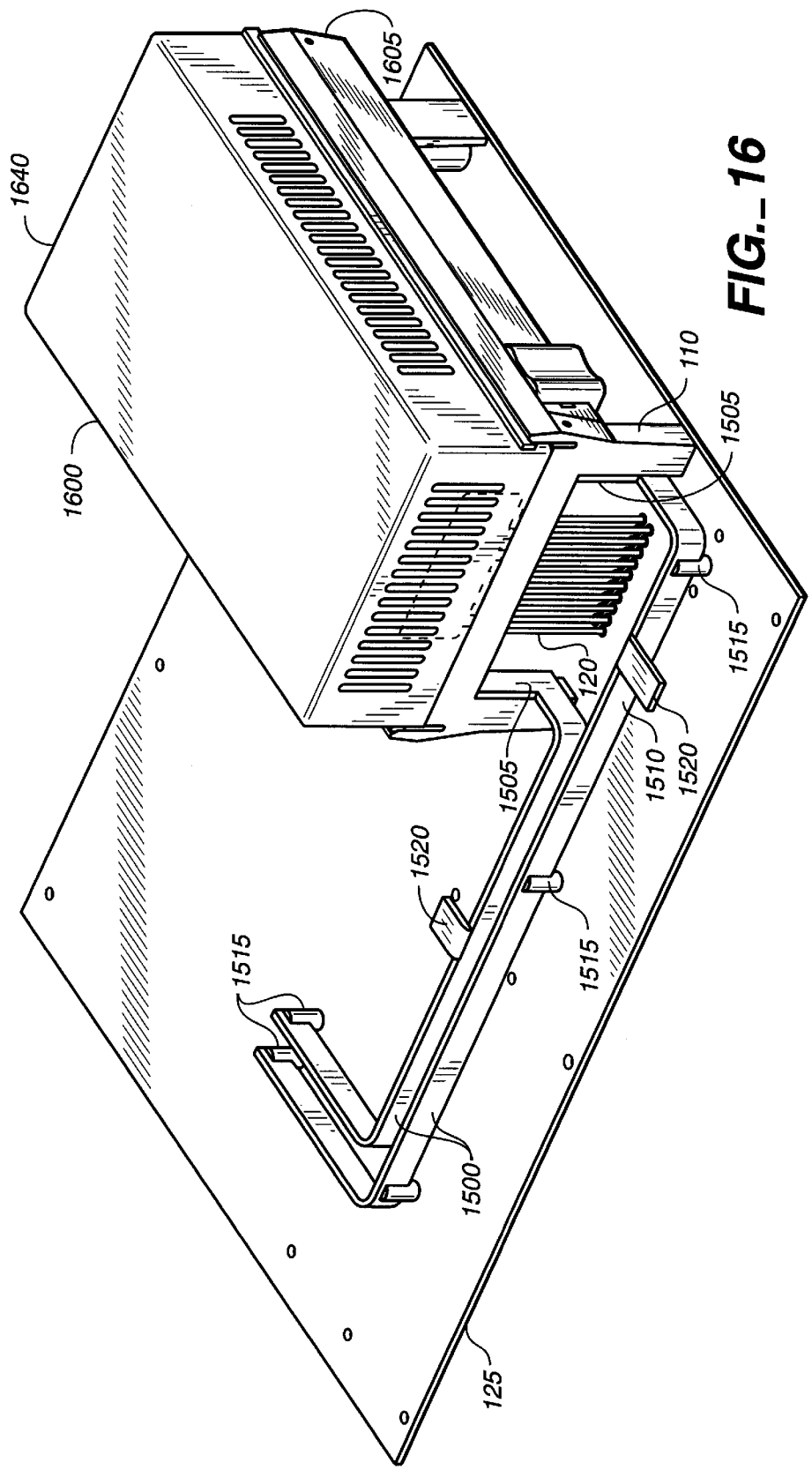

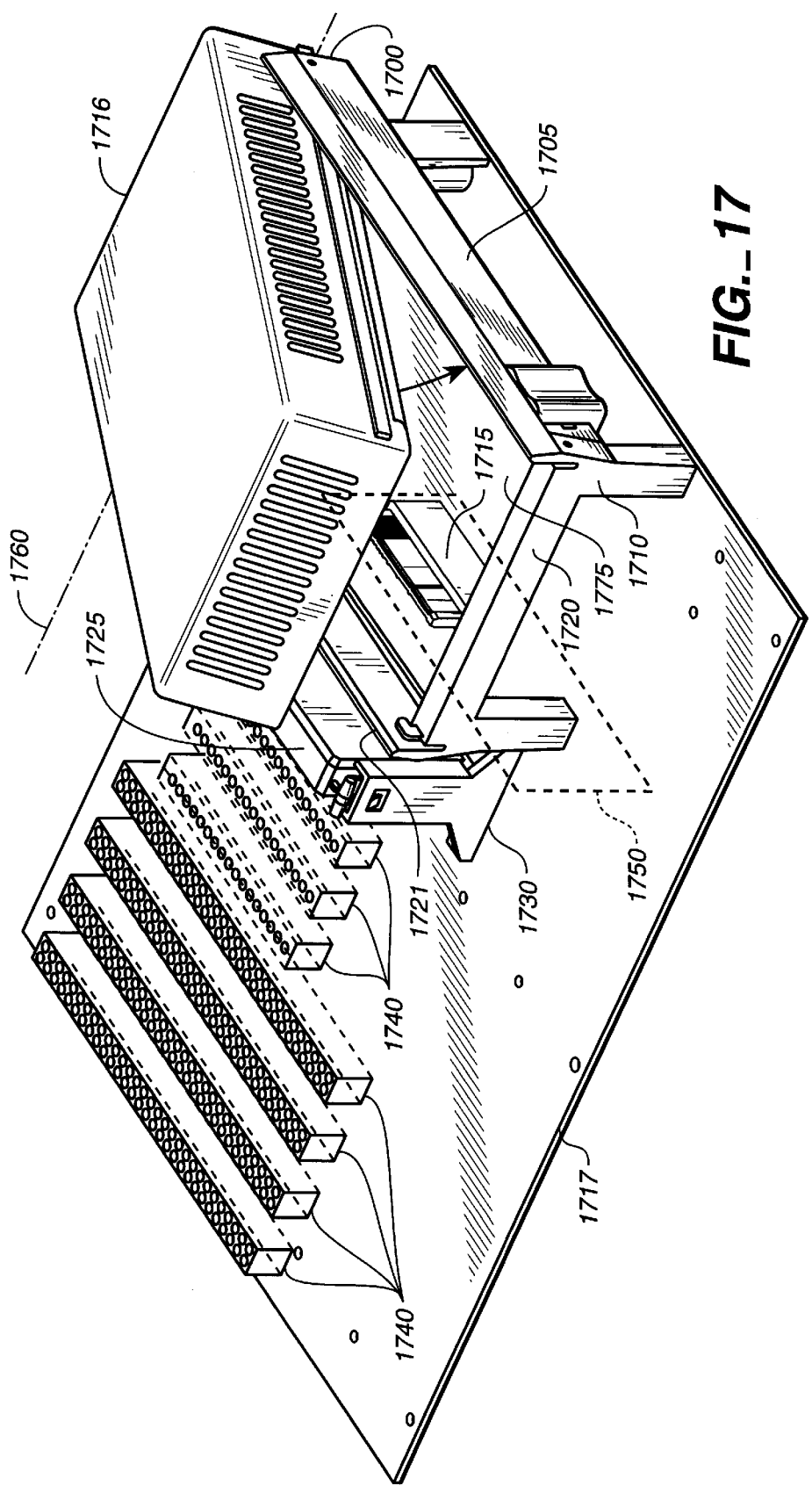
FIG._17

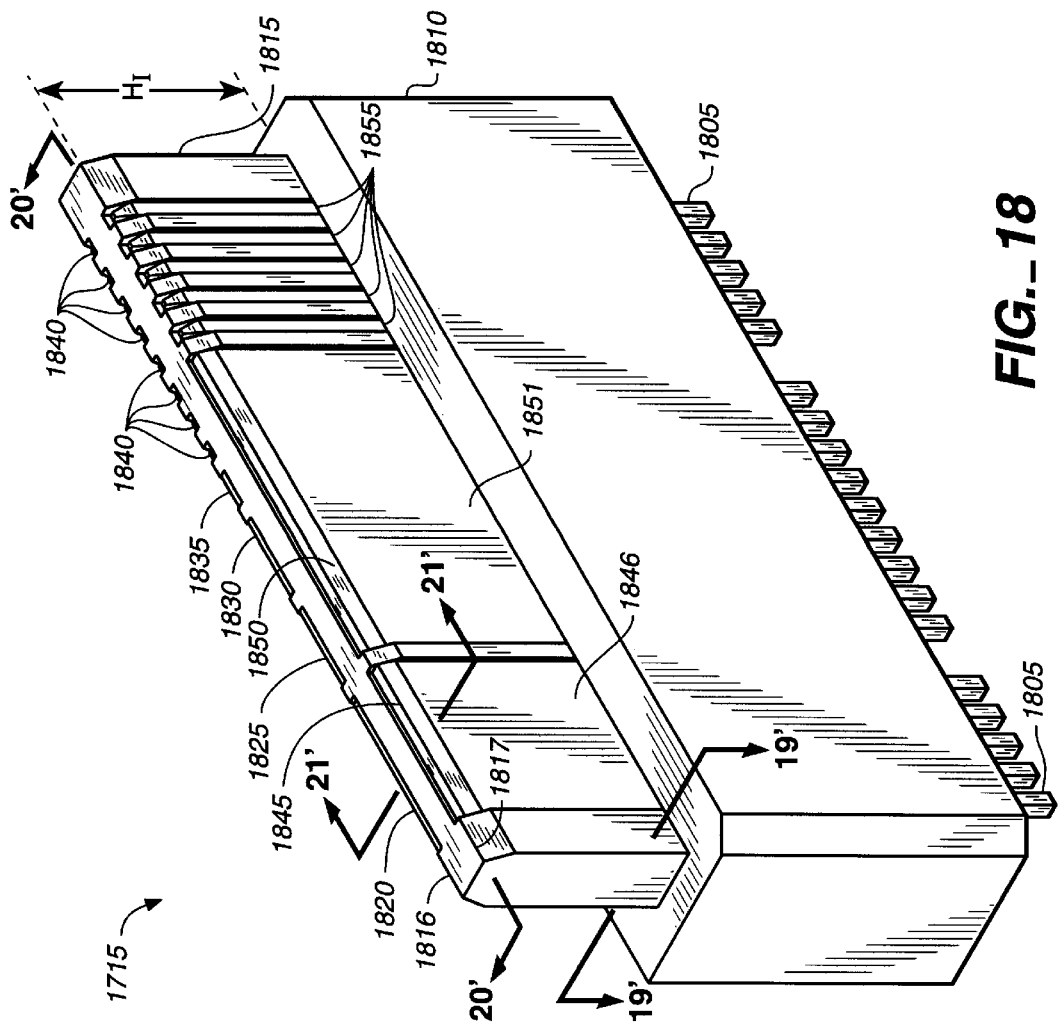
FIG._18

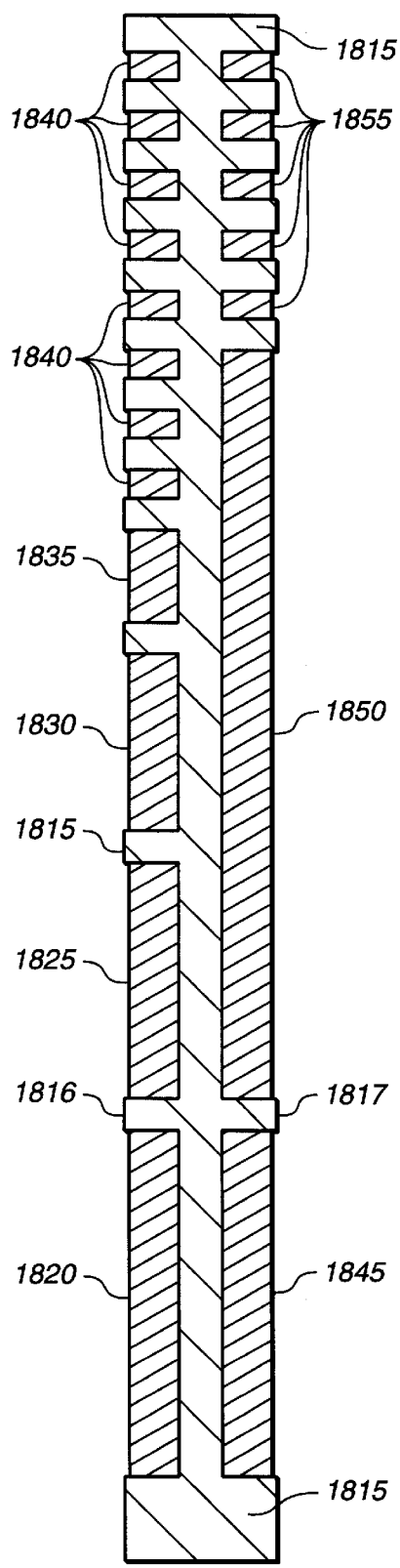
FIG._19
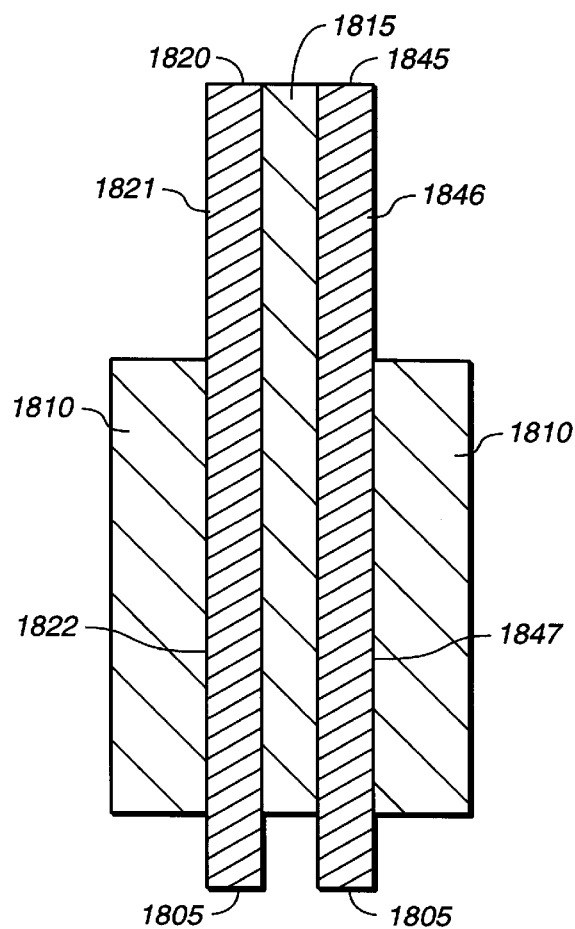
FIG._21

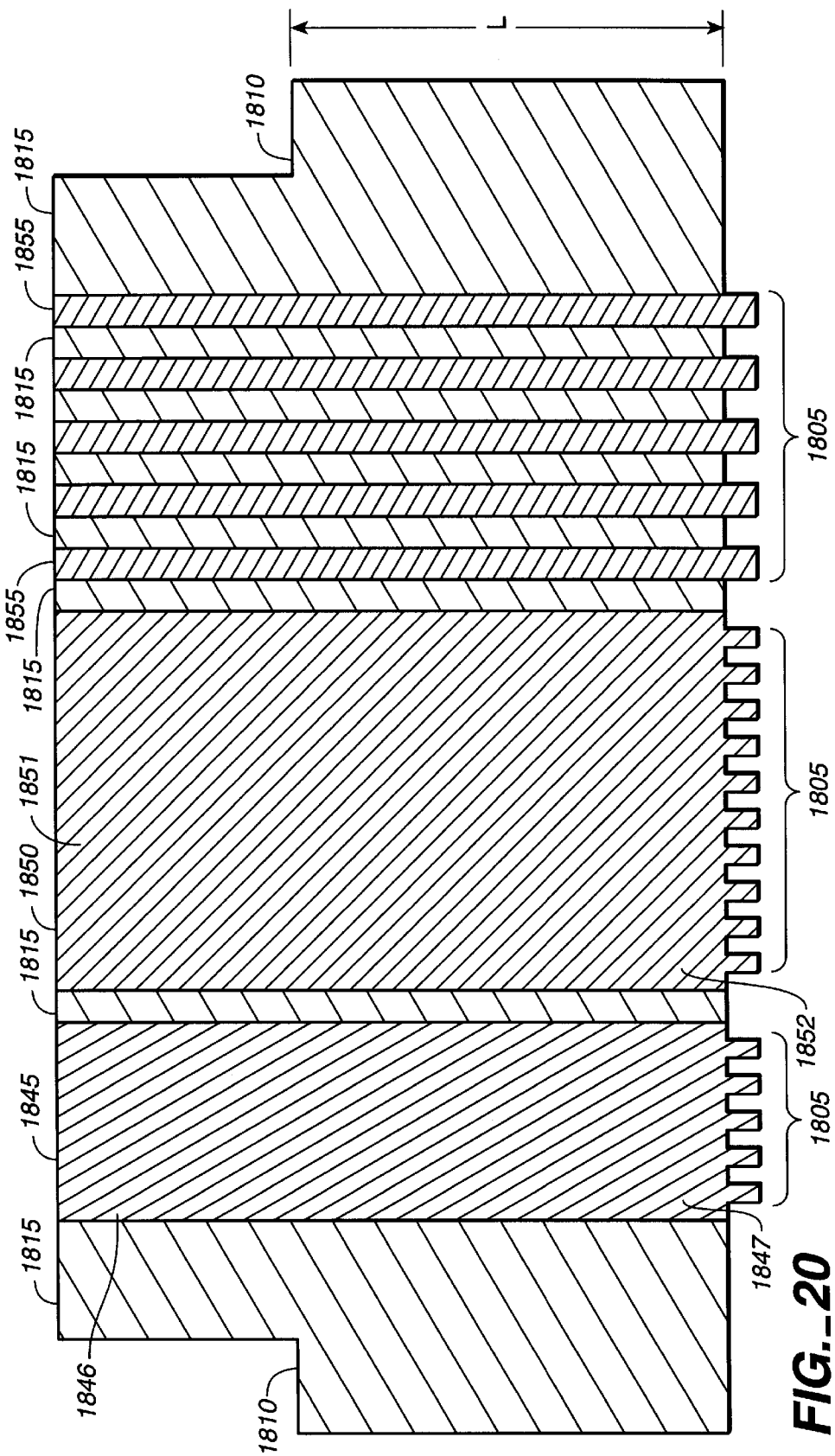
FIG._20

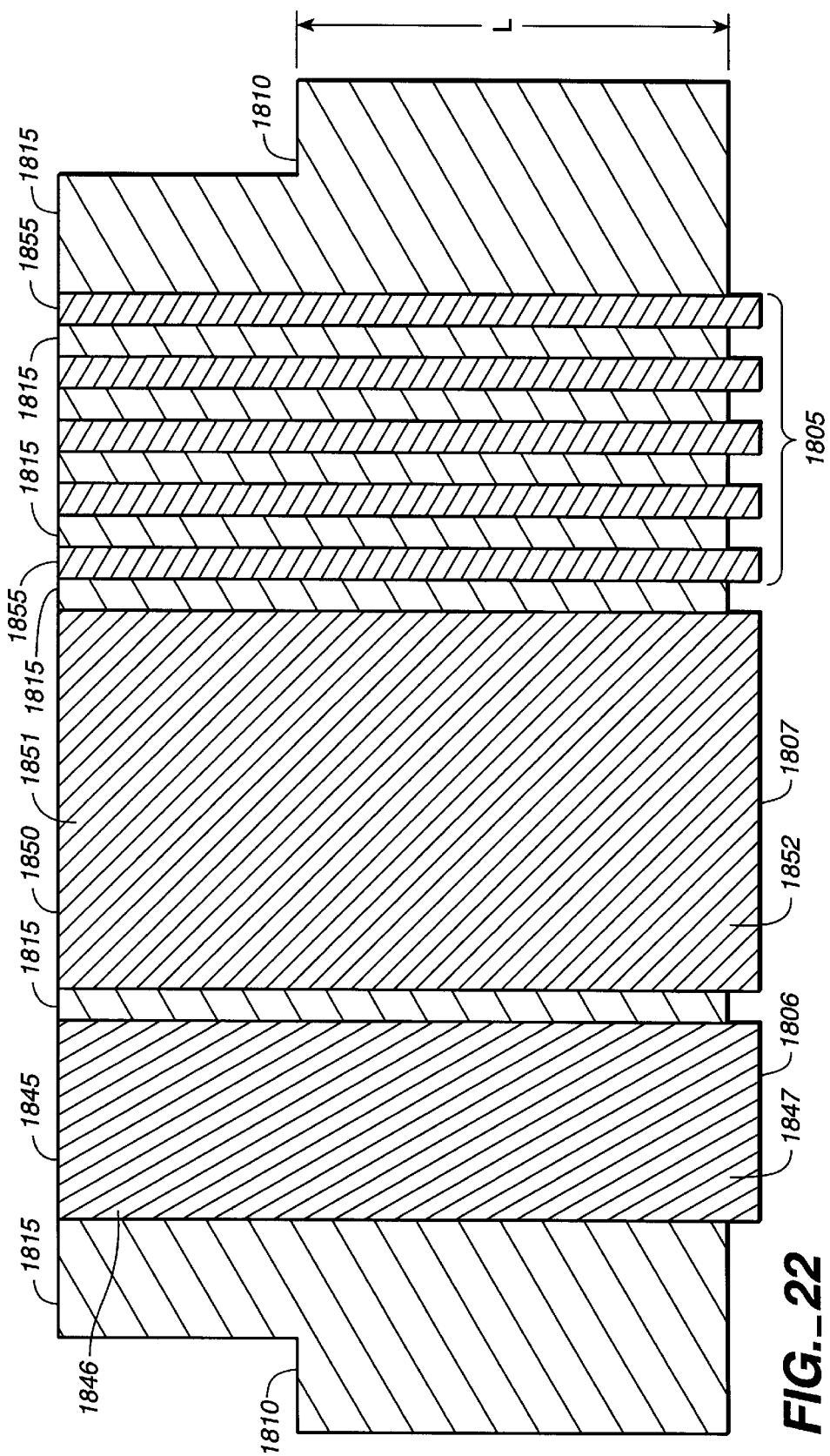
FIG._22

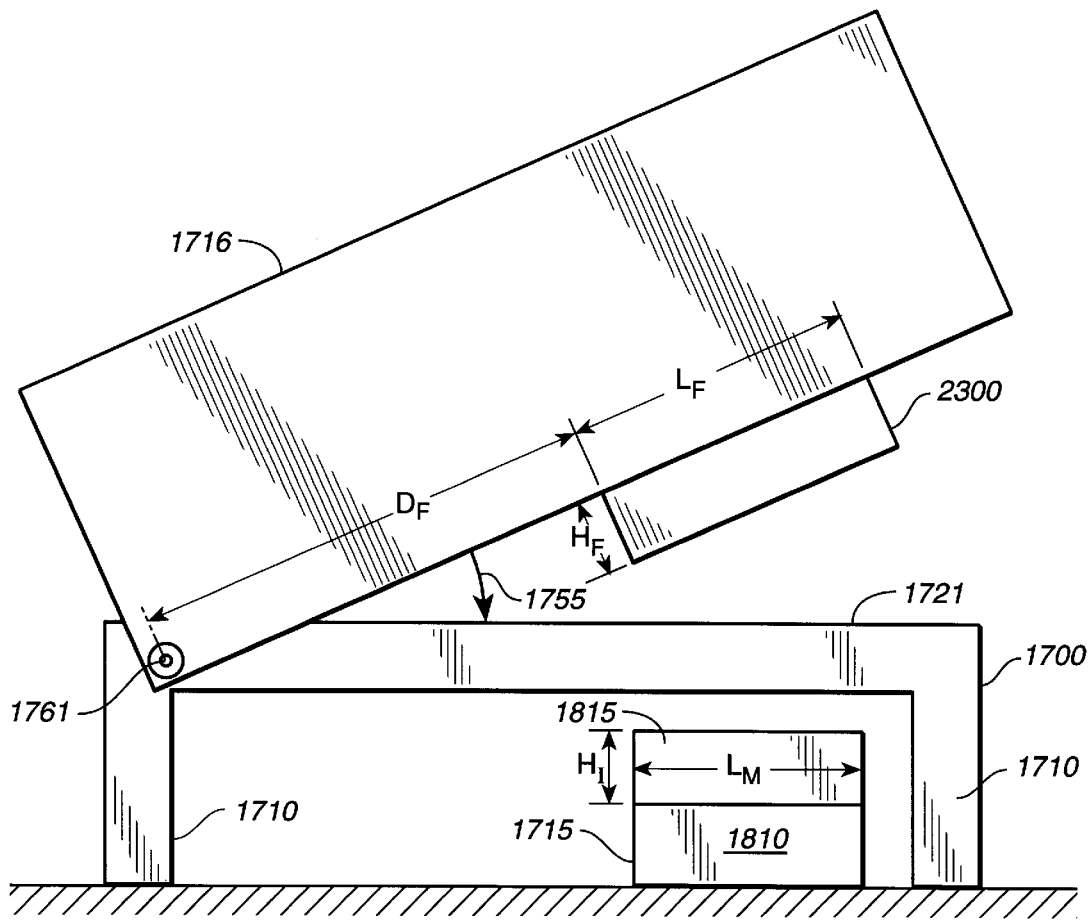
FIG._23

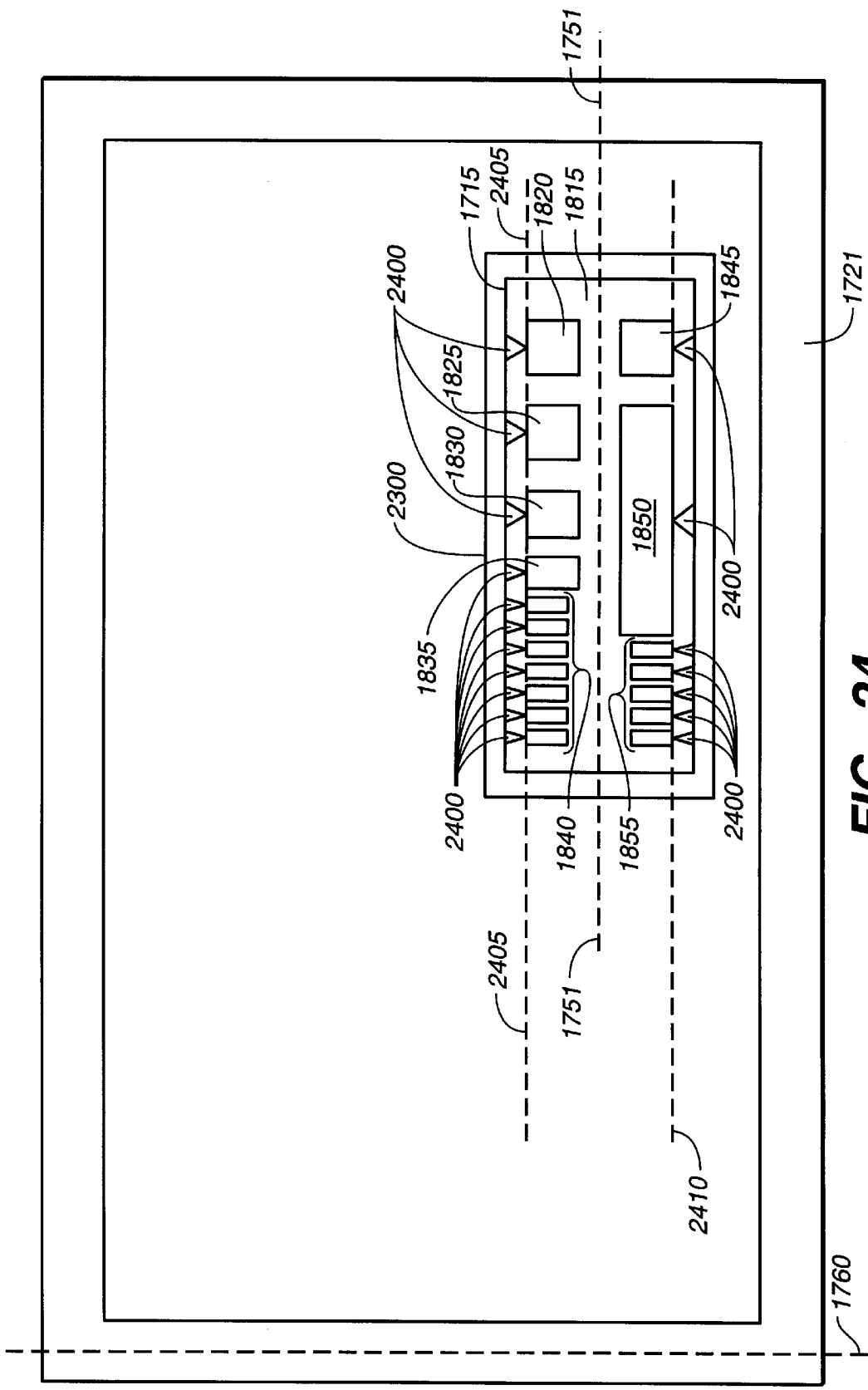
FIG._24

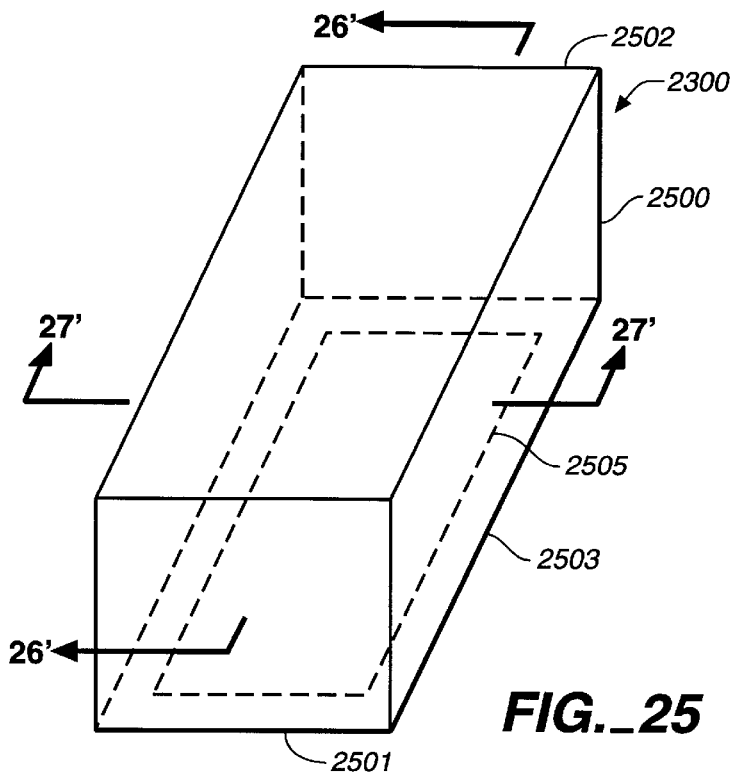
FIG._25
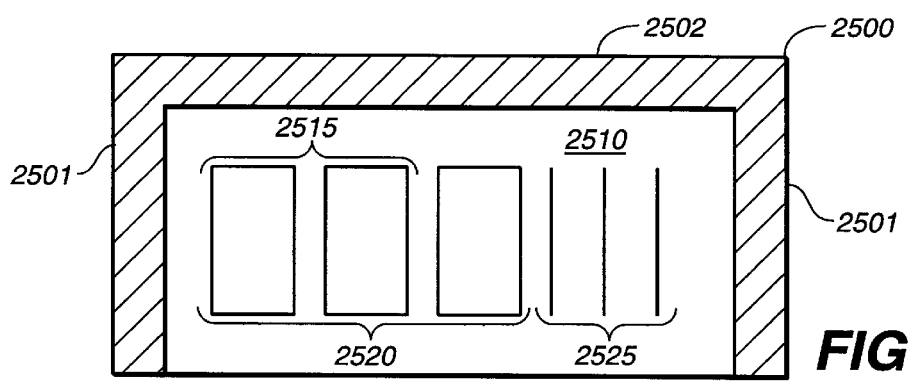
FIG._26
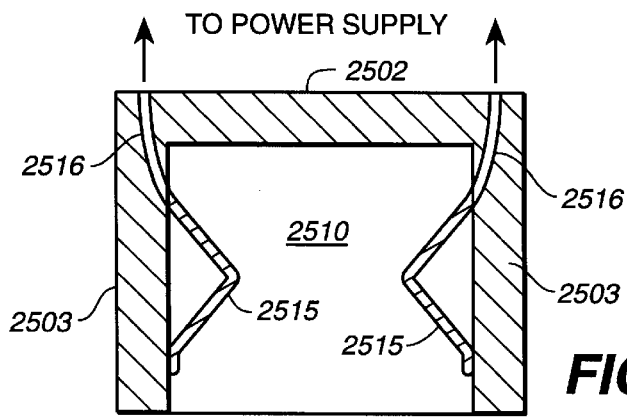
FIG._27

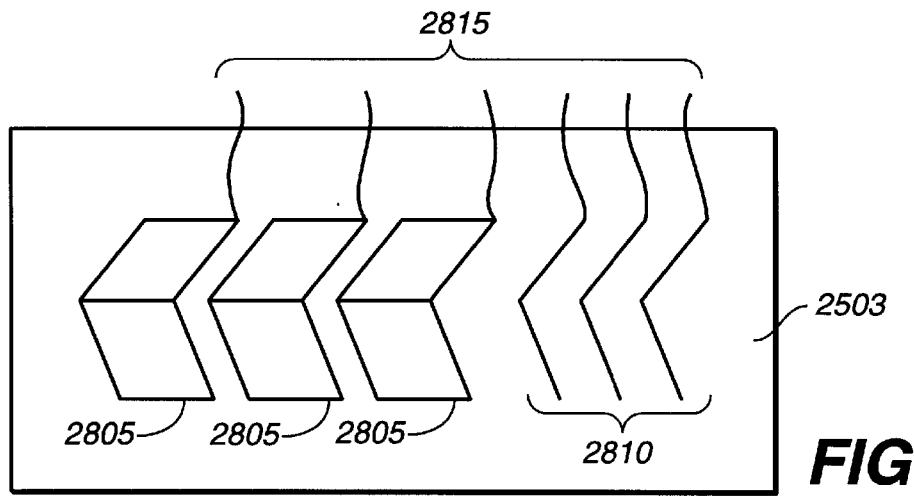
FIG._28
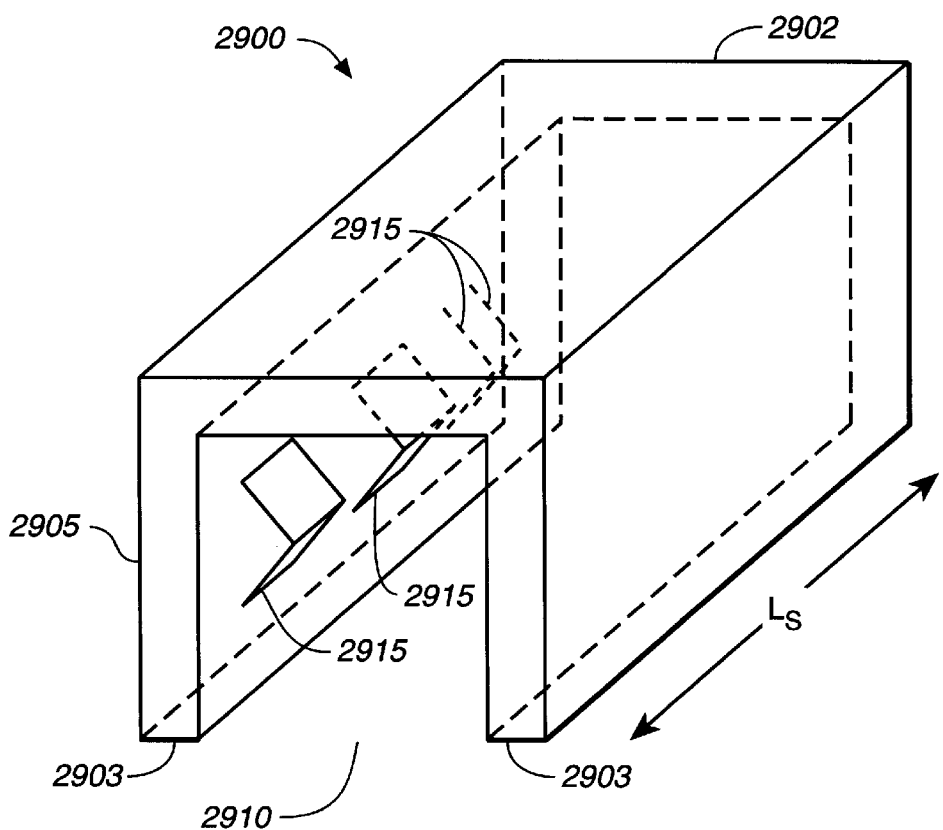
FIG._29

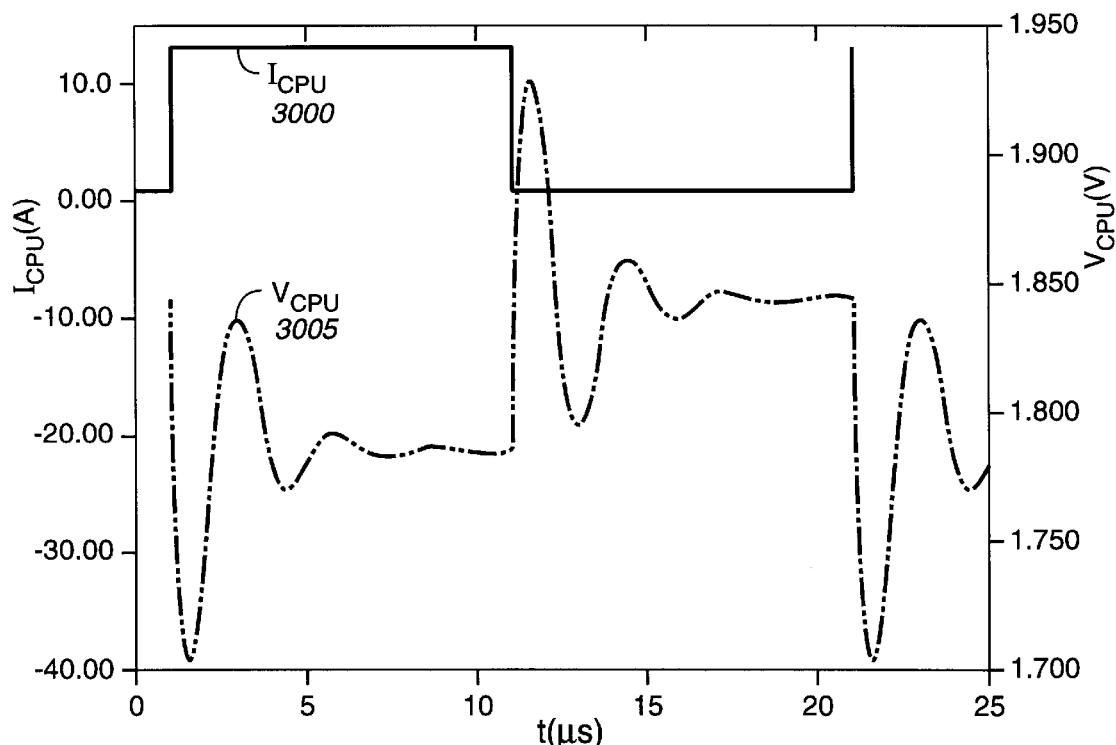
FIG._30 (PRIOR ART)
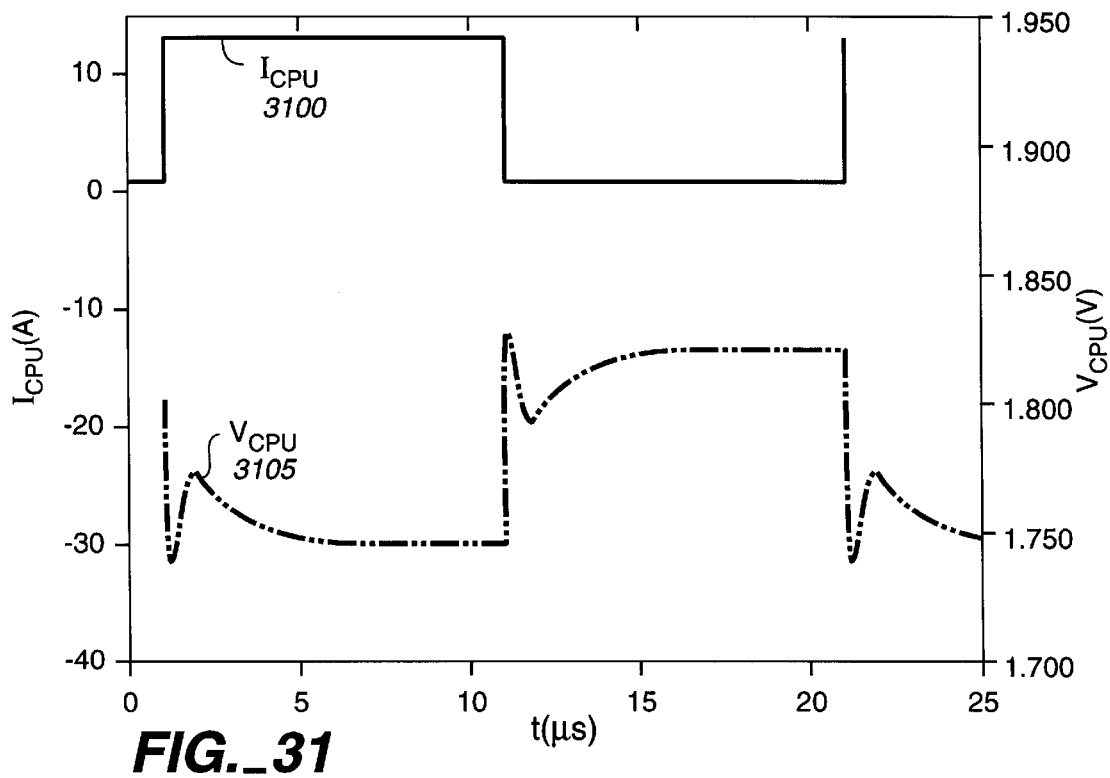
FIG._31

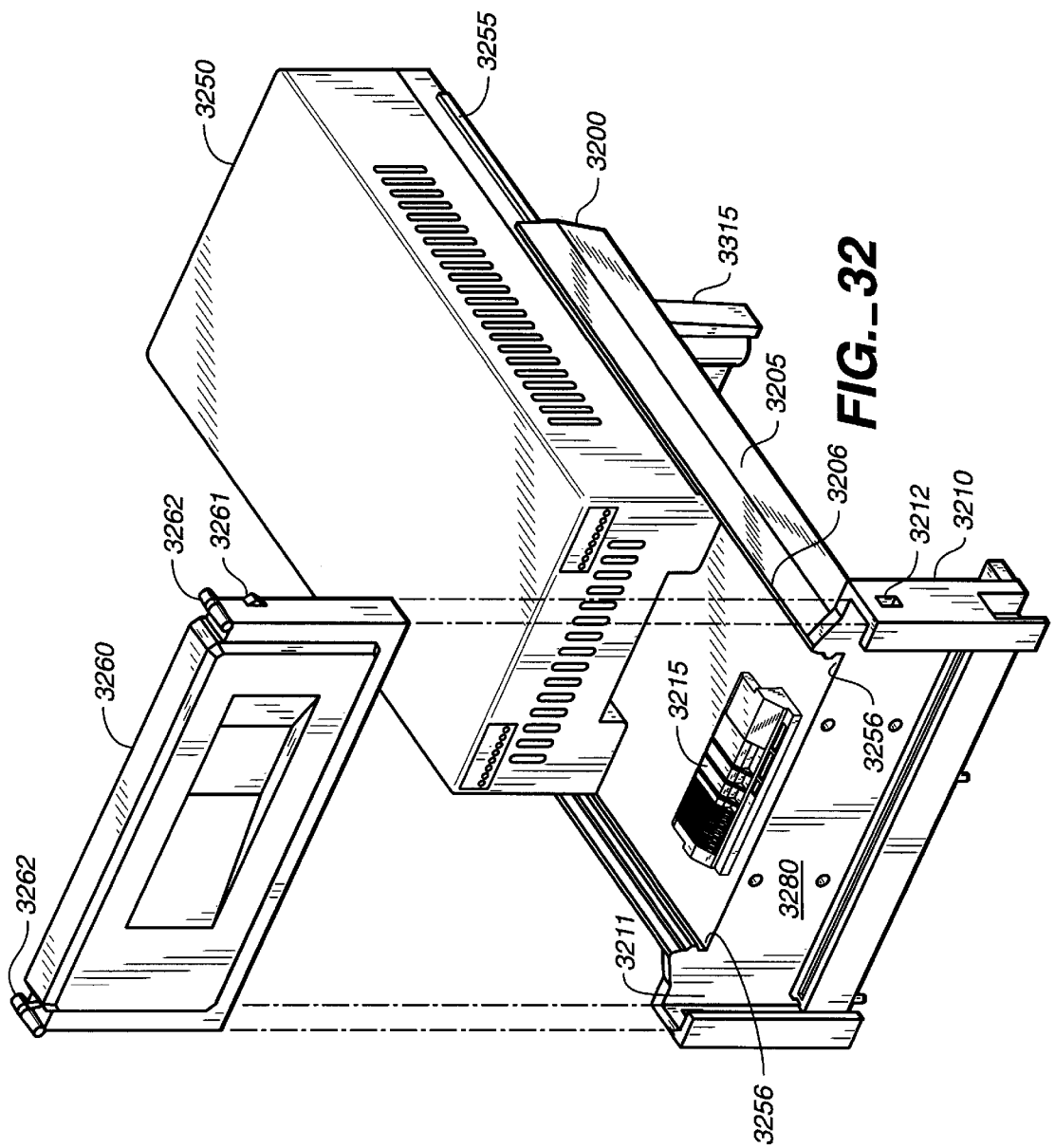

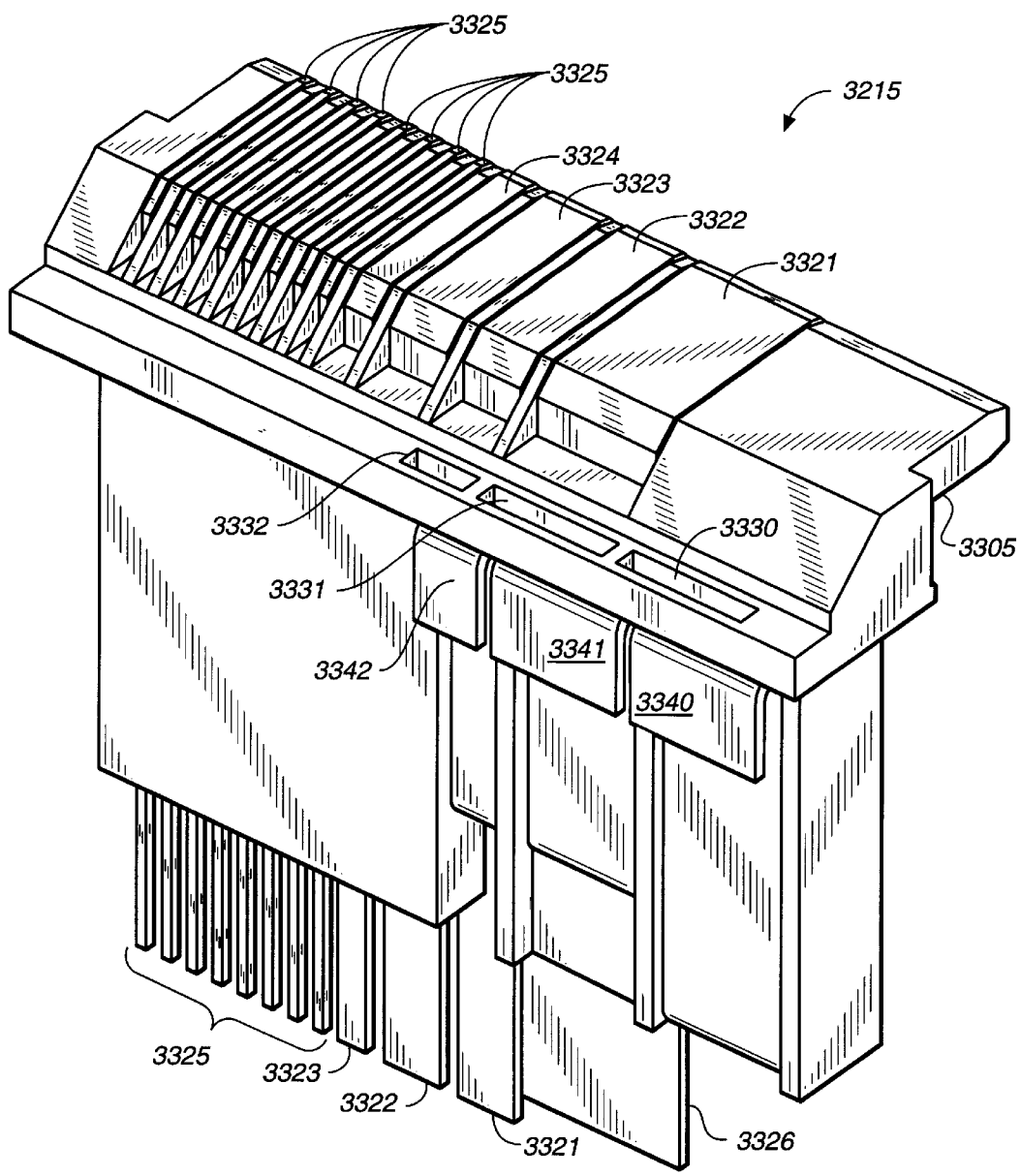
FIG._33

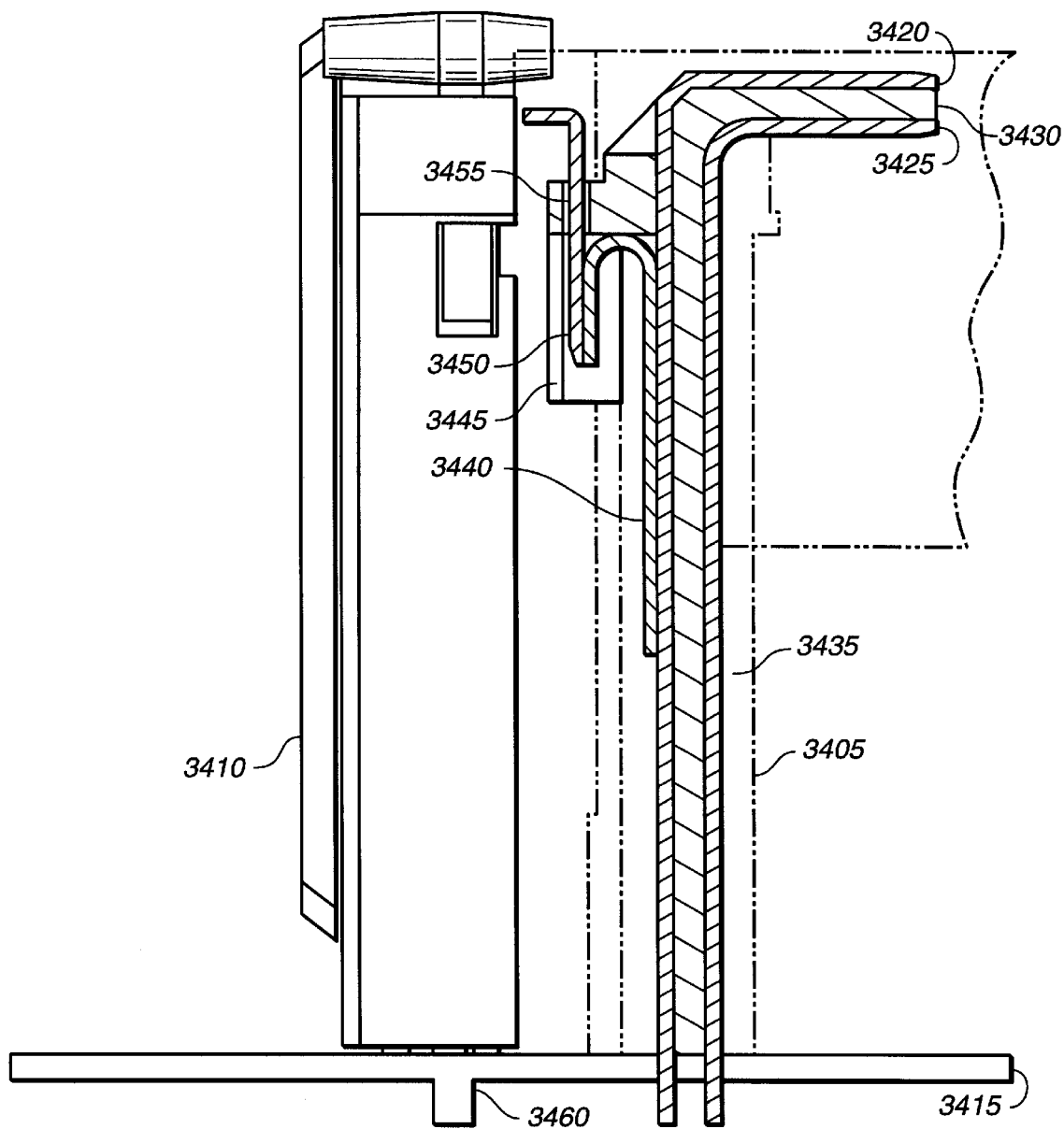
FIG._34

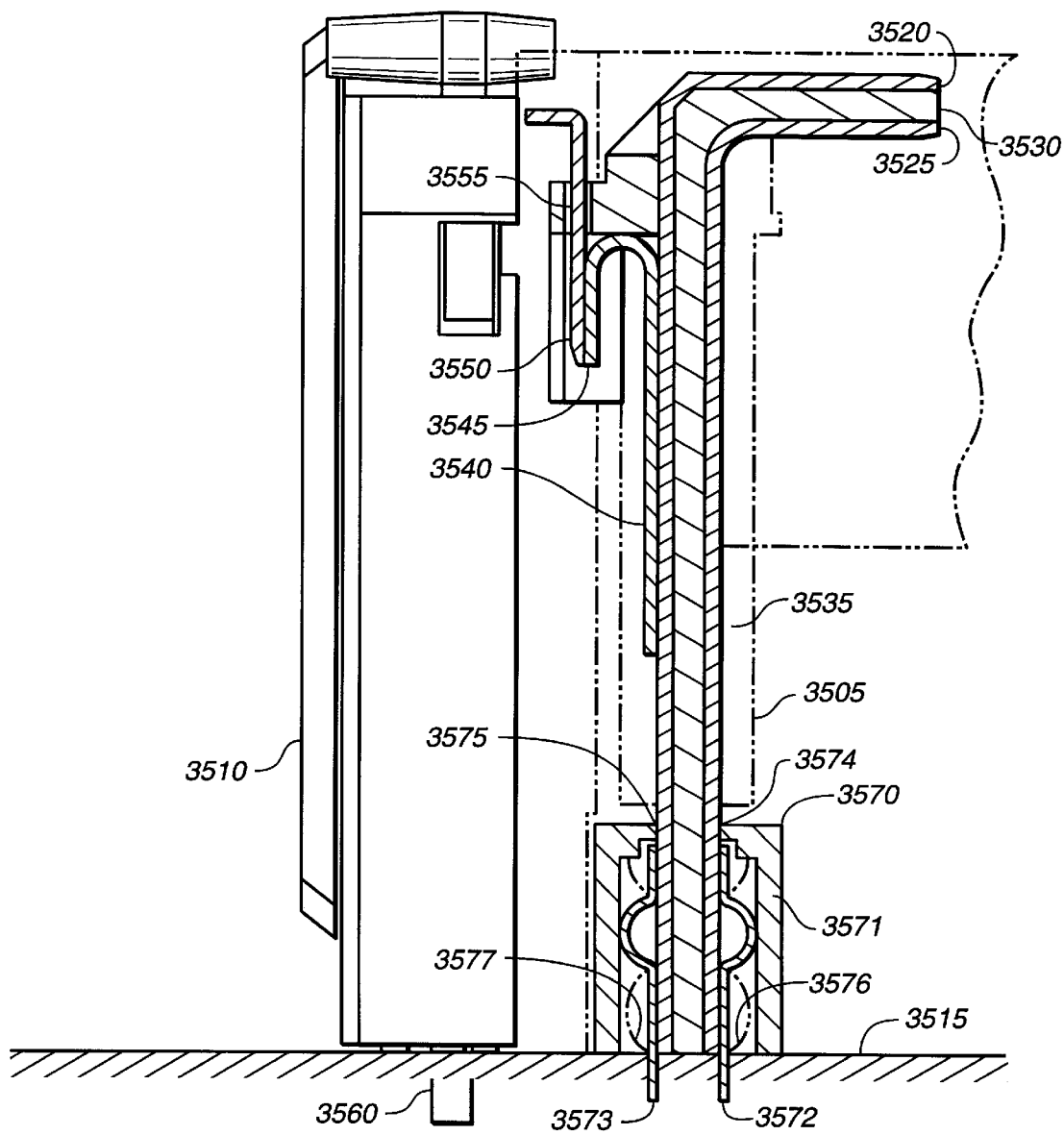
FIG._35

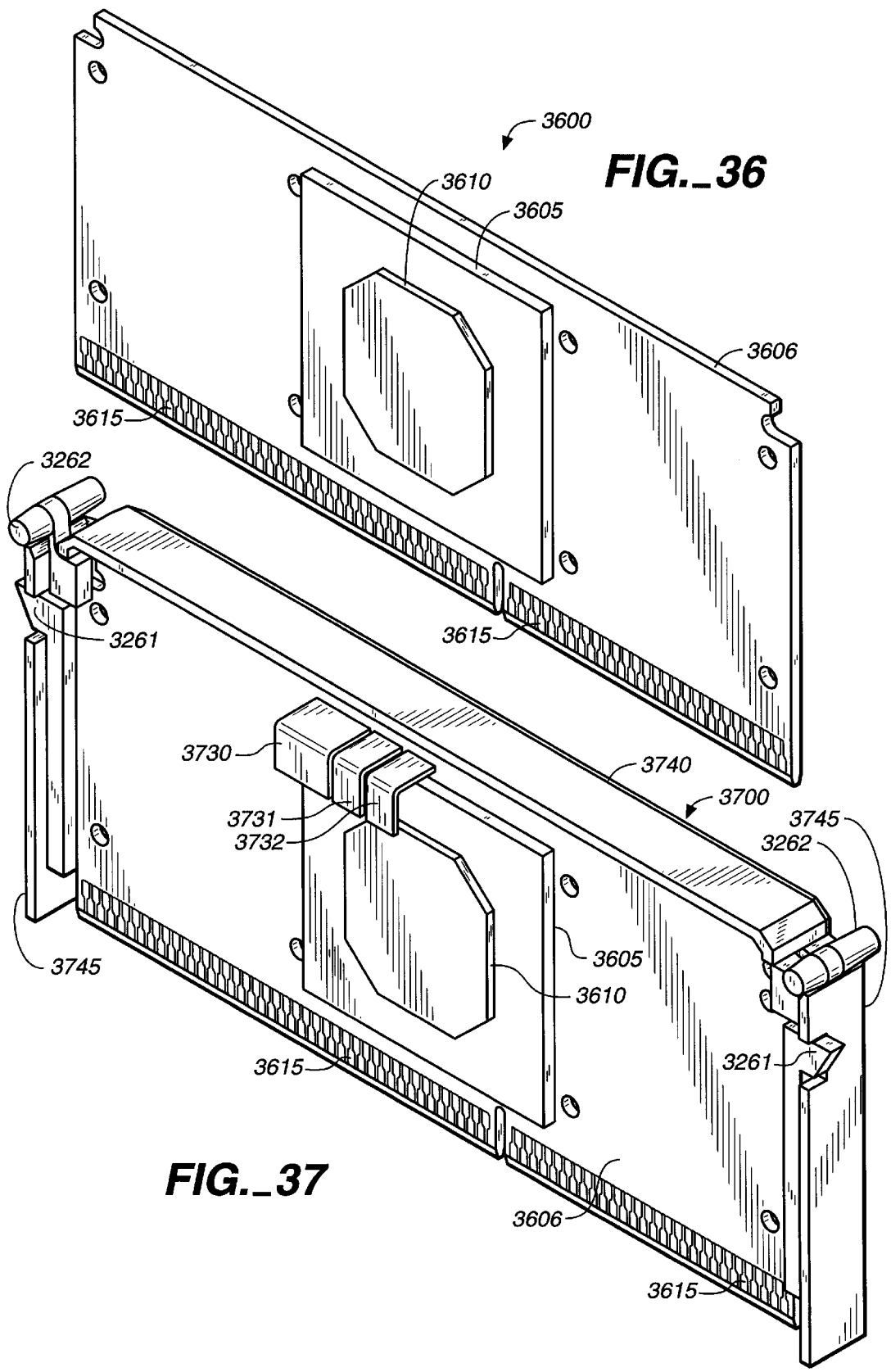

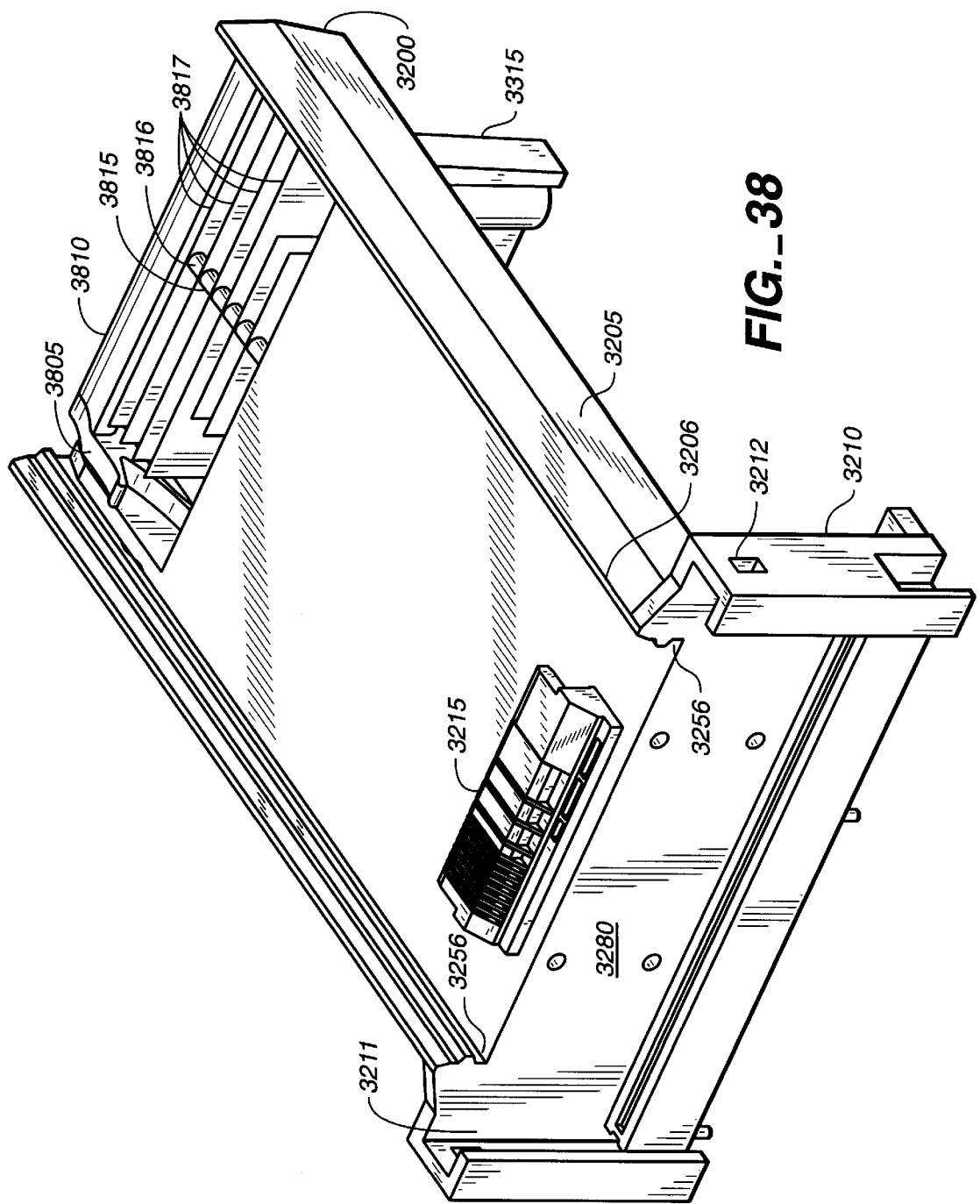
FIG._38

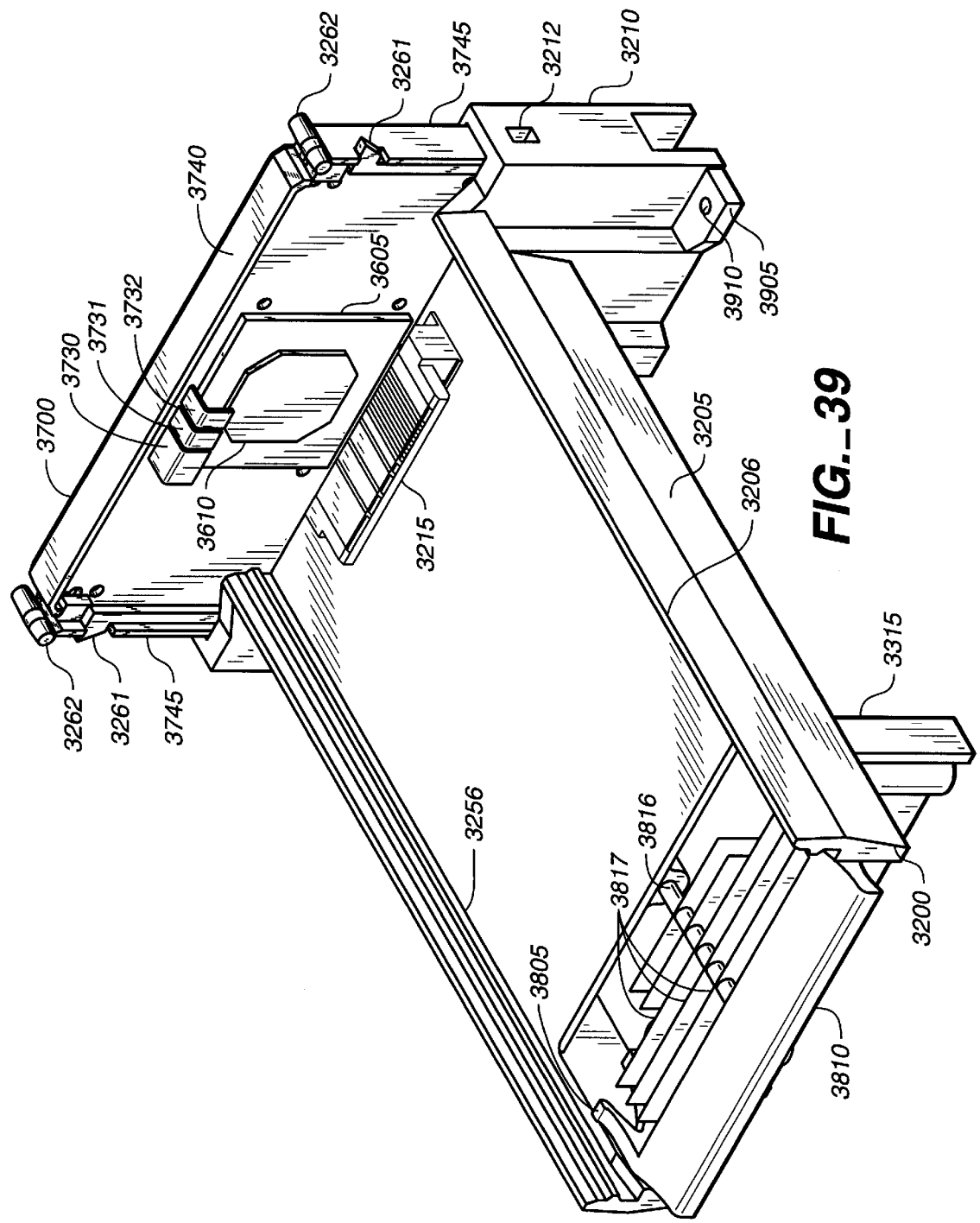
FIG._39

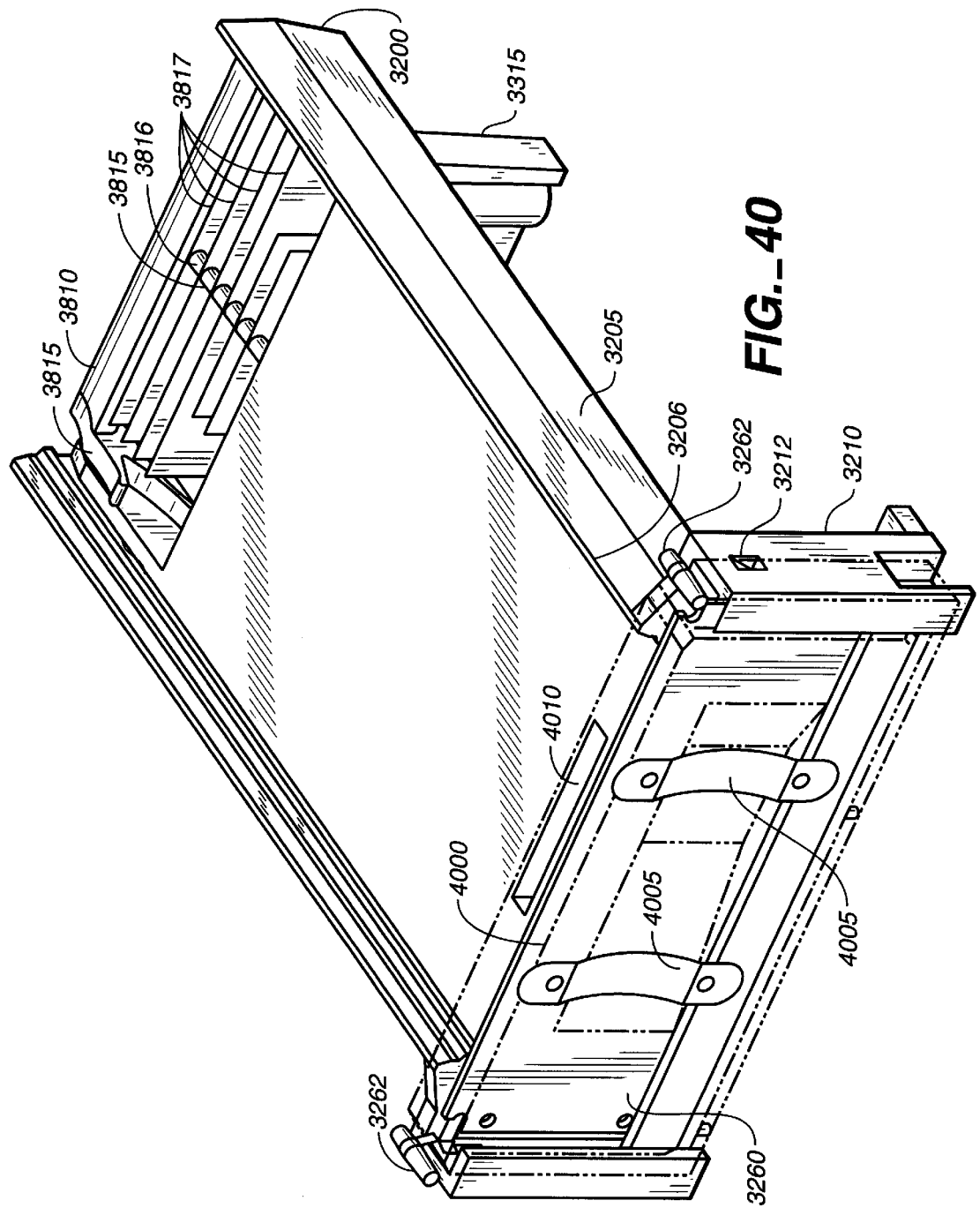
FIG._40

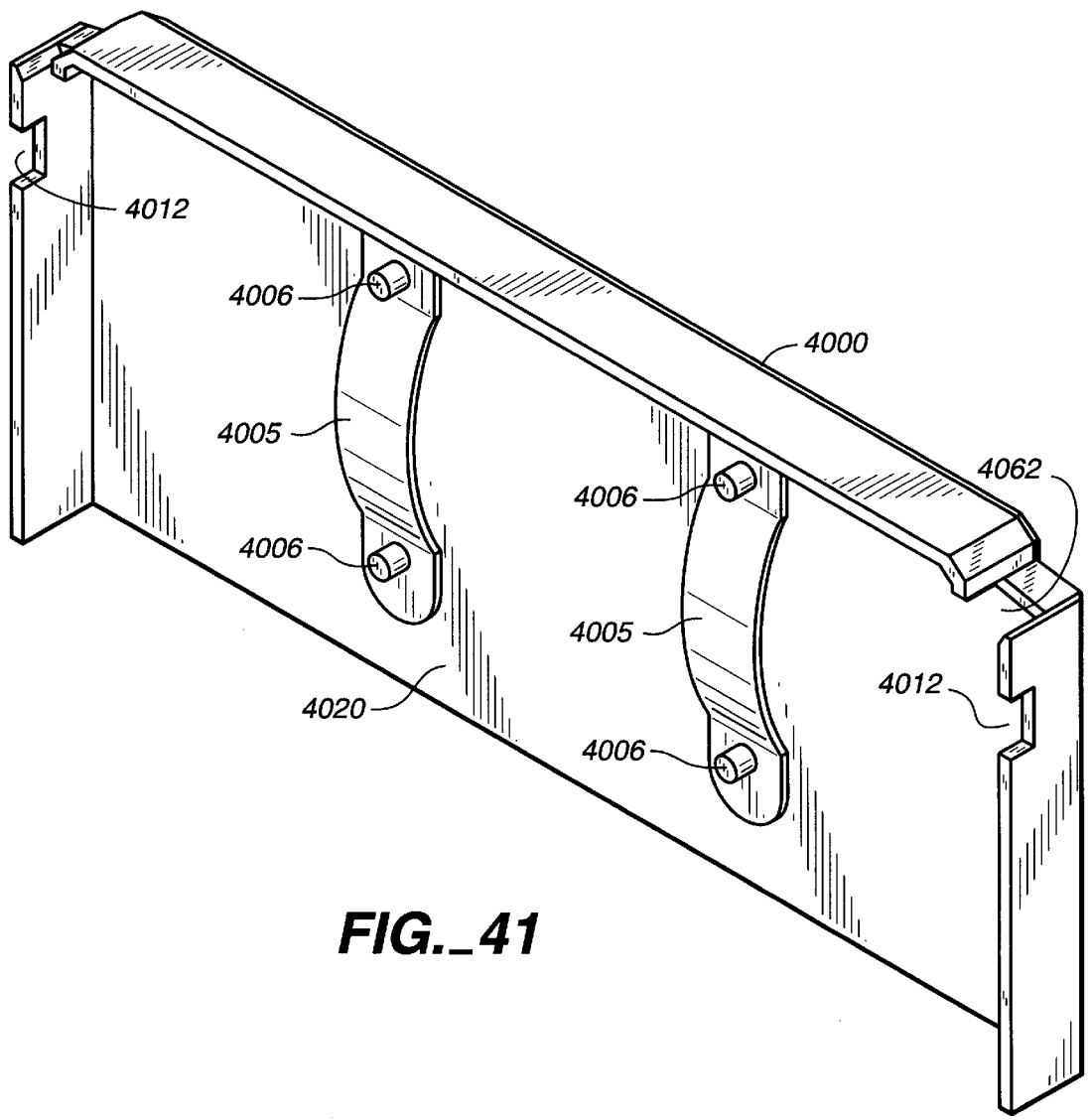
FIG._41

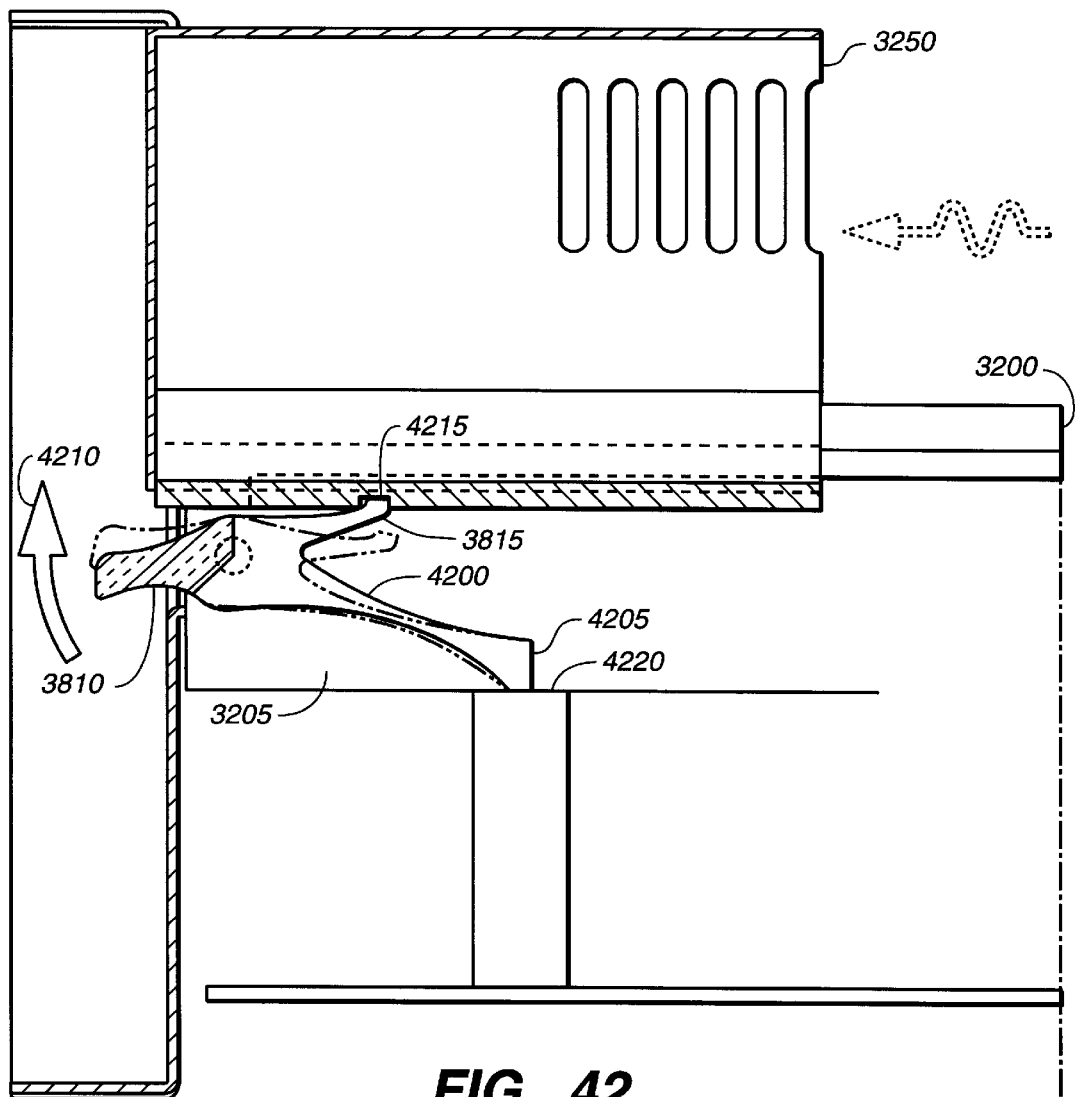
FIG._42

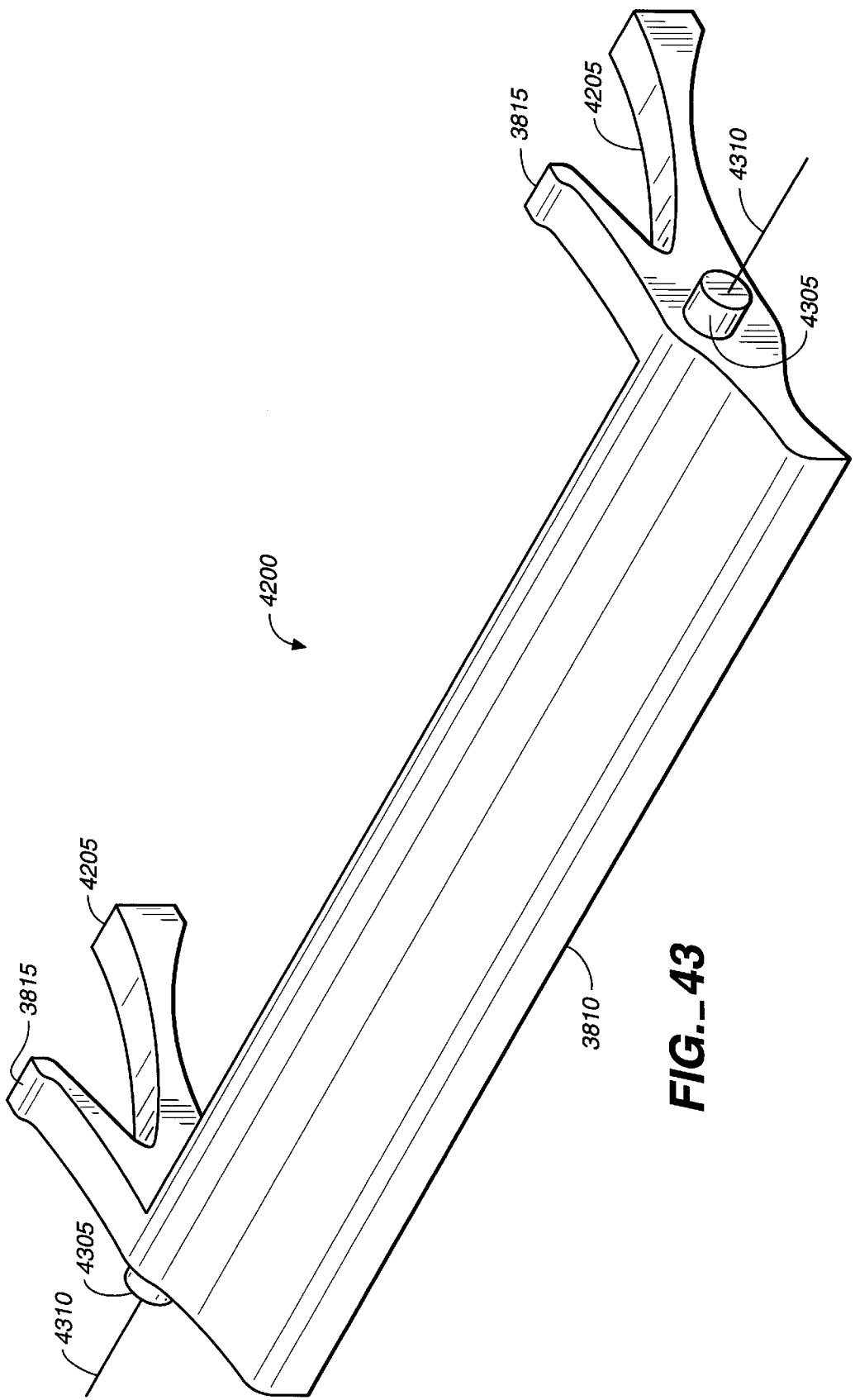
FIG._43

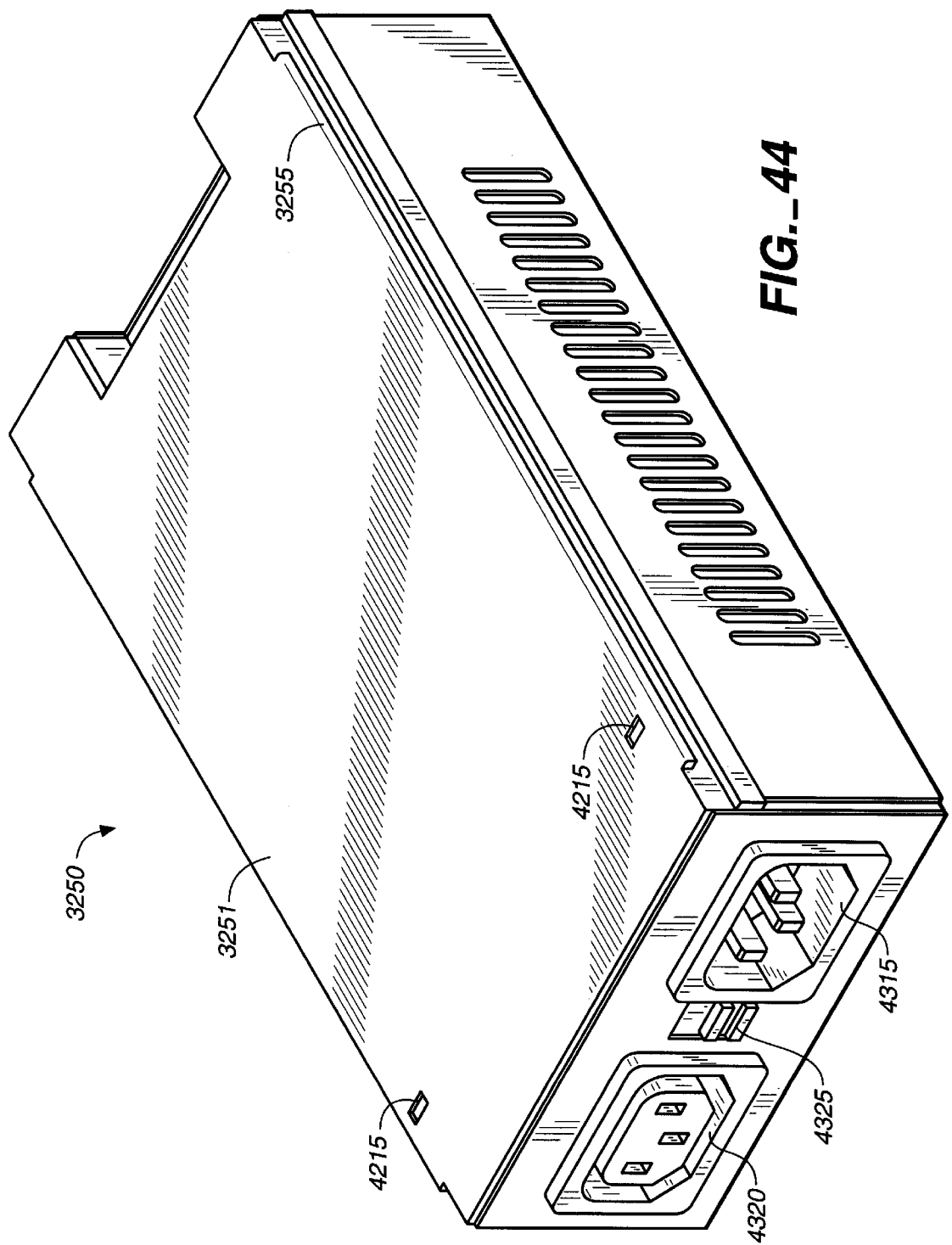
FIG._44

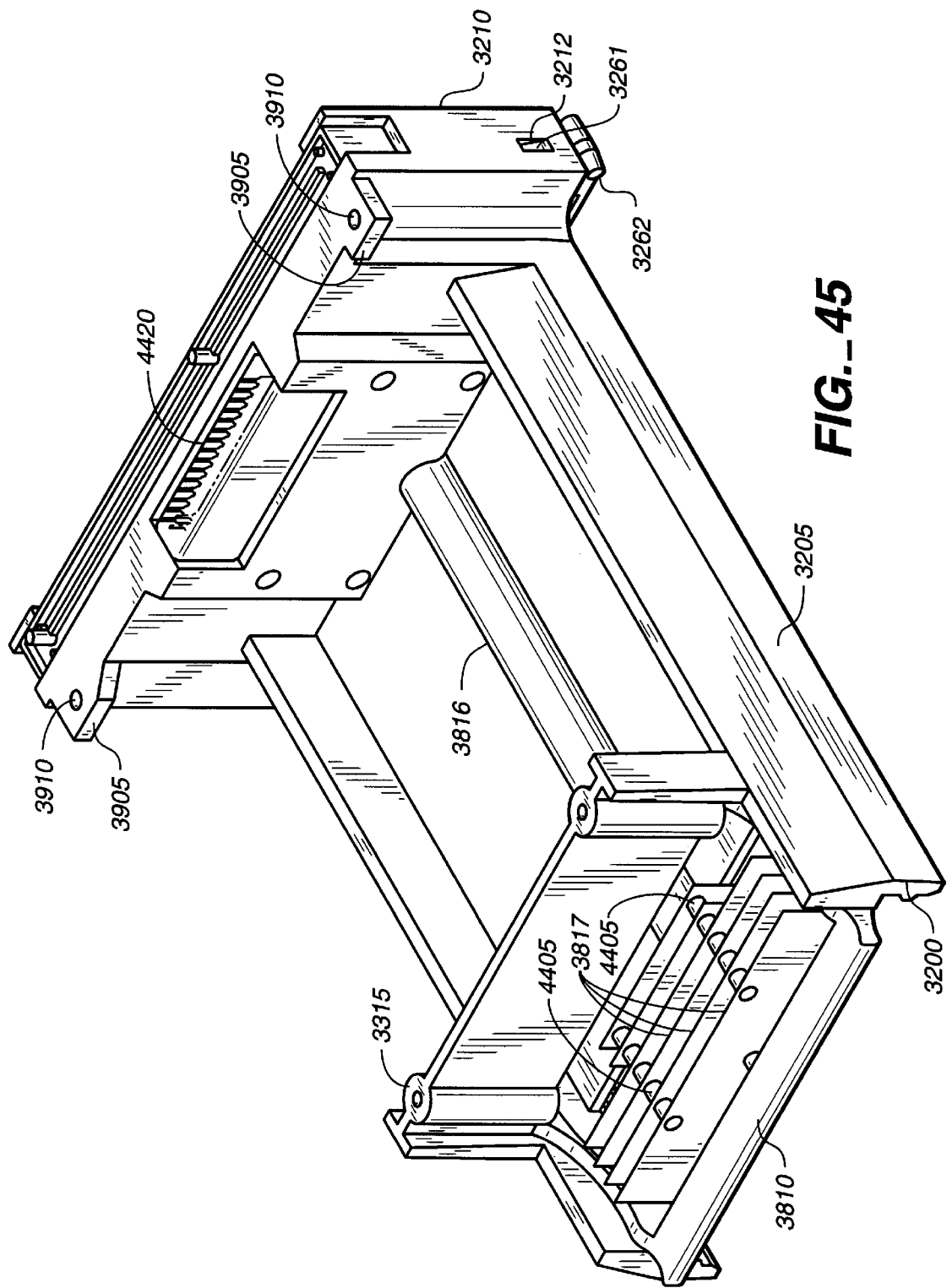
FIG._45

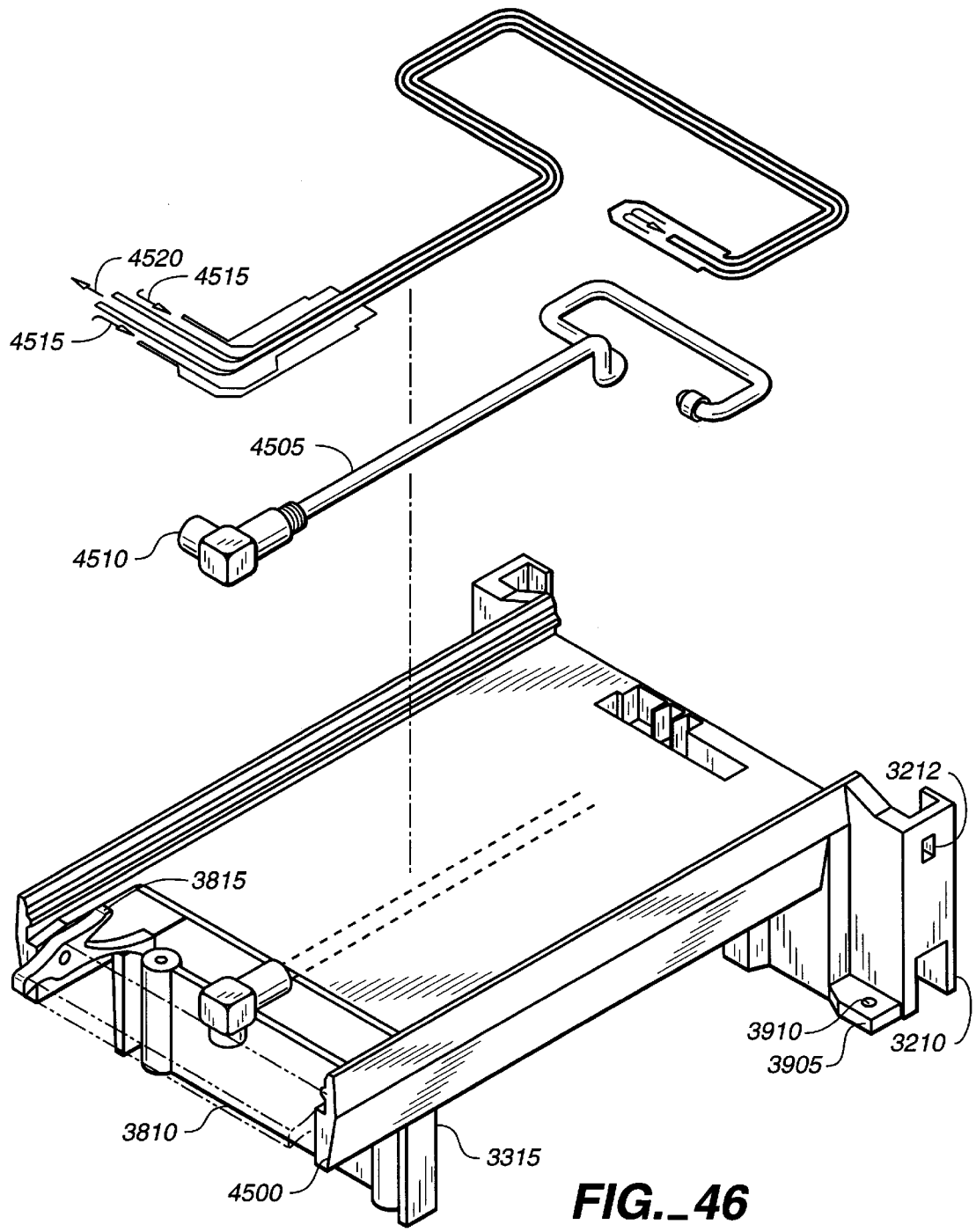
FIG._46

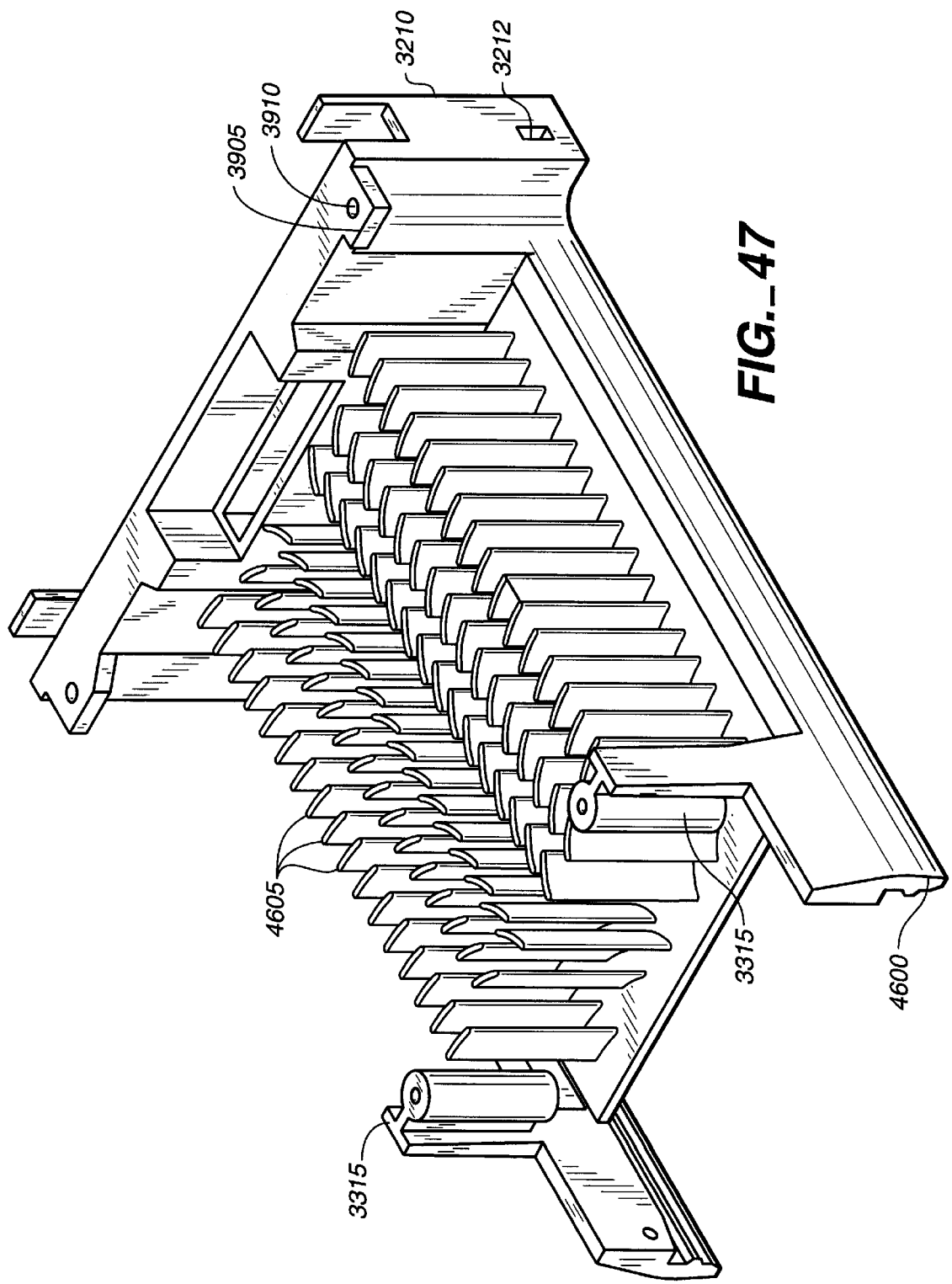

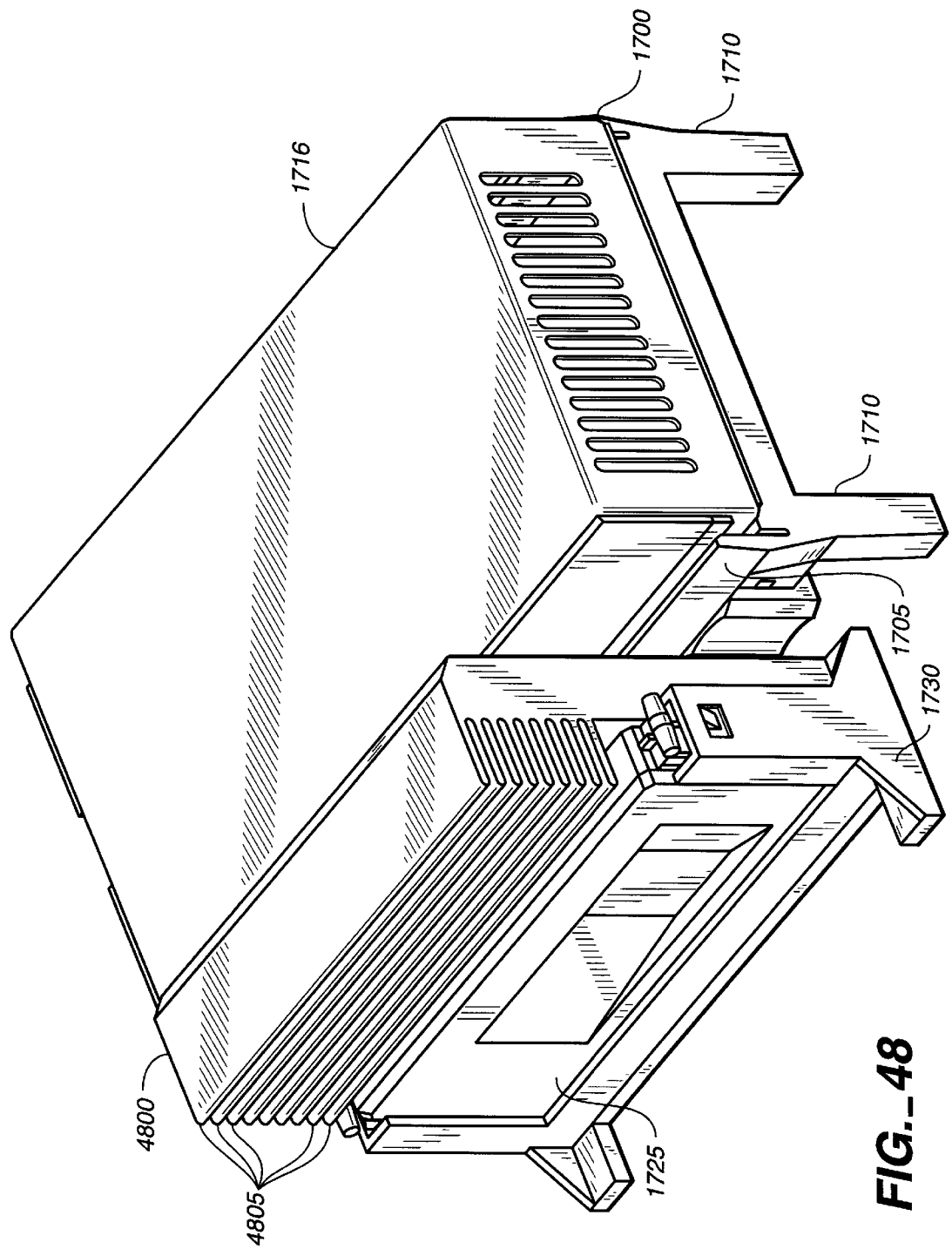
FIG._48

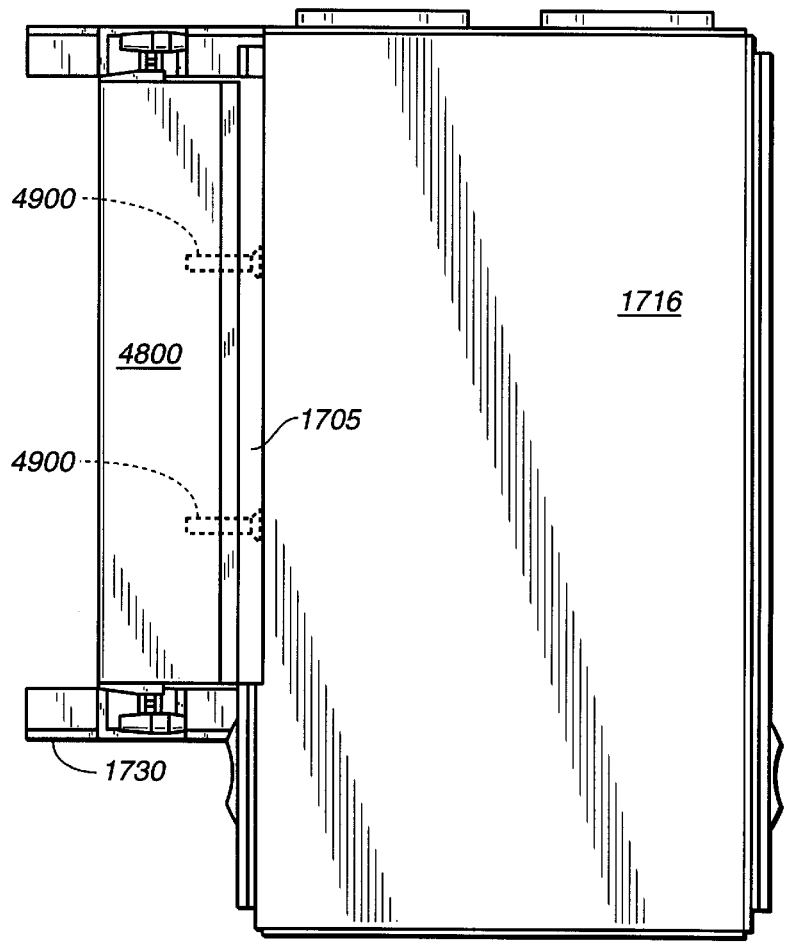
FIG._49
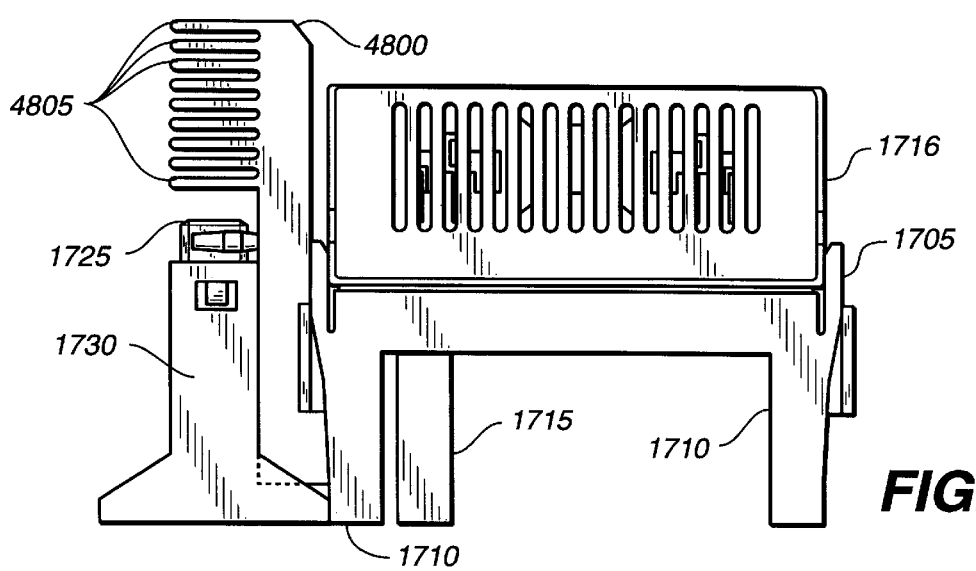
FIG._50

5,870,284

INTEGRATED POWER SUPPLY FRAME INCLUDING INTEGRATED CIRCUIT (IC) MOUNTING AND COOLING

RELATED APPLICATIONS

This is a continuation in part of U.S. patent application Ser. No. 08/840,349, filed on Apr. 28, 1997, which is in turn a continuation in part of U.S. patent application Ser. No. 08/819,529, filed on Mar. 17, 1997.

BACKGROUND OF THE INVENTION

The present invention relates to power supply systems. More specifically, the present invention relates to a power supply mounting system for a high density printed circuit board.

All alternating current (AC) powered electronic equipment contain one or more power supplies to convert the AC input power to various lower direct current (DC) voltages needed by the circuits inside the equipment. In the prior art, a typical connection of power from the power supply to a printed circuit board (PCB) on which various components such as integrated circuits (IC's) are mounted is by a wire harness. One or more PCBs and peripheral devices have power coupled to them in this manner. In today's complex computers, a single large multilayer printed circuit board is usually included, a so-called motherboard, and one or more large IC's including the microprocessor chip and various memory chips are mounted on this motherboard. Use of a wire harness to couple the power supply to a component on the motherboard has severe limitations as there are significant resistive losses and inductive effects in the wires of the wire harness and conductors in the multilayer PCB. As is known in the art, resistive losses are largely determined by the amount of current in a wire or conductor. Similarly, inductive effects are largely determined by the rate at which current through a wire changes and the length of the wire. Accordingly, the resistive losses and inductive effects are significant in a wire or conductor that delivers power to an IC chip or other component that has a high power demand, especially where the active component operates at a low voltage and has a wide ranging and rapidly changing current demand.

Unfortunately, from the perspective of resistive losses and inductive effects, most modem day microprocessors have a high power demand, a low operating voltage, and a wide ranging and rapidly changing current demand. For example, the Intel Pentium Pro microprocessor operates at 3.1 volts and has a current demand that can change from 0 to 11.2 amps in 350 nanoseconds. It is expected that future microprocessors will operate at voltages as low as 1 volt and will have a current demand of up to 80 amps. This will significantly increase resistive losses and inductive effects in wires and conductors connecting the power supply to the microprocessor. As a result of the resistive losses and the inductance of such power coupling wires or conductors, a power supply with a wire harness is not able to deliver an accurately regulated low voltage to components on the motherboard drawing large transient currents.

In addition to having high resistive losses and inductive effects, wire harnesses are difficult to use. Furthermore, the connectors between the wire harnesses and the components often pose reliability concerns.

The above disadvantages of using wire harnesses are well known in the art and have resulted in the use of distributed power systems in some applications. In a distributed power system, a simple AC to DC power supply produces a single voltage output which is distributed around the system. Typically, the power supply produces a bus voltage of 48 volts. This voltage is preferred because it is low enough to ensure compliance with international safety standards, yet high enough to reduce distribution losses which are proportional to the square of the current. However, other bus voltages, such as 24 or 12 volts, are also possible. The distributed power system also includes one or more high density DC to DC converters (i.e., converters that have a high power output per cubic volume of space that they occupy). These high density DC to DC converters are powered by the bus voltage and are placed in close proximity to the high power demand components powered by the power source. The reduced distance between the high power demand components and the adjacent power converter significantly reduces the resistive losses and the inductive effects in the wires and conductors coupling the power converter to the component.

However, fully distributed power systems are not yet cost effective in high volume, low cost systems, such as personal computer systems. Nonetheless, some components in personal computers require a very fast response from the AC-DC or DC-DC converter to which they are coupled. For example, many high performance processor chips used in personal computers require a fast transient current response from a DC to DC converter providing a tightly regulated programmable output from 1.8 to 3.6 volts to the processor chip. The need for precise voltage regulation by such chips requires use of what is known in the art as a voltage regulator module (VRM). A VRM can be either a complete plug-in DC to DC converter or a circuit implemented on the motherboard. The addition of a VRM to a power system increases the cost of the power system by approximately 50%. Additionally, VRMs occupy valuable motherboard area. This is particularly significant when the "wasted" area under the power converter or VRM is, for example, a portion of a 12–14 layer high density, high cost motherboard.

Another disadvantage of prior art power systems, and more particularly the mounting structure of prior art power systems, is that they typically use mounting structures on which one cannot mount both a power supply and an IC chip module such that the power supply and IC chip module are slidably mounted on the mounting structure and releasably locked thereto. As a result, generally the distance between the power supply and the IC chip module is not minimized and consequently the length of connections for supplying power from the power supply to the IC chip module is also not minimized. Consequently, resistive losses and inductive effects in delivering power from the power supply to the IC chip module are not minimized. Additionally, generally separate heatsinks are used to dissipate heat generated by the IC chip module and the power supply.

Another disadvantage of some prior art mounting structure is the fact that they use a heatsink that is not coupled to the frame of the mounting structure and supported thereby to dissipate heat from the IC chip module powered by the power supply mounted on the mounting structure. Instead, a heatsink that is not connected to the frame is disposed over the IC chip module, which necessitates using support frames for the heatsink as its center of gravity is typically not aligned with that of the socket and the IC chip module to which it is thermally coupled to dissipate heat therefrom.

Therefore, it is desirable to tightly regulate the voltage applied to one or more IC chips mounted on a PCB. It is also desirable to reduce resistive losses and inductive effects in delivering power to components on a PCB. It is also desirable to efficiently utilize the surface area of a printed circuit board. It is also desirable to use a mounting structure upon which one can slidably mount both a power supply and a IC chip module such that the power supply and IC chip module are releasably locked onto the mounting structure and the length of the electrical connection between the power supply and the IC chip module are minimized in order to minimize the resistive losses and inductive effects in delivering power from the power supply to the IC chip module. The releasably locking feature of the present invention allows easy mounting and dismounting of the power supply and IC chip module, which facilitates the replacement of the power supply and IC chip module. It is also desirable to use one heatsink to dissipate heat generated by both the IC chip module and the power supply.

SUMMARY OF THE INVENTION

Broadly stated, the present invention encompasses a mounting structure for mounting a power supply and an integrated circuit (IC) chip module on a printed circuit board (PCB), said mounting structure comprising: a frame for accepting said power supply, wherein said power supply is slidably mounted on and releasably locked onto said frame; means for supporting said frame on the PCB, a holder for accepting said IC chip module, said holder being connected to said frame such that the length of connections for providing power from said power supply to said IC chip module is minimized, wherein said IC chip module may be removably inserted into and releasably locked onto said holder such that said IC chip module is thermally coupled to said frame and may be directly coupled to the PCB; and a heatsink coupled to said frame for dissipating heat generated by said power supply and said IC chip module.

The present invention also encompasses a power supply system for supplying power to an IC chip module, said power supply system being mountable on a printed circuit board (PCB) and comprising: a power supply having a first mating connector for delivering power to said IC chip module; and a mounting structure comprising: a frame for accepting said power supply, wherein said power supply is slidably mounted on and releasably locked onto said frame; a holder for accepting said IC chip module, said holder being connected to said frame such that the length of connections for providing power from said power supply to said IC chip module is minimized, wherein said IC chip module may be removably inserted into and releasably locked onto said holder such that said IC chip module may be directly coupled to the PCB; a second mating connector coupled to said frame for mating with said first connector when said power supply is mounted on said mounting structure; and a heatsink coupled to said frame for dissipating heat generated by said power supply and said IC chip module.

In another embodiment, the present invention encompasses a mounting structure for coupling power from a power supply to an IC chip module, in an electrical system having a printed circuit board (PCB) on which at least one integrated circuit (IC) chip module is mounted, said mounting structure comprising: a frame, said frame substantially defining the boundaries of an area on the surface of the PCB; a fastener coupled to said frame for releasably fastening said power supply to said frame such that the power supply is positioned a predefined distance above the upper surface of the PCB; and a heatsink coupled to said frame and disposed above the PCB, said heatsink extending away from said area and coupled to the IC chip module so as to facilitate heat dissipation from the IC chip module.

It is, therefore, an object of the present invention to provide a mounting structure that comprises a frame and a holder for mounting a power supply and an IC chip module, respectively, such that the length of connections for providing power from the power supply to the IC chip module is minimized.

It is also another object of the present invention to slidably mount the power supply on the frame of the mounting structure and to releasably lock the power supply onto the mounting structure to facilitate the mounting and dismounting of the power supply.

It also an object of the present invention to slidably insert the IC chip module into the holder of the mounting structure and to releasably lock the IC chip module onto the mounting structure to facilitate the mounting and dismounting of the IC chip module.

It is also an object of the present invention to provide thermal contact between the IC chip module and the mounting structure. It is also an object of the present invention to provide a mounting structure which comprises a heatsink that dissipates heat from both the power supply and the IC chip module that are mounted on the mounting structure.

It is yet another object of the present invention to provide a mounting structure comprising a heatsink that is coupled to an IC chip module disposed adjacent to the mounting structure to provide thermal coupling between the IC chip module and the heatsink.

It is also an object of the present invention to provide a connector that reduces resistive losses, conduction losses of high frequency components of transient currents and inductive effects.

It is an object of the present invention to provide a mounting structure for a power supply which enables the reduction of resistive losses and inductive effects in delivering power from the power supply to high power demand components, such as a microprocessor IC chip or chips on a motherboard of an electronic system such as a personal computer.

It is also an object of the present invention to tightly regulate the voltage applied to the high power demand components.

These and other objects of the present invention will become apparent to those skilled in the art from the following detailed description of the invention, the accompanying drawings, and the appended claims.

BRIEF DESCRIPTION OF THE DRAWINGS

FIG. 1 is a front perspective view of a power supply placed on a first embodiment of the mounting structure of the present invention.

FIG. 2 is a rear perspective partially exploded, partially cut away view of the mounting structure shown in FIG. 1.

FIGS. 3–6 are partially cut away side views showing the power supply being installed on said first embodiment of the mounting structure of the present invention.

FIG. 7 is a cross sectional view of the power supply mounted on the mounting structure taken along line 7'—7' of FIG. 6.

FIG. 8 is an exploded view of a power supply installed on a second embodiment of the mounting structure of the present invention.

FIG. 9 is a schematic diagram of one embodiment of the coupling of power between the power supply and the motherboard.

FIG. 10 is a schematic diagram of another embodiment of the coupling of power between the power supply and the motherboard.

FIG. 11 is a front perspective view of the first embodiment of the mounting structure of the present invention incorporating a first embodiment of a heatsink.

FIG. 12 is a front perspective view of the first embodiment of the mounting structure of the present invention incorporating a second embodiment of a heatsink.

FIG. 13 is an exploded view of the heatsink in FIG. 12 utilizing heat pipes to transfer heat to a second heatsink.

FIG. 14 is a front partially exploded perspective view of the mounting structure and heatsink combination shown in FIG. 12 incorporating cooling liquid pipes.

FIG. 15 is a front perspective view of an embodiment of the present invention incorporating extended bus bars.

FIG. 16 is a front perspective view of an embodiment of the present invention wherein the power supply is permanently attached to the mounting structure.

FIG. 17 is a front perspective view of another embodiment of the present invention wherein the power supply is electrically coupled to the motherboard via a male connector of the present invention disposed on the side of the mounting frame.

FIG. 18 is a perspective view of the male connector of the present invention shown in FIG. 17.

FIG. 19 is a cross sectional view of the male connector of the present invention taken along line 19'—19' in FIG. 18.

FIG. 20 is a cross sectional view of the male connector of the present invention taken along line 20'—20' in FIG. 18.

FIG. 21 is a cross sectional view of the male connector of the present invention taken along line 21'—21' in FIG. 18.

FIG. 22 is a cross sectional view, such as that shown in FIG. 21, of another embodiment of the male connector of the present invention.

FIG. 23 is a side schematic view of the power supply mounted on a mounting structure according to the present invention.

FIG. 24 is a schematic top view of the connector and the mounting frame of the present invention.

FIG. 25 is a schematic view of a female connector of the present invention.

FIG. 26 is a schematic sectional view of female connector of the present invention taken along line 26'—26' in FIG. 25.

FIG. 27 is a cross sectional view of the female connector of the present invention taken along line 27'—27' in FIG. 25.

FIG. 28 is a schematic diagram of three spring loaded conducting plates and three spring loaded conducting wires disposed on a side wall of the female connector of the present invention.

FIG. 29 is a schematic diagram of a second embodiment of the female connector of the present invention.

FIG. 30 is a graph of the current and voltage input into an IC chip versus time when using prior art power bars to couple power from the power supply to an IC chip.

FIG. 31 is a graph of the current and voltage input into an IC chip versus time when using the conducting plates of the present invention to couple power from the power supply to an IC chip.

FIG. 32 shows a top-front perspective view of another embodiment of the mounting structure of the present invention and of a power supply and an IC chip module to be mounted on the mounting structure.

FIG. 33 shows a detailed perspective view of the mating male connector shown in FIG. 32.

FIG. 34 shows a cross sectional view of a first embodiment of the connection between a PCB and the mating male connector of the present invention, which is coupled to an IC chip module.

FIG. 35 shows a cross sectional view of a second embodiment of the connection between the mating male connector and the PCB.

FIG. 36 shows a front perspective view of an IC chip card which is part of an IC chip module.

FIG. 37 shows a front perspective view of an IC chip module.

FIG. 38 shows a top-front perspective view of the mounting structure shown in FIG. 32 without showing the power supply and the IC chip module mounted thereon.

FIG. 39 shows a top-rear perspective view of a mounting structure with an IC chip module being inserted into the housing of the mounting structure.

FIG. 40 shows a top-front perspective view of a mounting structure with an IC chip module in the housing of the mounting structure.

FIG. 41 shows a perspective view of the interior side of an IC chip module cover.

FIG. 42 shows a partial cross sectional view of a power supply mounted on the mounting structure of the present invention, as well as a cross sectional view of the latching mechanism for releasably locking the power supply to the mounting structure.

FIG. 43 shows a perspective view of the latching mechanism shown in FIG. 42.

FIG. 44 shows a bottom-rear perspective view of a power supply that is mountable on the mounting structure of the present invention.

FIG. 45 shows a bottom-rear perspective view of the mounting structure of the present invention with the IC chip module in the housing of the mounting structure.

FIG. 46 shows a top-rear perspective view of a mounting structure of the present invention with a liquid cooling system.

FIG. 47 shows a rear-bottom perspective view of a mounting structure of the present invention using a forced air heat dissipation system.

FIG. 48 shows a side perspective view of the mounting structure, power supply and IC chip module shown in FIG. 17, as well as a heatsink coupled to the IC chip module.

FIG. 49 shows a top view of the power system shown in FIG. 48.

FIG. 50 shows a front view of the power system shown in FIG. 48.

DETAILED DESCRIPTION OF THE INVENTION

FIG. 1 shows a front perspective view of a power supply installed on a first embodiment of a mounting structure of the present invention. As shown in FIG. 1, a mounting structure 105 according to the present invention comprises four legs 110, a frame 115 coupled to the legs 110 and power buses 120 extending from frame 115 to a printed circuit motherboard 125. In a preferred embodiment, each of legs 110 has a longitudinal axis that is substantially perpendicular to the upper surface of motherboard 125. In a preferred embodiment of the present invention, power buses 120 are also substantially perpendicular to the upper surface of motherboard 125 and are inserted into couplers 130 in motherboard 125 and soldered to couplers 130. It is to be noted that some of the power buses 120 may be used to send control signals from the motherboard to the power supply. In another embodiment, the power buses can be directly soldered into the motherboard, in which case there would be no need for couplers 130. A power supply 140 is shown installed on mounting structure 105. Power supply 140 may be an AC to DC converter or a DC to DC converter. Power supply 140 receives input power from a source coupled to power supply 140 via socket 142, which for an AC input is preferably an IEC 320 socket with a separate standard AC cable, and outputs power to electrical components, such as IC chip 136, mounted on motherboard 125. Power supply 140 also outputs power via a coupling cable 141, which is preferably a group of output cables for coupling power to various peripherals (not shown). These electrical components may include one or more microprocessors or other electronic circuit components coupled to the motherboard. In one embodiment of the present invention, one or more IC chips, such as IC chip 136, may be disposed on the motherboard under the power supply 140 in an area adjacent to power buses 120 and couplers 130. IC chip 136 may be a microprocessor such as an Intel Pentium Pro or any other high power demand microprocessor. Power buses 120 conduct power from power supply 140 to IC chip 136 on motherboard 125. Power buses 120 may also provide mechanical support for mounting structure 105. It is to be noted that IC chip 136 is placed adjacent power buses 120 and couplers 130 so as to minimize the length of the power conductors and the adjacent power buses 120 between power supply 140 and IC chip 136. Reducing the length of these power lines reduces the resistive losses and the inductive effects in the power lines and, therefore, improves the voltage regulation and the efficiency with which power is delivered to the IC chip or chips on the motherboard. Delivering power to IC chip 136 efficiently and within a narrow voltage band specification under all chip operating conditions is particularly important when the IC chip has a rapidly changing high power demand, i.e., it draws a significant amount of current at a low voltage and/or the amount of current it draws varies rapidly within a very short period of time.

In addition to reducing resistive losses and inductive effects, the mounting structure 105 of the present invention allows more efficient use of the surface area of the motherboard 125 because it permits placement of high power demand components, such as IC chip 136, in an area of the motherboard either beneath or adjacent to power supply 140. The efficient use of the surface area of the motherboard to carry high cost, high density semiconductor ICs is particularly significant when, as in a preferred embodiment of the present invention, motherboard 125 is a multilayer high density motherboard. It is to be noted that motherboard 125 need not be a multilayer high density motherboard and may be any type of printed circuit board. Similarly, it is to be noted that the high power demand components are not restricted to being ICs and may be any other type of high power demand component.

Although, in a preferred embodiment, one or more IC chips are positioned under the power supply 140, placing an IC chip under the power supply is not necessary for deriving the benefits of reduced resistive losses and inductive effects (and the consequent tightly regulated voltage application to the IC chip(s)) provided by the mounting structure of the present invention. The important factor for deriving the benefits of reduced resistive losses and inductive effects is the proximity between the IC chip and the area where the power buses 120 are electrically connected to the motherboard. Thus, for example, placing an IC chip on or near an area adjacent to power buses 120 and couplers 130, such as the area outlined by dashed rectangle 135, which is not under power supply 140, will still provide the benefits of lower resistive losses and inductive effects provided by the mounting structure of the present invention. As shown in FIG. 17 and described below, the IC chip may also be placed on the side of the mounting structure.

Additionally, while legs 110 are for supporting the mounting structure on the motherboard, they may also serve other purposes. For example, the front legs 110, i.e., the legs closer to power buses 120, may comprise conductors that are used to deliver power from the power supply to the motherboard and the electronic components disposed thereon. Thus, in one embodiment of the present invention, the front legs 110 may comprise power buses 120, so as to electrically couple the power supply to the motherboard and the electronic components disposed thereon. In a preferred embodiment of the present invention wherein such conductive legs 110 are used, they would preferably be encased in an insulating material.

FIG. 2 shows a rear perspective view of the mounting structure 105 shown in FIG. 1 with the power supply 140 removed. FIG. 2 also shows IC chip 136 disposed on the motherboard adjacent power buses 120 and couplers 130. Mounting structure 105 comprises a frame 115 and a plurality of legs 110 attached to frame 115 for supporting frame 115 on motherboard 125. As shown in FIG. 2, the ends of legs 110 opposite frame 115 are attached to motherboard 125. Mounting structure 115 further comprises means for releasably fastening a power supply to frame 115 such that the power supply is positioned a predefined distance above the upper surface of the motherboard. Frame 115 of mounting structure 105 includes horizontal segment 200, whose longitudinal axis is parallel to the upper surface of motherboard 125. Horizontal segment 200 includes a plurality of sockets 205 which are disposed on its upper surface. Power pins from the power supply are inserted into sockets 205 when the power supply is mounted on the mounting structure 105 to allow power from the power supply to be coupled to the motherboard via power buses 120. The fastener means includes a pair of pivoting hooks 215 located near the rear end of frame 115. Fastener means also preferably includes a pair of spring loaded locking mechanisms 220 near the front end of frame 115. Each spring loaded locking mechanism 220 comprises a sliding hook 221, a spring compression tab 222, a spring 223 and a release tab 224 for unlocking spring loaded locking mechanism 220.

FIGS. 3–6 are partially cut away side views which together illustrate installation of a power supply on mounting structure 105 according to the present invention. In FIG. 3–6, the encircled numbers 1–5 indicate sequential steps in the installation of power supply 140 on the mounting structure 105. In step one, shown in FIG. 3, power supply 140 is pushed back in the direction shown by the arrow 351 as pivoting hooks 215 are inserted into corresponding apertures at the back end of power supply 140. As pivoting hooks 215 are inserted into corresponding apertures in power supply 140, overextending portions 315 of hooks 215 slide over plate 340. Once pivoting hooks 215 are sufficiently inserted into the corresponding apertures and overextending portions 315 sufficiently cover plate 340, power supply 140 is preferably pivoted upward in the direction shown by arrow 352. As shown in FIG. 4, as pivoting hooks 215 are further inserted into said corresponding apertures, pivoting hooks 215 are further pivoted upward and overextending portions 315 further cover plate 340. Then power supply 140 is pivoted downward in the direction shown by arrow 453. Subsequently, as shown in FIG. 5, the front portion of power supply 140 is lowered onto sliding hook 221 of the locking mechanism 220. As shown in FIG. 5, plate 340 rests on hook 221. The weight of the power supply 140 and any additional downward force applied thereto causes sliding hook 221 to be pushed back in the direction of arrow 554 by plate 340. As sliding hook 221 is moved in the direction of arrow 554, power supply 140 is lowered further downward until the lower surface of power supply 140 is in full contact with the horizontal surface 211 (shown in FIG. 2) of the frame member 210. As power supply 140 is fully lowered, as shown in FIG. 6, spring 223 causes the sliding hook 221 to slide back in the direction opposite to that shown by arrow 454. On each side of power supply 140, the overextending portions 315 and 321 of hooks 215 and 221, respectively, rest on the back and front ends, respectively, of plate 340 in power supply 140. This locks power supply 140 onto the frame 115 and consequently mounting structure 105. In a preferred embodiment of the present invention, a pair of rails positioned along the sides of an extruded power supply casing are used instead of plate 340 to achieve the above locking effect.

Spring loaded locking mechanism 220 thus secures power supply 140 to frame 115 and mounting structure 105 and ensures sufficient pressure for electrical contact between power pins coupled to power supply 140 and sockets 205 on horizontal segment 200. To remove power supply 140, release tabs 224 are moved towards the front end 650 of mounting structure 105, which causes overextending portion 321 to be moved away from plate 340, thus releasing the front end of power supply 140 and enabling its removal from mounting structure 105 in a manner that is the reverse of what is shown in FIGS. 3–6.

Mounting structure 105 allows easy installation and removal of a power supply. Additionally, mounting structure 105 is not specific to any particular power supply. Therefore, mounting structure 105 may be used with any power supply having a frame adapted to snap onto mounting structure 105. This allows mounting structure 105 to be used with a variety of power supplies. It further facilitates the installation of a power supply upgrade or replacement. This is useful since a new, more high powered microprocessor IC chip may be installed on the motherboard, and may have different power requirements than the IC chip being replaced. In other words, since the replacement of the power supply is facilitated, the replacement of an IC chip with a new IC chip of higher power, or other different power needs, is easily accommodated.

FIG. 7 shows a cross sectional view of power supply 140 mounted on mounting structure 105 along line 7'—7' in FIG. 6. As shown in FIG. 7, overextending portions 315 of hooks 215 help secure plate 340 to frame 115.

FIG. 8 shows an exploded perspective view of a second embodiment of a mounting structure of the present invention. As shown in FIG. 8, mounting structure 805 is fastened to motherboard 825 by screws 820. Power supply 840 is affixed to mounting structure 805 by clips 818. Mounting structure 805 includes a plurality of legs 810 for supporting the mounting structure 805. A pair of frame members 815 are coupled to the legs 810. Frame members 815 each have a longitudinal axis that is parallel to the upper surface of motherboard 825. Furthermore, to increase rigidity, mounting structure 805 may include a support bar 816 connected between legs 810 at the front end of mounting structure 805, as shown. The lower surface of support bar 816 is preferably in direct contact with the upper surface of motherboard 825 while its upper surface has a plurality of sockets 817 disposed thereon. A plurality of power buses 845 are disposed on the bottom of power supply 840 and are inserted into sockets 817 so as to electrically couple power supply 840 to motherboard 825 and electrical components disposed thereon. It is to be noted that, whereas in mounting structure 105, the power buses are part of the mounting structure, mounting structure 805 does not include power buses. Frame members 815 each include two clips 818 disposed thereon. A ridge 819 in each clip 818 is inserted into a groove 842 on the side of power supply 840 so as to releasably fasten power supply 840 to mounting structure 805. As also shown in FIG. 8, a heatsink 830 is disposed above an IC chip (not shown) coupled to the motherboard. Heatsink 830 dissipates heat generated by the IC chip. It may also help dissipate heat generated by power supply 840. The IC chip disposed below heatsink 830 is powered by power supply 840 via power buses 845. The IC chip is disposed adjacent to the power buses. More specifically, the area on the motherboard where the power buses 845 or sockets 817 are electrically coupled to the motherboard is as close to the IC chip as possible such that resistive losses and inductive effects in delivering power to the IC chip are minimized.

FIG. 9 shows a schematic diagram of one embodiment of the coupling between a power supply and a motherboard. As shown in FIG. 9, power supply 940 is disposed above mounting structure 905, which is in turn disposed on motherboard 925. Mounting structure 905 comprises legs 910 and support bar 916 coupled to legs 910. Power buses 920 coupled to the bottom of power supply 940 are inserted into corresponding sockets on support bar 916. Power from the power supply 940 is coupled to motherboard 925 via power buses 920 and conductors (not shown) in support bar 916. Also shown in FIG. 9 are connectors 960 and 961 coupled to support bar 916 and power supply 940, respectively. It is to be noted that, in a preferred embodiment of the present invention, only one of connectors 960 and 961 is coupled to mounting structure 905. It is also to be noted that both connectors 960 and 961 are shown in FIG. 9 to demonstrate the alternative sites for coupling connectors. In a preferred embodiment, connectors 960 and 961 are conventional female sockets. Connector 960 is electrically coupled to the power supply 940 via power buses 920 and conductors (not shown) in support bar 916 while connector 961 is directly electrically coupled to power supply 940. It is to be noted that connectors 960 and 961 need not be female sockets but may be any type of connector. Connectors 960 and 961 enable power to be coupled to one or more peripheral devices, such as peripheral devices 1 and 2, from power supply 940.

FIG. 10 shows a schematic diagram of another embodiment of the coupling between power supply 1040 and motherboard 1025. In the embodiment shown in FIG. 10, there is no support bar 916. Instead, power buses 1020 are coupled to motherboard 1025 by couplers 1030 on motherboard 1025. As in FIG. 9, a connector 1061 enables power supply 1040 to provide power to one or more peripheral devices (not shown) in addition to providing power to motherboard 1025.

FIG. 11 is a front perspective view of the mounting structure shown in FIG. 1 incorporating an integral heatsink. As shown in FIG. 11, mounting structure 105 includes a heatsink 1100. Vanes 1105 are shown by dashed lines to emphasize that they are behind horizontal segment 200 in the view shown in FIG. 11. Also shown in FIG. 11 are sockets 205. Unlike in FIG. 2, not all the sockets on horizontal segments 200 are shown so as not to unduly obscure the view of vanes 1105 in the mounting structure of FIG. 11. Heatsink 1100 is integral with mounting structure 105 and includes vanes 1105 to increase heat dissipation from heatsink 1100. It is to be noted that heatsink 1100 need not be integral with mounting structure 105, but may in some embodiments be coupled to mounting structure 105. Heat sink 1100 dissipates heat generated by the power supply disposed above heatsink 1100. In a preferred embodiment, heatsink 1100 is made of aluminum. It is to be noted that heatsink 1100 may be made of any other material suitable for heat dissipation.

FIG. 12 is a front perspective view of the mounting structure shown in FIG. 1 incorporating a second heatsink. Heatsink 1200 is integral with mounting structure 105. In another embodiment of the present invention, heatsink 1200 may be snapped onto mounting structure 105 in a conventional manner rather than being integral therewith.

FIG. 13 shows an exploded view of heatsink 1200 shown in FIG. 12 attached to a second heatsink. As shown in FIG. 13, heatsink 1200 includes a plurality of heat pipes 1305 coupled to a heat plate 1310. Additionally heat pipes 1305 are coupled to a second heatsink 1315. Heatsink 1315 is coupled to the back of the PC chassis (not shown). In a preferred embodiment, heat plate 1310 and heatsink 1315 are all made of aluminum, but may be made of any other material suitable for heat dissipation. Heat pipes 1305 may comprise Noren Mini Flats (available from Noren Products, Inc.) or equivalent heat transfer devices. Power supply 140 is shown in phantom.

FIG. 14 is a partially exploded view of the mounting structure and heatsink of the type shown in FIG. 12 further incorporating cooling liquid pipes 1400. Also shown in FIG. 14 are power supply 140 and motherboard 125. Cooling liquid is injected into cooling liquid pipes 1400 at entrance 1405. As the cooling liquid passes through cooling liquid pipes 1400, heat from heatsink 1200 is transferred to the cooling liquid. Thus, when the cooling liquid exits the cooling pipes 1400 at exit 1410, the temperature of the cooling liquid is higher than it was when the cooling liquid entered cooling pipes 1400. The cooling liquid, therefore, removes heat from heatsink 1200. In a preferred embodiment of the present invention, the cooling liquid is water. It is to be noted that other cooling liquids may be used to remove heat from heatsink 1200.

In one embodiment of the present invention, the power supply can incorporate a fan which cools components mounted on the motherboard and under the mounting structure.

FIG. 15 shows power supply 140 mounted on mounting structure 105. Also shown in FIG. 15 are bus bars 1500 which deliver power to devices located on motherboard 125. Vertical portions 1505 of bus bars 1500 extend downward along legs 110 of mounting structure 105 and couple power from power supply 140 to the horizontal portions 1510 of bus bars 1500. Horizontal portions 1510 are supported on motherboard 125 by stands 1515. In a preferred embodiment of the present invention, horizontal portions 1510 run above motherboard 1525 such that there is sufficient clearance between horizontal portions 1510 and motherboard 1525 to allow electronic devices to be located on the surface of motherboard 125 in areas underneath horizontal portions 1510. Also shown in FIG. 15 are power tabs 1520 for delivering power from the bus bars 1500 to a device to be powered by bus bars 1500. Stands 1515 are conductive and allow power to be delivered from bus bars 1500 to motherboard 125 with negligible resistive losses.

FIG. 16 shows a front perspective view of an embodiment of the present invention wherein mounting structure 1605 is integral with or otherwise permanently affixed to power supply 1640. As mounting structure 1605 is integral with power supply 1640, it does not comprise release tabs 224 (shown in FIG. 1 and referenced in FIG. 2) to unlock the power supply from the mounting frame. The elements of the integral mounting structure-power supply combination (power supply system) 1600 of FIG. 16 are referenced with the same numbers and serve the same purpose as their corresponding components in FIG. 15. As those components have been described in relation to FIG. 15, they will not be further described herein.

FIG. 17 is a front perspective view of another embodiment of the present invention wherein the power supply is electrically coupled to the motherboard via a connector of the present invention disposed on the side of the mounting structure. As shown in FIG. 17, mounting structure 1700 comprises mounting frame 1705, legs 1710, and male connector 1715. In the embodiment shown in FIG. 17, male connector 1715, in conjunction with the female connector, which is coupled to power supply 1716 and shown schematically in FIGS. 23–29, acts as a power bus for coupling the power supply 1716 to motherboard 1717.

As can be seen in FIG. 17, unlike the power buses in the other embodiments which were disposed adjacent and parallel to the front horizontal bar, such as horizontal bar 1720 in FIG. 17, of the mounting frame, connector 1715 is preferably disposed adjacent and parallel to a side bar 1721 of mounting frame 1705. This allows the longitudinal plane 1750, shown in phantom, of male connector 1715 to be perpendicular to the axis of rotation 1760, also shown in phantom, of power supply 1716. It is to be noted that longitudinal plane 1750 is also the longitudinal plane of the female connector. It is also to be noted that the male and female connectors contact along the surface of conduction plates of the male connector which are more clearly shown in FIG. 18 and are parallel to the longitudinal plane 1750, as explained in the description of FIG. 24.

FIG. 23 shows a side schematic view of power supply 1716 mounted on mounting structure 1700. Power supply 1716 includes female connector 2300. As power supply 1716 is rotated downwards in the direction of arrow 1755, the axis of rotation of power supply 1716 is a line passing through point 1761 and perpendicular to the plane of the paper upon which FIG. 23 is shown. The longitudinal axis of male connector 1715 and female connector 2300 is parallel to the plane of the paper. Therefore, the axis of rotation of the power supply is perpendicular to the longitudinal plane of male connector 1715 and female connector 2300.

In a preferred embodiment of the present invention, the length, $L_F$, of female connector 2300 is greater than the length, $L_M$, of male connector 1715 so as to enable female connector 2300 to mate with male connector 1715 as female connector is rotated downward onto male connector 1715. The difference between $L_F$ and $L_M$ is a function of the distance, $D_F$, from point 1761 on the axis of rotation to female connector 2300, the length, $L_M$, and the height, $H_F$, of female connector 2300 and the height of the insulation layer, $H_I$. In another embodiment of the present invention, such as that shown in FIG. 29, where the female connector does not comprise end walls, $L_F$ need not be greater than $L_M$ since the ends of the female connector 2300 are open.

When the male and female connectors mate, they contact on the surface of the conduction plates. Thus, the longitudinal planes of contact between the male and female connectors are defined by the planes on the outer surface of the conduction plates and are parallel to longitudinal plane 1750. FIG. 24 is a schematic top view of the connector and the mounting frame of the present invention. Conductors 2400 of female connector 2300 contact the first conducting plates 1820, 1825, 1830 and 1835 and low current supply pins 1840 at a first contact plane. The first contact plane contains line 2405 and is perpendicular to the plane of the paper upon which FIG. 24 is shown. Similarly, conductors 2400 of female connector 2300 contact conducting plates 1845 and 1850 and low current return pins 1855 at a second contact plane. The second contact plane contains line 2410 and is perpendicular to the plane of the paper upon which FIG. 24 is shown. Similarly, longitudinal plane 1750, which is the longitudinal plane of male connector 1715 and female connector 2300, contains line 1751 and is perpendicular to the plane of the paper upon which FIG. 24 is shown. Therefore, the contact planes and the longitudinal plane are all perpendicular to the plane of the paper and are parallel to each other. Additionally, the contact planes and the longitudinal plane are perpendicular, rather than parallel, to the axis of rotation 1760 of the power supply. The fact that the contact planes comprising lines 2405 and 2410 are perpendicular to the axis of rotation 1760 reduces the possibility of misalignment between conductors 2400 of female connector 2300 and the conducting plates and control pins of male connector 1715.

Additionally, referring again to FIG. 17, the placement of connector 1715 along the side bar 1721 allows minimizing the distance between the area where the connector is connected to motherboard 1717, i.e., the area on motherboard 1717 under connector 1715, and IC chip 1725 which is placed on socket 1730. The minimization of the distance between the footprints of connector 1715 and IC chip 1725 reduces resistive losses and inductive effects in coupling the connector to the IC chip. In the embodiment shown in FIG. 17, conductors (not shown) within socket 1730 deliver power from buses on or in motherboard 1717 to IC chip 1725. In another embodiment, pins from the IC chip are directly connected to the buses in the motherboard. Also shown in FIG. 17 are standard sockets 1740 for coupling peripheral devices to motherboard 1717.

FIG. 18 is a perspective view of male connector 1715 in FIG. 17. As can be seen in FIG. 18, male connector 1715 comprises pins 1805, body portion 1810, insulation layer 1815, high current/low voltage supply plate 1820, medium current/medium voltage supply plates 1825, 1830 and 1835, low current supply pins 1840, high current/low voltage return plate 1845, medium current/medium voltage return plate 1850 and low current return pins 1855. Low current supply pins 1840 are control pins which transfer control signals between the power supply and the motherboard whereas low current return pins 1855 are control return pins that supply a ground reference signal. In a preferred embodiment of the present invention, plate 1820 supplies current at a voltage of 1.8 to 2.8 V whereas plates 1825 and 1830 supply current at voltages of 3.3 V and 5 V, respectively. Pins 1805 are for coupling male connector 1715 to the motherboard. Pins 1805 extend out from the bottom of body portion 1810 a predetermined amount so as to enable seating of pins 1805 in corresponding pinholes on the motherboard. In one embodiment of the present invention, male connector 1715 is coupled to the motherboard by soldering pins 1805 to the motherboard. In another embodiment, male connector 1715 may be coupled to the motherboard by simply inserting pins 1805 into corresponding spring loaded pinholes in the motherboard. In another embodiment, the pins coupled to a conducting plate, such as conducting plates 1845 and 1850 may be replaced by tongues protruding out of body portion 1810 a predetermined amount to enable seating the tongues into corresponding slots on the motherboard. FIG. 22 shows a cross sectional view of an embodiment of the male connector of the present invention wherein pins 1805 coupled to conduction plates 1845 and 1850 are replaced by tongues 1806 and 1807, respectively. Body portion 1810 is for supporting conductors (shown in FIGS. 20–22) inside the male connector 1715 whereas insulation layer 1815 supports the conductors disposed on the sides of insulation layer 1815, such as plates 1820, 1825, 1830, 1835, 1845, 1850 and pins 1840, 1855. As can be seen in FIG. 18, the power supply plates and their corresponding return plates are disposed on opposite sides of insulation layer 1815 and are parallel to each other. Thus, for example, high current/low voltage supply plate 1820, which may be used to supply current to a high current demand IC chip such as a central processing unit (CPU), is disposed on a first side 1816 of insulation layer 1815 whereas high current/low voltage return plate 1845, which may be used as a CPU return plate, is disposed on a second side 1817 of insulation layer 1815. Additionally, plates 1820 and 1845 are parallel to each other. Similarly, plates 1825, 1830 and 1835 are disposed on first side 1816 of insulation layer 1815 whereas plate 1845 is disposed on second side 1817 of insulation layer 1815 and is parallel to plates 1825, 1830 and 1835. It is to be noted that the top portion of the conducting plates above are disposed on the sides of insulating layer 1815 whereas the bottom portion of the conducting plates are inside body portion 1810. Thus, for example, top portions 1846 and 1851 of plates 1845 and 1850, respectively, are disposed on the second side 1817 of insulating layer 1815. Finally pins 1840 and 1855, which are parallel to each other are disposed on the first side 1816 and second side 1817 of insulation layer 1815, respectively.

FIG. 21 is a cross sectional view of male connector 1715 taken along line 21'—21' in FIG. 18. As shown in FIG. 21, bottom portions 1822 and 1847 of plates 1820 and 1845, respectively, extend through the entire length, L, of body portion 1810 whereas the top portions 1821 and 1846 of plates 1820 and 1845, respectively, are disposed on different sides of insulating layer 1815. Similarly, FIG. 20, which shows a cross sectional view of male connector 1715 taken along line 20'—20' of FIG. 18, shows the bottom portions 1847 and 1852 of plates 1845 and 1850, respectively, inside body portion 1810. FIG. 20 also shows that bottom portions 1847 and 1852 of plates 1845 and 1850, respectively, extend through the length, L, of body portion 1810. Similarly, FIG. 20 shows pins 1855, more specifically the bottom portion of pins 1855 extending through the length, L, of body portion 1810. Finally, as shown in FIG. 20, the bottom portion of control pins 1855 protrude outside body portion 1810. The portion of control pins 1855 outside body portion 1810 is represented by pins 1805. Similarly, additional pins 1805 are shown protruding outside body portion 1810 and coupled to the bottom of bottom portions 1847 and 1852 of plates 1845 and 1850, respectively.

As can been seen in FIG. 18, the power supply plates 1845 and 1850 have a large surface area. This large surface area is important to ensure low loss conduction of high frequency components of the transient currents which only flow on the surface of the conductor, a process commonly referred to as the skin effect. Therefore, the connector of the present invention has a lower conduction loss of high frequency current components as compared to conductors having a lower surface area, such as conventional power pins.

Similarly, as can been seen in FIG. 19, which is a cross sectional view of the connector taken along line 19'—19' in FIG. 18, the conduction plates in connector 1715 have a large cross sectional area. The large cross sectional area is important for the reduction of DC resistance in the conduction plates. Finally, the insulation layer, that separates the conductors disposed parallel to each other on its first and second sides, is relatively thin. This results in a very low characteristic inductance similar to a transmission line.

In a preferred embodiment, insulation layers 1815 is made of a molded plastic material and separates the conductors disposed thereon. Similarly, body portion 1810 is made of a molded plastic material so as to electrically isolate the conducting plates and pins disposed therein. Other insulating materials such as BAKELITE or a high temperature thermo setting polymer may also be used as an insulating material in body portion 1810 and insulating layer 1815. In a preferred embodiment of the present invention, the insulating material is chosen to have specific dielectric characteristics in order to control the impedance of the connector, which acts as a transmission line between the power supply and the motherboard. Similarly, in a preferred embodiment, the conductors disposed on and inside the insulating materials are tin plated copper. In another embodiment, gold plated conductors may be used instead of tin plated copper, again particulary in hostile environments, such as those having a high humidity, corrosiveness and temperature.

In another embodiment of the present invention, the width and separation of the conductors in the male connector of the present invention are adjusted to match the impedance of the connector (acting as a transmission line) to the source and/or the load to optimize the efficiency and transient response in delivering power to the load.

FIG. 25 shows a schematic view of a female connector 2300 of the present invention. In a preferred embodiment of the present invention, the female connector is coupled to the bottom of the power supply frame. As shown in FIG. 25, female connector 2300 comprises a body 2500 having a slot 2510 formed therein, the opening of which is shown by rectangle 2505, which is shown in phantom.

FIG. 26 shows a schematic sectional view of female connector 2300 taken along line 26'—26' in FIG. 25. As shown in FIG. 26, body 2500 comprises two end walls 2501 and top wall 2502, which collectively enclose slot 2510 from three sides. Also shown in FIG. 26 are schematic representations of conductors 2515, which include conducting plates 2520 and conducting wires 2525.

Similarly, FIG. 27 shows a cross sectional view of female connector 2300 taken along line 27'—27'. FIG. 27 shows side walls 2503 and top wall 2505. The two side walls 2502, the two end walls 2501 and top wall 2503 collectively enclose slot 2510 on five sides. Slot 2510 is sized to enable the top portion of plates and the insulating layer of the male connector to be releasably contained in slot 2510 when the male and female connectors are joined together. FIG. 27 also shows conductors 2515 disposed on side walls 2503 within slot 2510. Finally, FIG. 27 shows wires 2516 coupled to conductors 2515. Wires 2516 couple conductors 2515 to the power supply to which female connector 2300 is coupled. Conductors 2515 may be spring loaded conducting plates or spring loaded wires. Conductors 2515 are spring loaded so as to improve the contact between conductors 2515 and the corresponding conducting plates and pins of male connector 1715. In one embodiment, female connector 2300 of the present invention comprises a plurality of spring loaded conducting plates for contacting the conducting plates of male connector 1715, such that there is a one to one correspondence between the spring loaded conducting plates of female connector 2300 and conducting plates of male connector 1715. In another embodiment, a plurality of spring loaded conducting wires correspond to each of the conducting plates of male connector 1715. Similarly, female connector 2300 comprises spring loaded wires for connecting to the low current supply pins 1840 and the low current supply return pins 1855. FIG. 28 shows a schematic diagram of three spring loaded conducting plates 2805 and three spring loaded conducting wires disposed on a side wall 2503 of female connector 2300. The conductors 2805 and 2810, in FIG. 28 are coupled to the power supply by wires 2815 or some other suitable conductor.

In the embodiment shown in FIG. 25, body 2500 has end portions 2501 that enclose slot 2510 on two sides. In another embodiment of the female connector of the present invention, shown in FIG. 29, body 2905 of female connector 2900 does not comprise end walls. Instead, it comprises top wall 2902 and two side walls 2903. In female connector 2900, slot 2910 is not enclosed on five sides but only three. Therefore, unlike in the embodiment having end walls, the length, $L_S$, of slot 2505 need not be greater than the length of the male connector in order to allow mating between the male and female connectors.

Body 2500 of female connector 2300 is made of an insulating material, such as molded plastic, BAKELITE or a high temperature thermo setting polymer. In a preferred embodiment, the insulating layer is chosen to have specific dielectric characteristics in order to control the impedance of the connector. Conductors 2915 may be tin plated copper, a gold plated conductor, or some other suitable conductor.

FIG. 30 shows a graph of the current and voltage input into an IC chip versus time when using power bars (round conductors) of the prior art to couple power from the power supply to the IC chip. In FIG. 30, graphs 3000 and 3005 represent the current input into the IC chip and the voltage of the IC chip, respectively, versus time. FIG. 31 shows a graph of the current and voltage input into an IC chip versus time when using conducting plates of the connector of the present invention to couple power from the power supply to the IC chip. In FIG. 31, graphs 3100 and 3105 represent the current input into the IC chip and the voltage of the IC chip, respectively, versus time. As seen in FIGS. 30 and 31, the voltage of the IC chip, particularly the transient voltage, is substantially lower when conducting plates rather than power bars are used. Computer simulations indicate that the use of conducting plates of the present invention instead of power bars or wires reduces inductance in the path to the IC chip by a factor of five from 60 nH to 12 nH. Thus, the conducting plates of the present invention provide a significant improvement over power bars or wires in regulating voltage at a high current demand IC chip such as a CPU.

FIG. 32 shows a top-front perspective view of another embodiment of the mounting structure of the present invention and of a power supply 3250 and an IC chip module 3260 to be mounted on the mounting structure. In a preferred embodiment power supply 3250 is an AC to DC power converter with multiple DC outputs. However, power supply 3250 may be any type of power converter. Mounting structure 3200 comprises frame 3205 and holder 3210 connected to and integral with frame 3205. Mounting structure 3200 also comprises mating male connector 3215 disposed on frame 3205. Mating male connector 3215 is designed to mate with a corresponding mating female connector (not shown in FIG. 32, but schematically shown in FIGS. 25 to 29) coupled to power supply 3250 when the power supply 3250 is fully mounted on the mounting structure 3200. Mounting structure 3200 also comprises legs 3315 for supporting mounting structure 3200 and components thereof on a PCB. Legs 3315 are attached to the mounting structure at one end and to the PCB at the other end. Power supply 3250 is slidably mounted on mounting structure by aligning rails 3255, which are disposed on the sides of power supply 3250, with the corresponding grooves 3256 which are located on the interior side of side panels 3206 of frame 3205, inserting rails 3255 into grooves 3256 and sliding power supply 3250 towards the front of the mounting structure 3200, i.e., the side of the mounting structure where holder 3210 is located. When power supply 3250 is slid sufficiently far in the direction of holder 3210, it is releasably locked onto frame 3205 as latches (shown in FIGS. 38–40, 42, 43 and 46) on frame 3205 are inserted into corresponding slots (shown in FIGS. 42 and 44) disposed on the base of power supply 3250. IC chip module 3260 is inserted into holder 3210 by aligning IC chip module 3260 with the corresponding aperture 3211 of holder 3210 and slidably inserting IC chip module 3260 downwards into the aperture 3211 of holder 3210. As IC chip module 3260 is inserted into holder 3210, latches 3261 on the sides of IC chip module 3260 are inserted into corresponding slots 3212 on the sides of holder 3210 and releasably lock IC chip module 3260 to holder 3210. When inserted into holder 3210, IC chip module 3260 is thermally coupled to frame 3205 to facilitate heat transfer from IC chip module 3260 to mounting structure 3200 and the heatsink thereof More specifically, IC chip module 3260 is coupled to vertical heat conducting plate 3280, which is coupled to frame 3205 and preferably integral therewith. IC chip module 3260 may be released from holder 3210 and removed therefrom by first pushing handles 3262 towards the center of IC chip module 3260 to push latches 3261 towards the center of IC chip module 3261 and thereafter moving IC chip module 3260 upward while holding handles 3262 in the pushed position until they are no longer in slots 3212. The fact that power supply 3250 and IC chip module 3260 are releasably locked onto mounting structure 3200 allows easily mounting and dismounting power supply 3250 and IC chip module 3260 which facilitates replacement of IC chip module 3260 and power supply 3250.

It is to be noted that even though the preferred embodiment of the present invention is described as having mating male connector 3215 disposed on frame 3205 with the corresponding mating female connector (not shown) coupled to power supply 3250, in another embodiment of the present invention, the mating female connector may be disposed on the frame while the corresponding mating male connector may be coupled to the power supply. It is also to be noted that, although the preferred embodiment of the present invention is described as having rails 3255 on power supply 3250 inserted into corresponding grooves 3256 on the frame, in another embodiment of the present invention, the grooves may be on the power supply while the corresponding rails are on the frame.

FIG. 33 shows a detailed perspective view of mating male connector 3215 show in FIG. 32. Mating male connector 3215 comprises an insulating body 3305, conducting plates 3321, 3322, 3323 and 3324, and conducting pins 3325. Body 3305 preferably comprises molded plastic material so as to electrically isolate the conducting plates and pins disposed therein. Other insulating materials, such as BAKELITE or a high temperature thermo setting polymer, may also be used as an insulating material in body 3305. Plates 3321, 3322, 3323 and 3324 are high current/low voltage supply plates preferably supplying high currents at 1.8 to 2.8 volts, 3.3 volts, 5 volts, and 12 volts, respectively. Pins 3325 are for transferring control signals from the power supply to the PCB. Mating male connector 3215 also comprises return plate 3326 disposed on the opposite side of plates 3321, 3322, 3323 and 3324 and pins 3325. One portion of each of conducting plates 3321, 3322, 3323 and 3324 is on the upper surface of body 3305, another portion extends through body 3305, while a third portion projects outside body 3305 for insertion into the PCB upon which the mounting structure containing mating male connector 3215 is placed. Mating male connector 3215 also comprises plates 3340, 3341 and 3342 and slots 3330, 3331 and 3332 which are disposed above plates 3340, 3341 and 3342, respectively. In a preferred embodiment, plate 3340 is a ground plate while plates 3341 and 3342 are respectively coupled to plates 3321 and 3322. Upon insertion of the IC chip module into the holder of the mounting structure, conducting plates on the IC chip module are inserted into slots 3330, 3331 and 3332 and contact plates 3340, 3341 and 3342, respectively, thus allowing the IC chip module to be electrically coupled to the power supply in a manner that does not necessitate coupling the IC chip module to the PCB. As a result, power may be supplied from the power supply to the IC chip module without first passing through the PCB. As a result of the proximity of the IC chip module and the power supply, which are mounted on the same mounting structure, the length of connections for providing power from the power supply to the IC chip module is minimized.

FIG. 34 shows a cross sectional view of a first embodiment of the connection between a PCB and the mating male connector of the present invention, which is coupled to an IC chip module. As can be seen in FIG. 34, both mating male connector 3405 and IC chip module 3410 are mounted on PCB 3415. As also shown in FIG. 34, mating male connector 3405 comprises conducting plates 3420 and 3425, which are separated by insulating material 3430. The exterior surface of the top portions of plates 3420 and 3425 are exposed so as to provide electrical contact between mating male connector 3405 and the power supply coupled to mating male connector 3405. Plates 3420 and 3425 extend through body 3435 of mating male connector 3405. Insulating material 3430 and body 3435 are preferably made of the same materials as body 3305 shown in FIG. 33 and described above. Portions of both plates 3420 and 3425 extend outside body 3405 and are inserted into corresponding holes in PCB 3415 to provide electrical contact between mating male connector 3405 and PCB 3415. In the embodiment shown in FIG. 34, which is the preferred embodiment of the present invention, mating male connector 3405 is soldered to PCB 3415. IC chip module 3410 is coupled to PCB 3415 by edge connector 3460 which is inserted into PCB 3415. Also shown in FIG. 34 is conducting plate 3440, which is coupled to plate 3420 and has a hooked portion 3445 that contacts conducting plate 3450 of IC chip module 3410 when IC chip module is mounted on PCB 3415 and conducting plate 3450 is inserted into slot 3455. By contacting plate 3450, conducting plate 3455 allows supplying power from the power supply to the IC chip module 3410 directly through mating male connector 3405 without having the power transferred through PCB 3415. In other words, it allows bypassing the PCB in transferring power from the power supply to the IC chip module.

FIG. 35 shows a cross sectional view of a second embodiment of the connection between the mating male connector and the PCB. IC chip module 3510 is identical to IC chip module 3410 shown in FIG. 34. Mating male connector 3505 is, with the exception of the way that it is coupled to PCB 3515, identical to mating male connector 3405. Corresponding components in FIGS. 34 and 35 have reference numbers the difference between which is a hundred. Thus, for example, the IC chip module in FIG. 35 is referenced by the number 3510 whereas the IC chip module in FIG. 34 is referenced by the number 3410. Components in FIG. 35 that have corresponding components in FIG. 34 will not be further described herein, to the extent that they are identical to their corresponding components, since their corresponding components have been described in sufficient detail with respect to the cross sectional view shown in FIG. 34.

One component that is present in FIG. 35 but not FIG. 34 is PCB connector 3570. PCB connector 3570 comprises casing 3571, conductors 3572 and 3573 disposed within casing 3571, apertures 3574 and 3575 disposed on the top surface of casing 3571 and apertures 3576 and 3577 disposed on the bottom surface of casing 3571. Casing 3571 is preferably made of insulating materials, such as those used for making body 3305 shown in FIG. 33 and described above. Plates 3520 and 3525 of mating male connector 3505 are inserted into PCB connector 3570 through apertures 3575 and 3574, respectively, and contact conductors 3573 and 3572, respectively. Conductors 3573 and 3572 protrude outside casing 3571 through apertures 3577 and 3576, respectively, are inserted into PCB 3515 and soldered thereto. As plates 3520 and 3525 are not soldered to PCB 3515 or PCB connector 3570, mating male connector 3505 may be decoupled from PCB 3515 relatively more easily than mating male connector 3405 may be decoupled from PCB 3415 to which it is soldered.

FIG. 36 shows a front perspective view of IC chip card 3600 which is part of an IC chip module. An octagonal metal heatsink 3610 is disposed on IC chip 3605 to help dissipate heat from IC chip 3605. IC chip 3605 is disposed on PCB 3606. PCB 3606 comprises edge connector conducting contacts 3615 which are inserted into a PCB upon which the IC chip module comprising IC chip card 3600 is mounted. Edge connector conducting contacts 3615 transfer signals between IC chip 3605 and the PCB upon which the IC chip module is mounted. Edge connector conducting contacts 3615 may also be used to transfer power from the power supply to the IC chip module via the PCB. In such an embodiment, power is first transferred from the power supply to the motherboard via the mating male conductor of the present invention. Thereafter, power is transferred from the PCB to the IC chip module via the edge connector conducting contacts 3615.

FIG. 37 shows a front perspective view of IC chip module 3700. In addition to the components shown in FIG. 36, IC chip module 3700 also comprises conducting plates 3730, 3731 and 3732 which are coupled to IC chip 3605 and are to be inserted into slots 3330, 3331 and 3332, respectively, which are shown in FIG. 33. IC chip module 3700 also comprises horizontal insulating panel 3740 and vertical insulating panels 3745. IC chip module 3700 also comprises latches 3261 and handles 3262 for moving latches 3261, both of which have been described in further detail above.

FIG. 38 shows a top-front perspective view of mounting structure 3200, shown in FIG. 32, without showing the power supply and the IC chip module mounted thereon. Components shown in both FIGS. 38 and 32 have been described in relation to the drawing shown in FIG. 32 and will not be further described herein. Mounting structure 3200, in addition to the components described in relation to FIG. 32, also comprises latches 3805, latch release handle 3810 and heatsink 3815, which dissipates heat from the IC chip module as well as the power supply. Heatsink 3815 includes heat pipe 3816 and fins 3817. Heat from the IC chip module is transferred via the octagonal heatsink disposed on the IC chip to vertical heat conducting plate 3280 disposed on the front side of mounting structure 3200 and preferably comprised of a thermally conducting metal, such as die cast aluminum. Vertical heat conducting plate 3280 may also be made of other metals, thermally conductive plastics or ceramics. In the preferred embodiment of the present invention, other components of mounting structure 3200, such as frame 3205, also comprises thermally conducting metals, preferably die cast aluminum, to improve the heat dissipation from the power supply and the IC chip module. In other embodiments, frame 3205 may be made of other thermally conductive materials, including metals other than die cast aluminum, thermally conductive plastics and ceramics. To facilitate heat transfer between the octagonal heatsink on the IC chip and heat conducting plate 3280, a heat conducting paste, such as silicon grease, may be used between the surfaces of the octagonal heatsink and vertical heat conducting plate 3280. Heat from vertical heat conducting plate 3280 is then transferred to heat pipe 3816. Heat pipe 3816, in turn, transfers heat to fins 3817 coupled thereto. Fins 3817 preferably comprise a thermally conducting metal, such as aluminum or copper, and have large surface areas to allow for significant contact with ambient air to which heat from fins 3817 is transferred. Generally, heat pipes are sealed pipes that rely on the evaporation and condensation of a liquid within the pipe to achieve thermal conductivities much higher than those of metal rods. In one embodiment, heat pipe 3816 may be a NOREN heat pipe available from Noren Products, Inc. However, other pipes that provide thermal conductivities equivalent to those provided by the above described heat pipes may be used in the present invention.

FIG. 39 shows a top-rear perspective view of the mounting structure 3200 and IC chip module 3700 being inserted into housing 3210. FIG. 39 also shows a more clear view of a horizontal support panel 3905 coupled to housing 3210. Support panel 3905 includes a hole 3910 for the insertion of a screw which may be used to secure mounting structure 3200 onto a PCB.

FIG. 40 shows a top-front perspective view of mounting structure 3200 with IC chip module 3260 in housing 3210. Also shown in FIG. 40 is IC chip module cover 4000, the vertical back panel of which is shown in phantom in order to show the springs 4005 which push IC chip module 3260 toward the vertical heat conducting plate 3280 (shown in FIGS. 32 and 38) to improve the thermal contact between the IC chip module 3260, and more specifically octagonal heatsink 3610 (shown in FIGS. 36, 37 and 39), and the vertical heat conducting plate 3280. Also shown in FIG. 40 is opening 4010 into which the bottom portion of the mating male connector of the present invention is inserted.

FIG. 41 shows a perspective view of the interior side of IC chip module cover 4000. IC chip module cover 4000 comprises springs 4005 which are fixed to vertical back panel 4020 by pins 4006. In a preferred embodiment, springs 4005 comprise a sufficiently rigid metal to push the IC chip module towards the vertical heat conducting plate 3280. IC chip module cover 4000 also comprises openings 4012 which are aligned with slots 3212 to allow latches 3261 to protrude outside slots 3212 so as to releasably lock the IC chip module onto the housing. Similarly, IC chip module cover 4000 comprises openings 4062 which partially surround the stem connected to handles 3262 and allow room for moving handles 3262 to release the IC chip module from the housing.

FIG. 42 shows a partial cross sectional view of a power supply mounted on the mounting structure of the present invention as well as a cross sectional view of the latching mechanism for releasably locking the power supply to the mounting structure. Power supply 3250 is mounted on mounting structure 3200 comprising frame 3205. When power supply 3250 is pushed forward sufficiently for the mating connectors on power supply 3250 and mounting structure 3200 to mate, latch 3815 of latching mechanism 4200 automatically engages slot 4215 on the base of power supply 3250. Lower arm 4205 of latching mechanism 4200 pushes against the base 4220 of frame 3205, thus holding latch 3815 in slot 4215. Latch release handle 3810 may be be moved upward in the direction of arrow 4210 to pull down latch 3815 such that it is no longer in slot 4215 so as to release power supply 3250 from mounting structure 3200.

FIG. 43 shows a perspective view of latching mechanism 4200. In addition to the earlier described components of latching mechanism 4200, FIG. 43 also shows cylindrical pivot tabs 4305 which support latching mechanism 4200 on the frame of the mounting structure. Cylindrical pivot tabs 4305 are inserted into corresponding circular openings in the frame to support the weight of the latching mechanism 4200 and to allow it to be rotated about the longitudinal axis 4310 of cylindrical pivot tabs 4305. In a preferred embodiment, latching mechanism 4200 is comprised of a single piece of molded plastic.

FIG. 44 shows a bottom-rear perspective view of power supply 3250. As shown in FIG. 44, power supply 3250 comprises slots 4215 which are disposed on the base 3251 of power supply 3250. As explained above, latches 4215 are inserted into slots 4215 to lock power supply 3250 onto the mounting structure of the present invention. Power supply 3250 also comprises rails 3255 which are inserted into corresponding grooves on the frame of the mounting structure to help slide power supply 3250 into a releasably locked position on the mounting structure. Power supply 3250 comprises electrical male and female connectors 4315 and 4320 for coupling power to the power supply. Power supply 3250 also comprises switch 4325 for selecting a 115 volt or a 230 volt AC input.

FIG. 45 shows a bottom-rear perspective view of the mounting structure of the present invention with the IC chip module in housing 3210. As shown in FIG. 45, heat pipe 3816 extends from the front side of the mounting structure 3200, i.e., the side on which housing 3210 is disposed to the back side of mounting structure 3200. Heat pipe 3816 is coupled to fins 3817 and transfers heat thereto. As stated above, fins 3817 efficiently dissipate heat due to their relatively large surface area. Metal rods 4405 support fins 3817 as well as transfer heat between them. In another embodiment, metal support rods 4405 may be replaced by heat pipes similar or identical to heat pipe 3816. Thus, in one embodiment of the present invention, heatsink 3815 comprises a plurality of heat pipes. In one version of such an embodiment, the heat pipes extend from the vertical heat conducting panel to the fins to provide greater heat dissipation. FIG. 44 also shows edge connectors 4420 of mating male connector with conductive contacts for insertion into the PCB to provide electrical contact between the PCB and the mating male connector.

FIG. 46 shows a top-rear perspective view of a mounting structure of the present invention with a liquid cooling system. Mounting structure 4500 comprises liquid cooling pipe 4505. Liquid cooling pipe 4505 has a double wall such that incoming liquid flows on the outside while outgoing liquid flows on the inside of the pipe as shown by arrows 4515 and 4520, respectively. Therefore, pipe 4510 acts as both an inlet and an outlet of cooling liquid used in the liquid cooling pipe 4505. Such double walled pipes are commonly used for the cooling of molds used for plastic injection molding. One of the advantages of using a double walled liquid cooling pipe is that it allows use of only one frame tooling to prepare both a frame that uses a heat pipe for heat dissipation and a frame that use a liquid cooling pipe for heat dissipation.

FIG. 47 shows a rear-bottom perspective view of a mounting structure of the present invention using yet another heat dissipation system. Mounting structure 4600 comprises a forced air heat dissipation system which utilizes a plurality of heat dissipation fins 4605 rather than a heat pipe (or heat pipes) and fins or a liquid cooling heat dissipation system. In a preferred embodiment, fins 4605 are made of thermally conductive metal, such as die cast aluminum. To facilitate heat dissipation by fins 4605 a fan is used to blow air on fins 4605 whose size and orientation can vary depending on the location of the cooling fan to provide optimum heat dissipation from the power supply and the IC chip module.

FIG. 48 shows a side perspective view of the mounting structure, power supply and IC chip module, shown in FIG. 17, as well as a heatsink coupled to the IC chip module. Power supply 1716 is mounted on mounting structure 1700. IC chip module 1725 is inserted into socket 1730 in a manner similar to that by which IC chip module 3260 is inserted into holder 3210 shown in FIG. 32. Frame 1705 of mounting structure 1700 defines the boundaries of an area on the surface of the PCB upon which mounting structure 1700 is disposed. A heatsink 4800 is coupled to frame 1705 and is disposed above the PCB on which mounting structure 1700 is mounted. Thus, the embodiment of mounting structure 1700 shown in FIG. 48 in addition to the elements shown in FIG. 17 comprises heatsink 4800. Heatsink 4800 comprises a plurality of fins 4805 to increase the surface area of heatsink 4800 that is exposed to ambient air in order to facilitate heat dissipation from heatsink 4800. In a preferred embodiment, heatsink 4800 comprises a thermally conducting metal, such as die case aluminum. Heatsink 4800 extends away from the area whose boundaries are defined by frame 1705. The vertical face of IC chip module 1725 facing heatsink 4800 is in contact with the vertical face of heatsink 4800 facing IC chip module 1725 to provide thermal contact between IC chip module 1725 and heatsink 4800 so as to facilitate heat dissipation from IC chip module 1725.

As shown in FIG. 49, which shows a top view of the power system shown in FIG. 48, heatsink 4800 is coupled to frame 1705 by screws 4900 which are shown in phantom. In another embodiment, heatsink 4800 may be integral with frame 1705. FIG. 50 shows a front view of the power system shown in FIG. 48, including male connector 1715, which is shown in FIG. 17 but cannot be seen in the view shown in FIG. 48.

The integration of heatsink 4800 with frame 1705 provides improved mechanical support for IC chip module 1730 and socket 1725. It thus eliminates the need to use an IC chip module support frame such as those generally used in the prior art to support the weight of a heatsink that is used to dissipate heat from the IC chip module. The prior art heatsink usually requires use of support frames to support the weight of the heatsink because generally the heatsink's center of gravity does not correspond with that of the IC chip module and socket combination upon which the heatsink is disposed.

While the present invention has been particularly described with respect to the illustrated embodiments, it will be appreciated that various alterations, modifications and adaptations may be made based on the present disclosure, and are intended to be within the scope of the present invention. While the invention has been described in connection with what is presently considered to be the most practical and preferred embodiments, it is to be understood that the present invention is not limited to the disclosed embodiments but, on the contrary, is intended to cover various modifications and equivalent arrangements included within the scope of the appended claims.

We claim:

1. A mounting structure for mounting a power supply and an integrated circuit (IC) chip module on a printed circuit board (PCB), said mounting structure comprising:

a frame for accepting said power supply, wherein said power supply is slidably mounted on and releasably locked onto said frame;

means for supporting said frame on the PCB;

a holder for accepting said IC chip module, said holder being connected to said frame such that the length of connections for providing power from said power supply to said IC chip module is minimized, wherein said IC chip module is removably insertable into and releasably locked onto said holder such that said IC chip module is thermally coupled to said frame and may be directly coupled to the PCB; and a heatsink coupled to said frame for dissipating heat generated by said power supply and said IC chip module.

2. The mounting structure of claim 1, further comprising a mating connector coupled to said frame for mating with a corresponding mating connector coupled to said power supply when said power supply is mounted on said frame.

3. The mounting structure of claim 2, wherein said mating connector coupled to said frame further comprises a plurality of slots for accepting corresponding plates on said IC chip module when said IC chip module is placed in said holder, wherein power is supplied from said power supply to said IC chip module through said connector coupled to said power supply and said connector coupled to said frame such that resistive losses and inductive effects in delivering power from said power supply to said IC chip module are minimized.

4. The mounting structure of claim 1, wherein said heatsink is disposed below said frame and comprises at least one heat pipe and at least one heat dissipation fin coupled to said heat pipe.

5. The mounting structure of claim 1, wherein said frame comprises a vertical plate comprising a thermally conductive metal, said vertical plate being coupled to said heatsink of said mounting structure and a heatsink on said IC chip module when said IC chip module is inserted into said holder such that heat from said IC chip module is transferred to said heatsink of said mounting structure for dissipation.

6. The mounting structure of claim 1, wherein said heatsink comprises a liquid cooling pipe.

7. The mounting structure of claim 1, wherein said heatsink comprises a forced air heat dissipation system including a plurality of heat dissipation fins.

8. The mounting structure of claim 1, wherein said frame further comprises one of rails and grooves for coupling to one of grooves and rails, respectively, on said power supply to guide said power supply as said power supply is slid onto said frame.

9. The mounting structure of claim 8, wherein said frame comprises at least one latch for insertion into a corresponding slot on said power supply to releasably lock said power supply onto said frame.

10. A power supply system for supplying power to an IC chip module, said power supply system being mountable on a printed circuit board (PCB) and comprising:

a power supply having a first mating connector for delivering power to said IC chip module; and a mounting structure comprising:

a frame for accepting said power supply, wherein said power supply is slidably mounted on and releasably locked onto said frame;

a holder for accepting said IC chip module, said holder being connected to said frame such that the length of connections for providing power from said power supply to said IC chip module is minimized, wherein said IC chip module is removably insertable into and releasably locked onto said holder such that said IC chip module may be directly coupled to the PCB;

a second mating connector coupled to said frame for mating with said first mating connector when said power supply is mounted on said mounting structure; and a heatsink coupled to said frame for dissipating heat generated by said power supply and said IC chip module.

11. In an electrical system having a printed circuit board (PCB) on which at least one integrated circuit (IC) chip module is mounted, a mounting structure for coupling power from a power supply to an IC chip module, said mounting structure comprising:

a frame, said frame substantially defining the boundaries of an area on the surface of the PCB;

a fastener coupled to said frame for releasably fastening said power supply to said frame such that the power supply is positioned a predefined distance above the upper surface of the PCB; and a heatsink coupled to said frame and disposed above the PCB, said heatsink extending away from said area and coupled to the IC chip module so as to facilitate heat dissipation from the IC chip module.

12. The mounting structure of claim 11, wherein said heatsink is integral with said frame.

13. The mounting structure of claim 12, wherein said frame comprises die cast metal for thermal conductivity.

14. The mounting structure of claim 11 further comprising a plurality of power buses interconnecting said power supply and the PCB, wherein the IC chip module is powered by said power supply via said power buses such that resistive losses and inductive effects in delivering power to the IC chip module are minimized.

15. The mounting structure of claim 11 further comprising a plurality of legs attached to the frame for supporting said frame on the PCB, the ends of said legs opposite said frame being attached to the PCB.

16. The mounting structure of claim 11, wherein said plurality of legs comprise four legs, each leg having a longitudinal axis that is substantially perpendicular to the upper surface of the PCB.

17. The mounting structure of claim 11 further comprising a male connector for mating with a corresponding female connector coupled to the power supply for connecting the power output by the power supply to the motherboard at an area on the motherboard adjacent to one or more high power demand IC chip modules, said male connector comprising:

a body portion;

an insulating layer disposed above said body portion, said insulating layer having a first side and a second side;

a first electrically conductive plate having a top portion and a bottom portion, said top portion of said first electrically conductive plate disposed on said first side of said insulating layer and said bottom portion of said first electrically conductive plate extending substantially through the entire length of said body portion;

first means for electrically coupling said first electrically conductive plate to the PCB, wherein said first means is coupled to the bottom of said bottom portion of said first electrically conductive plate;

a second electrically conductive plate substantially parallel to said first electrically conductive plate, said second electrically conductive plate having a top portion and a bottom portion, said top portion of said second electrically conductive plate disposed on said second side of said insulating layer and said bottom portion of said second electrically conductive plate extending substantially through the entire length of said body portion; and second means for electrically coupling said second electrically conductive plate to the PCB, wherein said second means is coupled to the bottom of the bottom portion of said second electrically conductive plate;

wherein the IC chip module is powered by the power output by said power supply via said male connector such that resistive losses and self-inductive effects in delivering power from said power supply to the IC chip module are minimized.

* * * * *